United States Patent
Yamazaki et al.

(10) Patent No.: US 7,381,991 B2
(45) Date of Patent: Jun. 3, 2008

(54) SEMICONDUCTOR DEVICE AND METHOD OF FABRICATING THE SAME

(75) Inventors: Shunpei Yamazaki, Tokyo (JP); Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 12 days.

(21) Appl. No.: 10/347,350

(22) Filed: Jan. 21, 2003

(65) Prior Publication Data

US 2003/0168661 A1 Sep. 11, 2003

Related U.S. Application Data

(62) Division of application No. 09/471,359, filed on Dec. 23, 1999, now Pat. No. 6,524,895.

(30) Foreign Application Priority Data

Dec. 25, 1998 (JP) .......................... 10-371203

(51) Int. Cl.
*H01L 31/36* (2006.01)

(52) U.S. Cl. ............................................. 257/72
(58) Field of Classification Search ................ 257/72, 257/59–61
See application file for complete search history.

(56) References Cited

U.S. PATENT DOCUMENTS

| | | | |
|---|---|---|---|
| 4,795,718 | A | 1/1989 | Beitman |
| 4,843,023 | A | 6/1989 | Chiu et al. |
| 4,962,052 | A | 10/1990 | Asayama et al. |
| 4,963,504 | A | 10/1990 | Huang |
| 5,001,073 | A | 3/1991 | Huie |

(Continued)

FOREIGN PATENT DOCUMENTS

| | | |
|---|---|---|
| JP | 03-250632 | 11/1991 |
| JP | 04-369271 | 12/1992 |
| JP | 405055477 A | 3/1993 |
| JP | 05-102483 | 4/1993 |
| JP | 07-130652 | 5/1995 |
| JP | 08-078329 | 3/1996 |
| JP | 10-92576 | 4/1998 |
| JP | 10-135468 | 5/1998 |
| JP | 10-135469 | 5/1998 |
| JP | 10-247735 | 9/1998 |
| WO | WO 90/13148 | 11/1990 |

OTHER PUBLICATIONS

Hermann Schenk et al., "Polymers for Light Emitting Diodes", EuroDisplay '99 Proceedings, pp. 33–37.
Furue et al., Characteristics and Driving Scheme of Polymer–Stabilized Monostable FLCD Exhibiting Fast Response Time and High Contrast Ratio with Gray–Scale Capability, SID 98 Digest, pp. 782–785.
Yoshida et al., "A Full–Color Thresholdless Antiferroelectric LCD Exhibiting Wide Viewing Angle with Fast Response Time", SID 97 Digest, pp. 841–844.
Inui et al., "Thresholdless Antiferroelectricity in Liquid Crystals and its Application to Displays", J. Mater. Chem., 1996, 6(4), pp. 671–673.

(Continued)

*Primary Examiner*—Nathan W Ha
(74) *Attorney, Agent, or Firm*—Nixon Peabody LLP; Jeffrey L. Costellia

(57) ABSTRACT

Reliability of crystalline TFTs is improved in a large area integrated circuit typified by an active matrix type liquid crystal display device. In TFTs having an LDD structure, a region whose LDD region overlaps with a gate electrode and a region not overlapping with the gate electrode are fabricated inside one TFT. To accomplish this structure, n-channel TFTs are fabricated in non-self-alignment whereas p-channel TFTs are fabricated in self-alignment.

20 Claims, 36 Drawing Sheets

U.S. PATENT DOCUMENTS

| | | | |
|---|---|---|---|
| 5,047,358 A | 9/1991 | Kosiak et al. |
| 5,135,881 A | 8/1992 | Saeki |
| 5,182,619 A | 1/1993 | Pfiester |
| 5,247,190 A | 9/1993 | Friend et al. |
| 5,276,346 A | 1/1994 | Iwai et al. |
| 5,323,042 A | 6/1994 | Matsumoto |
| 5,340,756 A | 8/1994 | Nagayasu |
| 5,399,502 A | 3/1995 | Friend et al. |
| 5,412,240 A | 5/1995 | Inoue et al. |
| 5,412,493 A | 5/1995 | Kunii et al. |
| 5,482,871 A | 1/1996 | Pollack |
| 5,532,175 A | 7/1996 | Racanelli et al. |
| 5,543,340 A | 8/1996 | Lee |
| 5,543,947 A | 8/1996 | Mase et al. |
| 5,567,966 A | 10/1996 | Hwang |
| 5,581,092 A | 12/1996 | Takemura |
| 5,594,569 A | 1/1997 | Konuma et al. |
| 5,600,167 A | 2/1997 | Urayama |
| 5,616,506 A | 4/1997 | Takemura |
| 5,643,826 A | 7/1997 | Ohtani et al. |
| 5,665,615 A | 9/1997 | Anmo |
| 5,686,328 A | 11/1997 | Zhang et al. |
| 5,729,308 A | 3/1998 | Yamazaki et al. |
| 5,739,549 A * | 4/1998 | Takemura et al. | 257/59 |
| 5,767,930 A | 6/1998 | Kobayashi et al. |
| 5,773,330 A | 6/1998 | Park |
| 5,801,416 A | 9/1998 | Choi et al. |
| 5,804,476 A | 9/1998 | Jang |
| 5,841,170 A | 11/1998 | Adan et al. |
| 5,841,197 A | 11/1998 | Adamic, Jr. |
| 5,851,869 A | 12/1998 | Urayama |
| 5,858,820 A | 1/1999 | Jung |
| 5,869,378 A | 2/1999 | Michael |
| 5,903,249 A | 5/1999 | Koyama et al. |
| 5,923,961 A | 7/1999 | Shibuya et al. |
| 5,923,962 A | 7/1999 | Ohtani et al. |
| 5,936,277 A | 8/1999 | Takeuchi |
| 5,977,586 A | 11/1999 | Crisenza et al. |
| 6,022,780 A | 2/2000 | Yokoyama |
| 6,054,357 A | 4/2000 | Choi |
| 6,077,730 A | 6/2000 | Lee et al. |
| 6,084,278 A | 7/2000 | Mizushima |
| 6,103,560 A | 8/2000 | Suzuki |
| 6,121,652 A | 9/2000 | Suzawa |
| 6,133,082 A | 10/2000 | Masuoka |
| 6,140,162 A | 10/2000 | Yeo |
| 6,160,279 A | 12/2000 | Zhang |
| 6,169,315 B1 | 1/2001 | Son |
| 6,171,915 B1 | 1/2001 | Hishinuma |
| 6,172,671 B1 | 1/2001 | Shibuya et al. |
| 6,198,133 B1 | 3/2001 | Yamazaki et al. |
| 6,207,481 B1 | 3/2001 | Yi et al. |
| 6,218,219 B1 | 4/2001 | Yamazaki et al. |
| 6,259,138 B1 | 7/2001 | Ohtani et al. |
| 6,274,887 B1 | 8/2001 | Yamazaki et al. |
| 6,278,162 B1 | 8/2001 | Lien et al. |
| 6,281,088 B1 | 8/2001 | Kim |
| 6,281,552 B1 | 8/2001 | Kawasaki |
| 6,284,577 B1 | 9/2001 | Suzawa et al. |
| 6,297,106 B1 | 10/2001 | Pan et al. |
| 6,300,207 B1 | 10/2001 | Ju |
| 6,303,963 B1 | 10/2001 | Ohtani et al. |
| 6,320,224 B1 | 11/2001 | Zhang |
| 6,348,378 B1 | 2/2002 | Lee |
| 6,350,127 B1 | 2/2002 | Chiang et al. |
| 6,358,783 B1 | 3/2002 | Yamaguchi et al. |
| 6,365,917 B1 | 4/2002 | Yamazaki |
| 6,369,410 B1 | 4/2002 | Yamazaki et al. |
| 6,376,879 B2 | 4/2002 | Mori et al. |
| 6,413,823 B1 | 7/2002 | Wu et al. |
| 6,414,345 B1 | 7/2002 | Suzawa |
| 6,420,758 B1 | 7/2002 | Nakajima |
| 6,469,317 B1 | 10/2002 | Yamazaki et al. |
| 6,483,157 B1 | 11/2002 | Gardner et al. |
| 6,501,098 B2 | 12/2002 | Yamazaki |
| 6,512,271 B1 | 1/2003 | Yamazaki et al. |
| 6,518,594 B1 | 2/2003 | Nakajima et al. |
| 6,545,359 B1 | 4/2003 | Ohtani et al. |
| 6,576,924 B1 | 6/2003 | Yamazaki et al. |
| 6,576,926 B1 | 6/2003 | Yamazaki et al. |
| 6,617,644 B1 | 9/2003 | Yamazaki et al. |
| 6,690,063 B2 * | 2/2004 | Takemura et al. | 257/350 |
| 6,773,971 B1 | 8/2004 | Zhang et al. |
| 6,777,254 B1 | 8/2004 | Yamazaki et al. |
| 6,777,716 B1 | 8/2004 | Yamazaki et al. |
| 6,808,965 B1 | 10/2004 | Miyasaka et al. |
| 6,909,114 B1 | 6/2005 | Yamazaki |
| 7,235,810 B1 | 6/2007 | Yamazaki et al. |
| 2002/0102783 A1 | 8/2002 | Fujimoto et al. |
| 2003/0201435 A1 * | 10/2003 | Suzawa | 257/59 |
| 2003/0201439 A1 | 10/2003 | Yamazaki et al. |
| 2004/0222467 A1 | 11/2004 | Yamazaki et al. |
| 2005/0007494 A1 | 1/2005 | Yamazaki et al. |

OTHER PUBLICATIONS

Hatano et al., "A Novel Self–aligned Gate–overlapped LDD Poly–Si TFT with High Reliability and Performance", IEDM Technical Digest 97, pp. 523–526.

U.S. Appl. No. 09/464,200—Yamazaki et al. "Semiconductor Device and Method of Fabricating the Same" Filed: Dec. 16, 2001.

Inventors: Shunpei Yamazaki et al., "Semiconductor Device and Fabrication Method Thereof" Filing Date: Jul. 5, 2000, Specifications and Drawings for U.S. Appl. No. 09/610,217.

Inventors: Shunpei Yamazaki et al., "Semiconductor Device and Manufacturing Method Thereof" Filing Date: Jul. 6, 2000, Specifications and Drawings for U.S. Appl. No. 09/610,753.

Inventors: Shunpei Yamazaki, "Semiconductor Device and Method of Manufacturing Threof" Filing Date: Feb. 11, 2000, Specifications and Drawings for U.S. Appl. No. 09/502,675.

Inventors: Shunpei Yamazaki, "Semiconductor Device and Fabrication Method Thereof" Filing Date: Feb. 22, 2000, Specifications and Drawings for U.S. Appl. No. 09/510,734.

Inventors: Shunpei Yamazaki, "Method for Manufacturing an Electrooptical Device" Filing Date: Mar. 22, 2000, Specifications and Drawings for U.S. Appl. No. 09/533,175.

Inventors: Shunpei Yamazaki, "Semiconductor Device and Method of Manufacturing the Same" Filing Date: Feb. 7, 2000, Specifications and Drawings for U.S. Appl. No. 09/498,646.

Specification, Drawings and currently pending claims for U.S. Appl. No. 08/464,200, "Semiconductor Device and Method of Fabricating the Same" Filing Date: Dec. 16, 1999, Inventors: Shunpei Yamazaki et al.

* cited by examiner

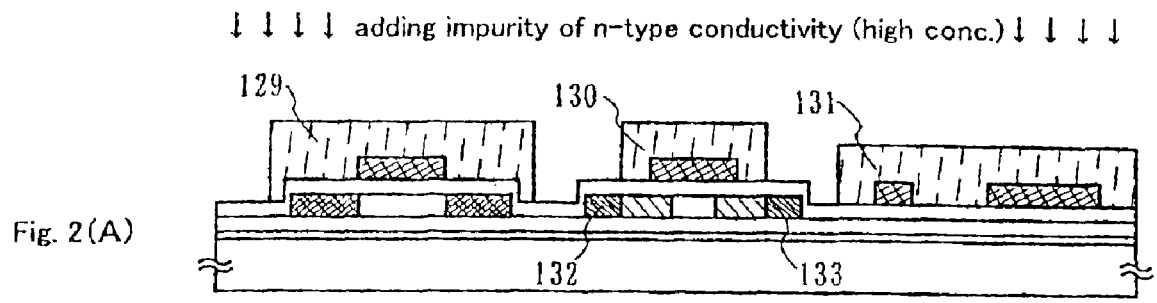
Fig. 2(A)
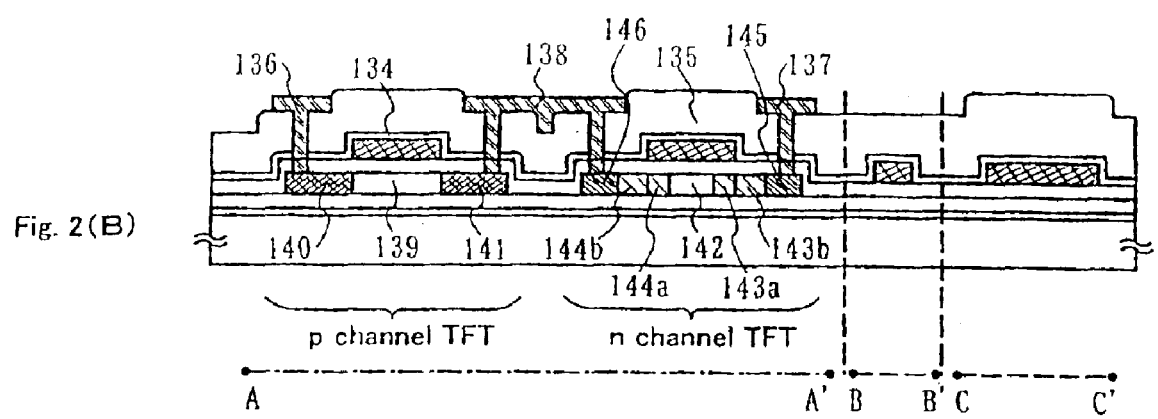
Fig. 2(B)
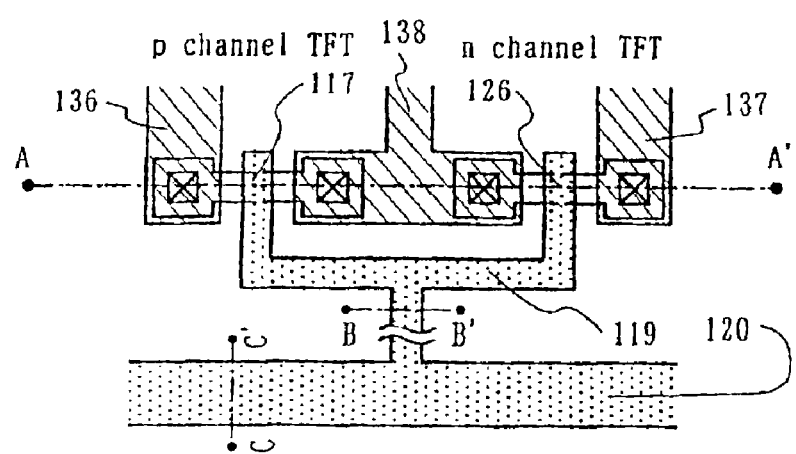
Fig. 2(C) A Top View of CMOS Circuit

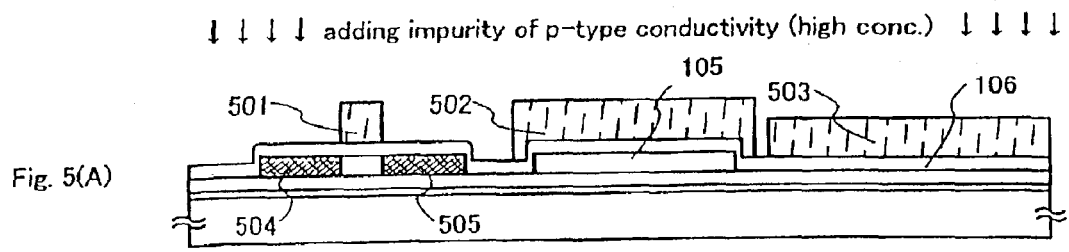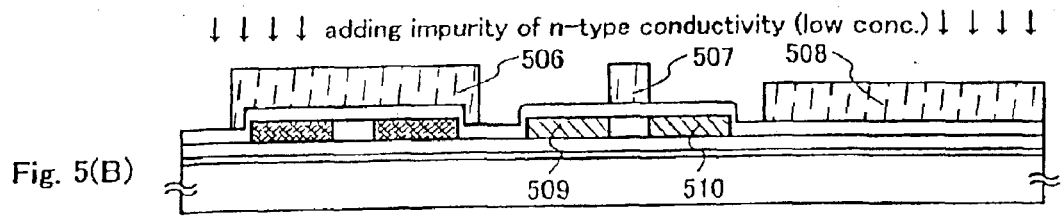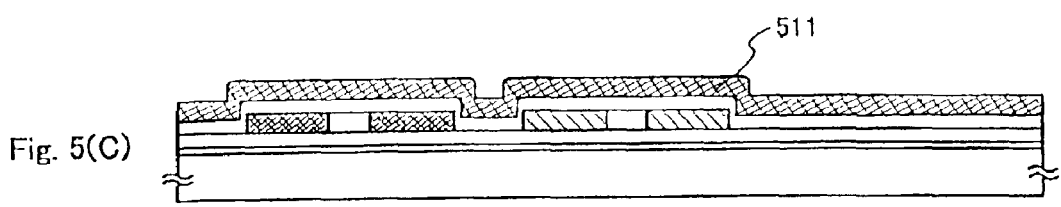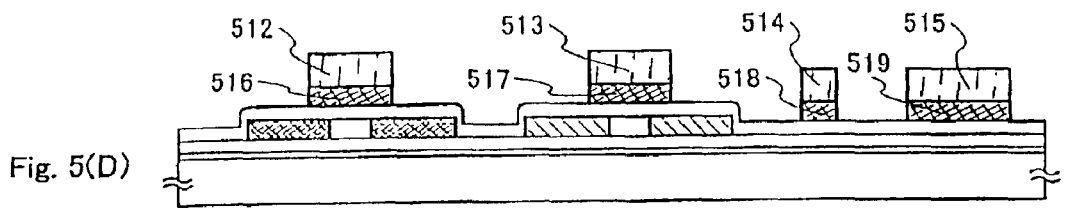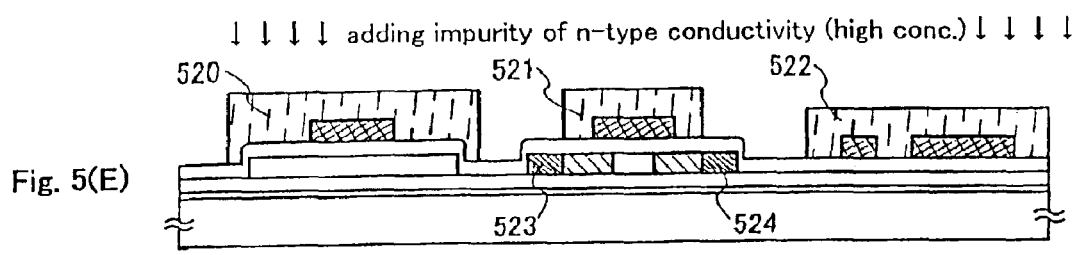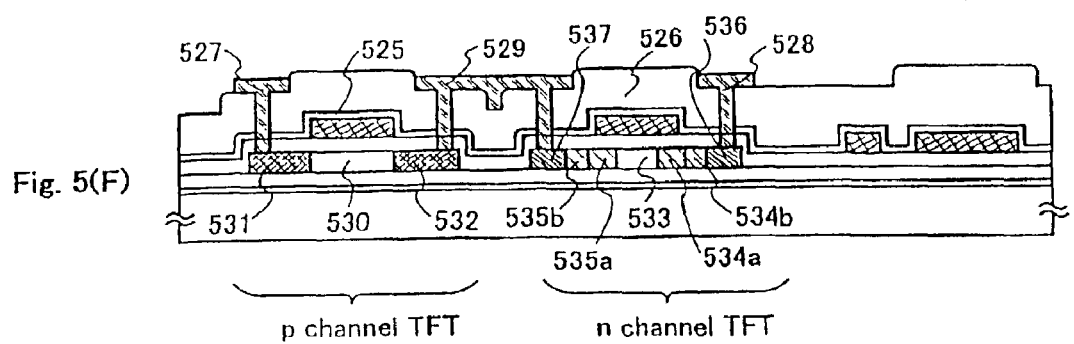

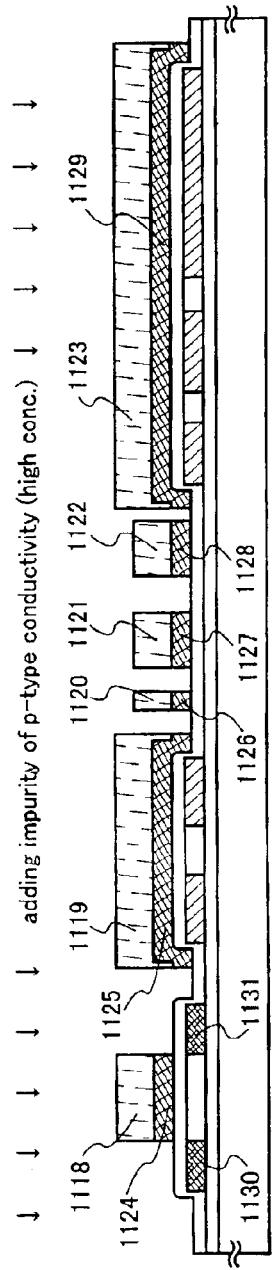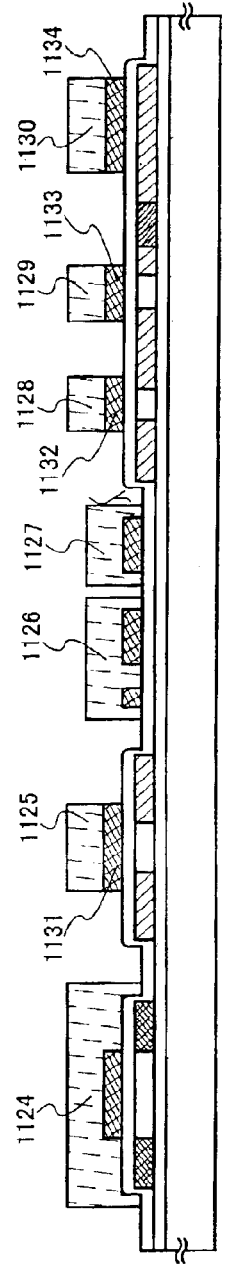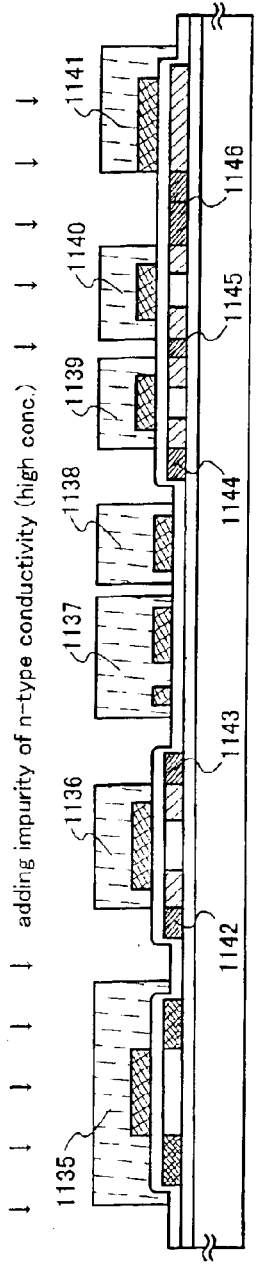

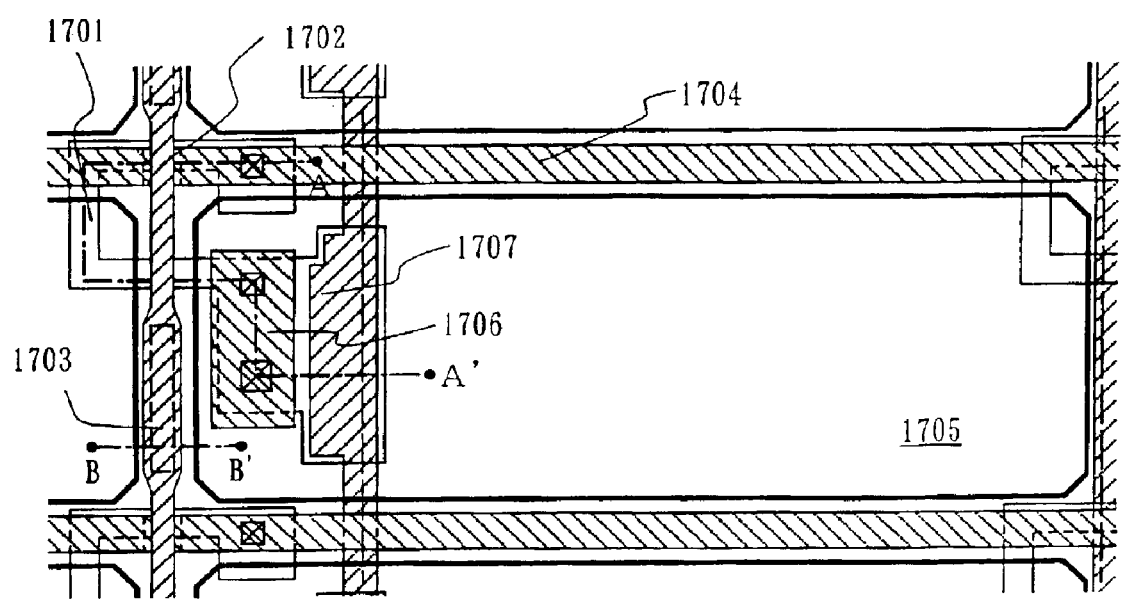
Fig. 17 Top View of a Pixel Matrix Circuit

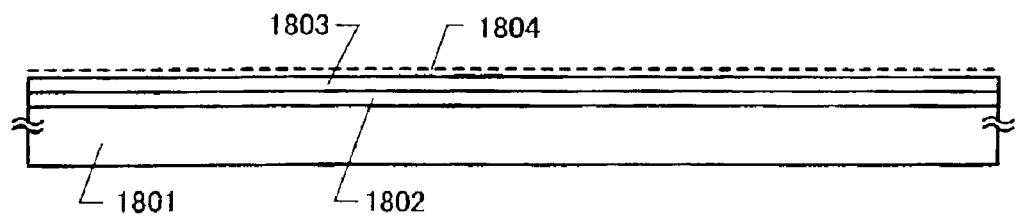
Fig. 18(A)
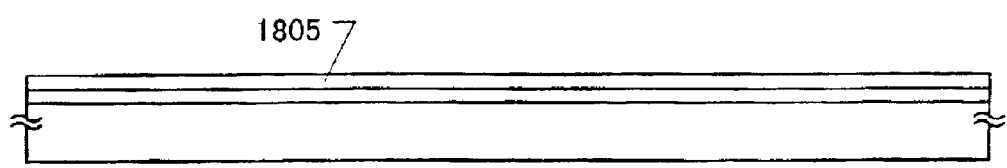
Fig. 18(B) Crystallization Process

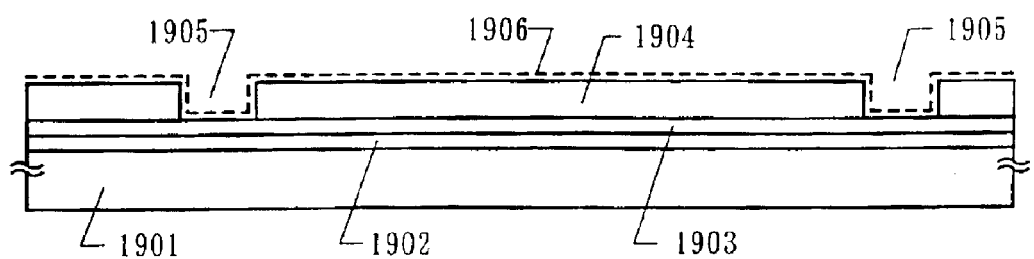
Fig. 19(A)
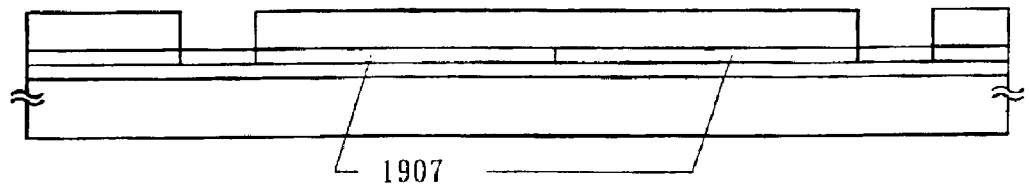
Fig. 19(B) Crystallization Process heat treatment in an atmosphere containing halogen element

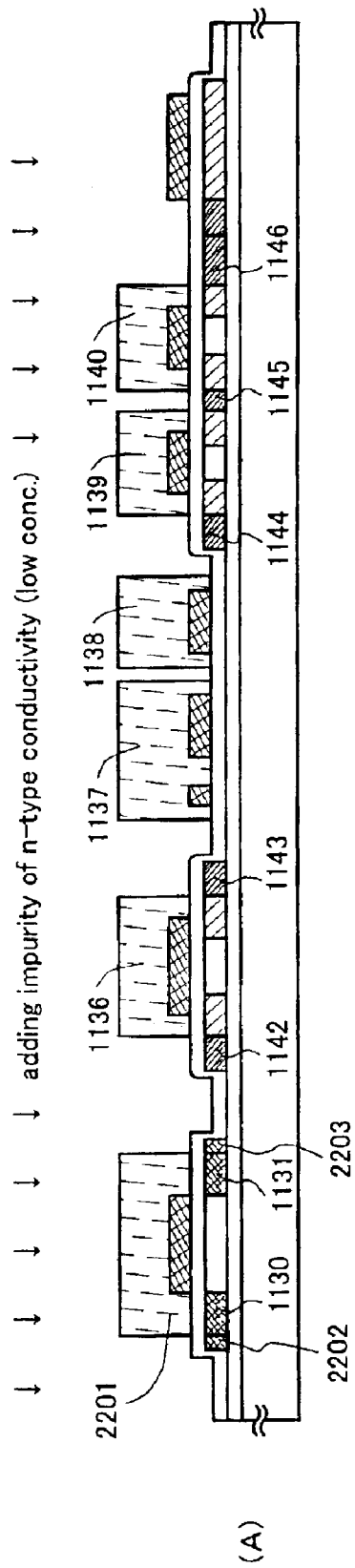
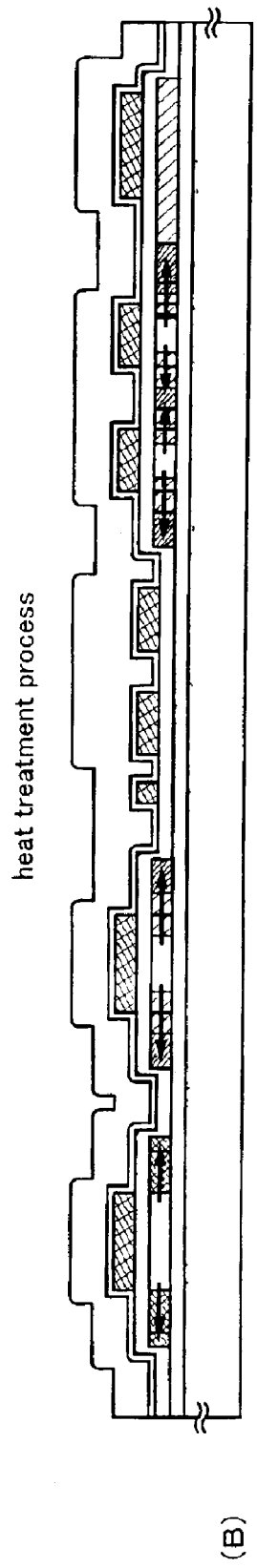

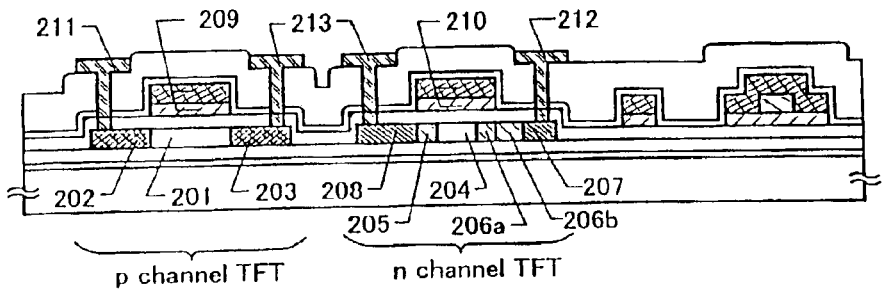
Fig. 24(A) Example of Construction of TFT in a Shift Register Circuit
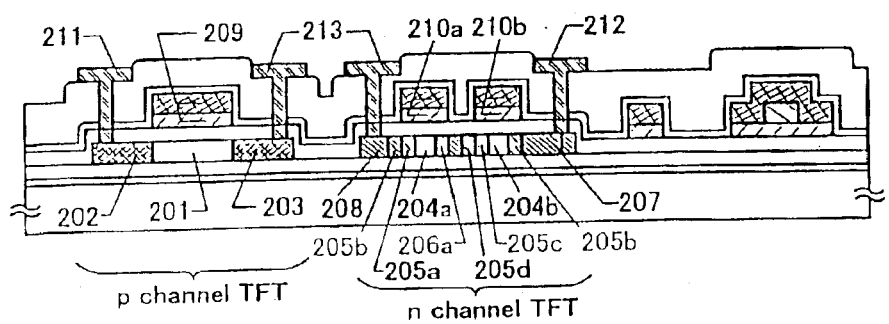
Fig. 24(B) Example of Construction of TFT in a Level Shifter Circuit and a Buffer Circuit
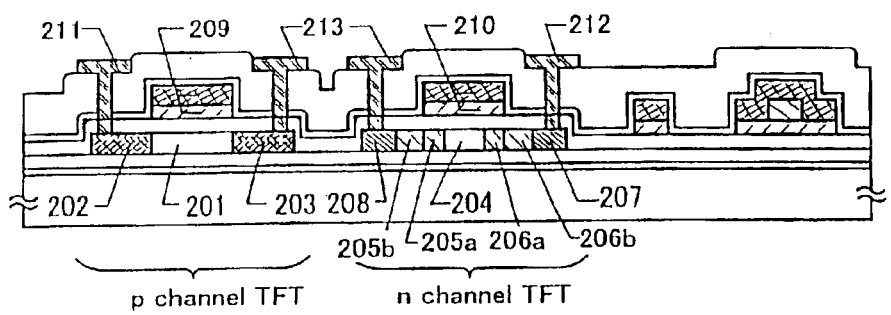
Fig. 24(C) Example of Construction of TFT in a Sampling Circuit
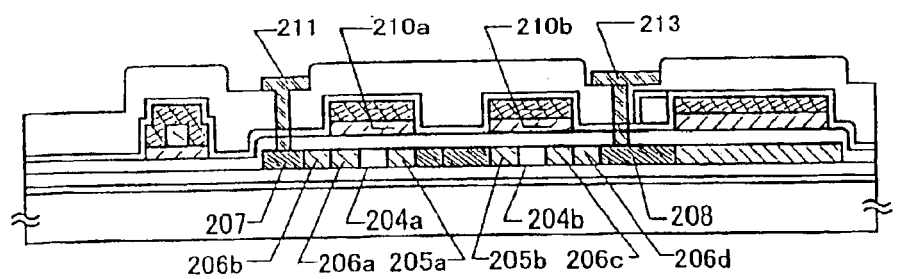
Fig. 24(D) Example of Construction of TFT in a Pixel Matrix Circuit

SEMICONDUCTOR DEVICE AND METHOD OF FABRICATING THE SAME

This application is a divisional of Ser. No. 09/471,359 Dec. 23, 1999, now U.S. Pat. No. 6,524,895.

BACKGROUND OF THE INVENTION

1. Field of the Invention

This invention relates to a semiconductor device having a circuit constituted by thin film transistors on the substrate thereof having an insulation surface, and to a method of fabricating such a semiconductor device. More specifically, this invention relates to an electro-optical device typified by a liquid crystal display device and a construction of an electronic appliance having the electro-optical device mounted thereto.

The term "semiconductor device" used in this specification represents devices in general that function by utilizing semiconductor characteristics, and includes the electro-optical device and the electronic appliance having the electro-optical device mounted thereto, that are described above.

2. Description of the Related Art

Development of semiconductor devices having a large area integrated circuit comprising thin film transistors (hereinafter called the "TFTs") has made a steady progress, and an active matrix liquid crystal device and an adhesion type image sensor are typical examples of such semiconductor devices.

The TFTs can be classified in accordance with their structures and their fabrication methods. The TFTs using a semiconductor film having a crystal structure as an active layer (crystalline TFTs), in particular, can form a variety of functional circuits because their field effect mobility is high.

The term "semiconductor film having the crystal structure" used in this specification represents a single crystal semiconductor, a polycrystalline semiconductor and a micro-crystal semiconductor. Furthermore, the term includes the semiconductors that are described in Japanese Patent Laid-Open Nos. Hei 7-130652(1995), Hei 8-78329 (1996), Hei 10-135468(1998) and Hei 10-135469(1998).

In the active matrix liquid crystal display device, a pixel matrix circuit (also called a "pixel area") comprising n-channel TFTs and an integrated circuit comprising a CMOS circuit as a basic circuit such as a shift register circuit, a level shifter circuit, a buffer circuit, a sampling circuit, and so forth, are formed for each functional block on one substrate.

In the adhesion type image sensor, on the other hand, integrated circuits such as a sample-and-hold circuit, a shift register circuit, a multiplexer circuit, and so forth, are formed using the TFTs.

Because the operating conditions of these circuits are not always the same, performance required for each TFT naturally varies to certain extents.

The pixel unit, for example, employs the construction that includes switching devices comprising an n-channel TFT and an auxiliary signal storage capacitance, and drives the liquid crystal by applying a voltage. The liquid crystal must be driven by an alternating current, and a system called "frame inversion driving" has been employed. Therefore, the TFTs must sufficiently reduce a leakage current as one the requisites imposed on them.

Because a high driving voltage is applied to the buffer circuit, a withstand voltage must be high. It is also necessary to sufficiently secure an ON current in order to improve current driving capacity.

However, the crystalline TFT involves the problem that its OFF current is likely to become high. From the aspect of reliability, the crystalline TFT is believed yet unequal to MOS transistors (the transistors that are fabricated on a single crystal semiconductor substrate) used for LSIs. For instance, a deterioration phenomenon such as the drop of the ON current has often been observed in the crystalline TFT. This problem results from the hot carrier effect. In other words, the hot carriers generated by a high electric field in the proximity of a drain are believed to cause this deterioration.

A lightly doped drain (LDD) structure is known as a structure of the TFT. In this structure, a low concentration impurity region is disposed between a channel region and a source or drain region into which an impurity is doped in a high concentration, and this low concentration impurity region is referred to as the "LDD" region.

The LDD structure can be further classified into a GOLD (Gate-drain Overlapped LDD) structure in which the LDD region overlaps with the gate electrode and the LDD structure in which it does not, depending on the positional relationship with the gate electrode. The GOLD structure mitigates the high electric field in the proximity of the drain, prevents the hot carrier effect and thus improves reliability. According to Mutsuko Hatano, Hajime Akimoto and Takeshi Sakai, "IEDM97 Technical Digest", p523–526, 1997, a GOLD structure having side walls formed of silicon has been confirmed to have by far more excellent reliability than TFTs having other structures.

Nonetheless, the GOLD structure is not free from the problem that the OFF current becomes greater than the ordinary LDD structure, and it has not always been preferable to fabricate all the TFTs of a large area integrated circuit by this GOLD structure. If the OFF current increases in the n-channel TFTs constituting the pixel unit, for example, power consumption increases and abnormality is likely to appear in image display. For this reason, it is not preferable to apply as such the crystalline TFTs having the GOLD structure.

Another problem of the LDD structure is that the ON current drops with the increase of the series resistance. The ON current can be freely designed by means of the channel width of the TFT, and an offset TFT is not always necessary to be provided to the TFTs that constitute the buffer circuit, for example.

SUMMARY OF THE INVENTION

It is an object of the present invention to provide a TFT having an optimum structure by each functional circuit in a semiconductor device having a large area integrated circuit typified by an active matrix liquid crystal display device and an image sensor.

It is another object of the present invention to provide a method of fabricating such TFTs on the same substrate by the same fabrication process.

It is another object of the present invention to provide a technology for achieving the objects described above and to realize a crystalline TFT having reliability equivalent or superior to that of an MOS transistor.

It is still another object of the present invention to improve reliability of a semiconductor device having a large area integrated circuit including various functional circuits constituted by such crystalline TFTs.

In a TFT having an LDD structure, the objects described above can be accomplished by the construction in which a region where the LDD region overlaps with a gate electrode and a region where it does not are disposed in one TFT.

In order to realize TFTs having an optimum structure for each functional circuit in a semiconductor device having a large area integrated circuit typified by an active matrix liquid crystal display device and an image sensor, the present invention employs the construction in which a ratio of a region, where the LDD structure overlaps with a gate electrode, to a region where it does not is varied for each TFT.

To obtain the construction described above, the present invention employs a fabrication process that forms n-channel TFTs by a non-self-alignment process and p-channel TFTs, by a self-alignment process.

Therefore, in a semiconductor device including a semiconductor layer, a gate insulation film, a gate electrode and a gate wiring connected to the gate electrode on a substrate having an insulation surface, the present invention provides a semiconductor device having a construction wherein each of the gate electrode and the gate wiring comprises a first conductor layer, the semiconductor layer includes a channel formation region, a first impurity region of one conductivity type, a second impurity region of one conductivity type sandwiched between the channel formation region and the first impurity region of one conductivity type and keeping contact with the channel formation region, and wherein a part of the second impurity region of one conductivity type overlaps with the gate electrode through the gate insulation film.

The first conductor layer applied to the present invention uses one or a plurality of elements selected from the group consisting of titanium (Ti), tantalum (Ta), tungsten (W) and molybdenum (Mo), or a compound using the element or elements as the principal component. The second conductor layer is made of a low resistance conductor material of one or a plurality of elements selected from the group consisting of aluminum (Al) and copper (Cu), or a compound using the element or elements as the principal components.

The present invention can be applied to a semiconductor device including a matrix circuit comprising n-channel thin film transistors, and a CMOS circuit comprising n-channel thin film transistors and p-channel thin film transistors.

However, the construction of the present invention is not always necessarily applied to the p-channel TFTs in the CMOS circuit described above.

A method of fabricating a semiconductor device according to the present invention comprises the steps of forming a semiconductor layer on a substrate having an insulation surface; removing a part of the semiconductor layer and forming at least first and second island semiconductor layers; forming a gate insulation film in such a fashion as to keep contact with the first and second island semiconductor layers; adding an impurity element of one conductivity type into a selected region of the first island semiconductor layer and forming a second impurity region; forming a first conductor layer in contact with the gate insulation film; forming a second gate electrode overlapping with the second island semiconductor layer from the first conductor layer; adding an impurity element of a conductivity type opposite to one conductivity type into a selected region of the second island semiconductor layer, thereby forming a third impurity region; forming a first gate electrode overlapping with the first island semiconductor layer from the first conductor layer; and adding an impurity element of one conductivity type into a selected region of the first island semiconductor layer and forming a first impurity region.

A method of fabricating a semiconductor device according to another embodiment of the present invention comprises the steps of forming a semiconductor layer on a substrate having an insulation surface; removing a part of the semiconductor layer and forming at least first and second island semiconductor layers; forming a gate insulation film in contact with the first and second island semiconductor layers; adding an impurity element of one conductivity type into a selected region of the first island semiconductor layer and forming a second impurity region; forming a first conductor layer in contact with the gate insulation film; forming a first gate electrode overlapping with the first island semiconductor layer and a second gate electrode overlapping with the second island semiconductor layer from the first conductor layer; adding an impurity element of one conductivity type into a selected region of the first island semiconductor layer and forming a first impurity region; and adding an impurity element of a conductivity type opposite to one conductivity type into a selected region of the second island semiconductor layer and forming a third impurity region.

A method of fabricating a semiconductor device according to still another embodiment of the present invention comprises the steps of: forming a semiconductor layer on a substrate having an insulation surface; removing a part of the semiconductor layer and forming at least first and second island semiconductor layers; forming a gate insulation film in contact with the first and second island semiconductor layers; adding an impurity element of a conductivity type opposite to one conductivity type into a selected region of the second island semiconductor layer and forming a third impurity region; adding an impurity element of one conductivity type into a selected region of the first island semiconductor layer and forming a second impurity region; forming a first conductor layer in contact with the gate insulation film; forming a first gate electrode overlapping with the first island semiconductor layer and a second gate electrode overlapping with the second island semiconductor layer from the first conductor layer; and adding an impurity element of one conductivity type into a selected region of the first island semiconductor layer and forming a first impurity region.

A method of fabricating a semiconductor device according to still another embodiment of the present invention comprises the steps of: forming a semiconductor layer on a substrate having an insulation surface; removing a part of the semiconductor layer and forming at least first and second island semiconductor layers; forming a gate insulation film in contact with the first and second island semiconductor layers; adding an impurity element of a conductivity type opposite to one conductivity type into a selected region of the second island semiconductor layer and forming a third impurity region; adding an impurity element of one conductivity type into a selected region of the first island semiconductor layer and forming a first impurity region; adding an impurity element of one conductivity type into a selected region of the first island semiconductor layer and forming a second impurity region; forming a first conductor layer in such a fashion as to keep contact with the gate insulation film; and forming a first gate electrode overlapping with the first island semiconductor layer and a second gate electrode overlapping with the second island semiconductor layer from the first conductor layer.

A method of fabricating a semiconductor device according to still another embodiment of the present invention comprises the steps of: forming a semiconductor layer on a substrate having an insulation surface; removing a part of the semiconductor layer and forming at least first and second island semiconductor layers; forming a gate insulation film in contact with first and second island semiconductor layers; adding an impurity element of one conductivity type into a selected region of the first island semiconductor layer and forming a first impurity region; adding an impurity element of one conductivity type into a selected region of the first island semiconductor layer and forming a second impurity region; forming a first conductor layer in such a fashion as to keep contact with the gate insulation film; forming a second gate electrode overlapping with the second island semiconductor layer from the first conductor layer; adding an impurity element of a conductivity type opposite to one conductivity type into a selected region of the second island semiconductor layer and forming a third impurity region; and forming a first gate electrode overlapping with the first island semiconductor layer from the first conductor layer.

A method of fabricating a semiconductor-device according to still another embodiment of the present invention comprises the steps of: forming a semiconductor layer on a substrate having an insulation surface; removing a part of the semiconductor layer and forming at least first and second island semiconductor layers; forming a gate insulation film in contact with the first and second island semiconductor layers; adding an impurity element of one conductivity type into a selected region of the first island semiconductor layer and forming a first impurity region; adding an impurity element of a conductivity type opposite to one conductivity type into a selected region of the second island semiconductor layer and forming a third impurity region; adding an impurity element of one conductivity type into a selected region of the first island semiconductor layer and forming a second impurity region; forming a first conductor layer in contact with the gate insulation film; and forming a first gate electrode overlapping with the first island semiconductor layer and a second gate electrode overlapping with the second island semiconductor layer from the first conductor layer.

In the construction of the present invention described above, the first conductor layer is preferably comprised of one or a plurality of elements selected from the group consisting of titanium (Ti), tantalum (Ta), tungsten (W) and molybdenum (Mo), or a compound comprising at least one of these elements as the principal component.

BRIEF DESCRIPTION OF THE DRAWINGS

FIGS. 2(A–C) are sectional views showing a fabrication process of a TFT and a plan view of a CMOS circuit;

FIGS. 5(A–F) are sectional. views showing a fabrication process of a TFT;

FIGS. 12(A–C) are sectional views showing a fabrication process of an active matrix substrate;

FIG. 17 is a top view of an active matrix circuit;

FIGS. 18(A–B) show a fabrication process of a crystalline silicon film;

FIGS. 19(A–B) show a fabrication process of the crystalline silicon film;

FIGS. 22(A–B) are sectional views showing a fabrication process of a TFT;

FIGS. 24(A–D) are sectional views showing the construction of the TFT according to the present invention;

DESCRIPTION OF THE PREFERRED EMBODIMENTS

[Embodiment 1]

Figure 1A:
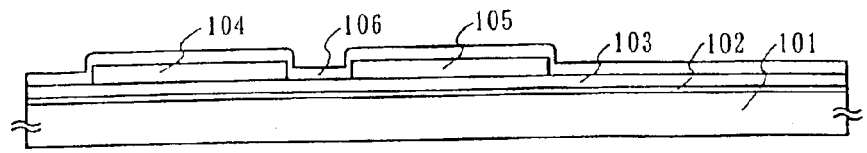
FIGS. 1(A–E) are a sectional views showing a fabrication process of a TFT.
Figure 1B:
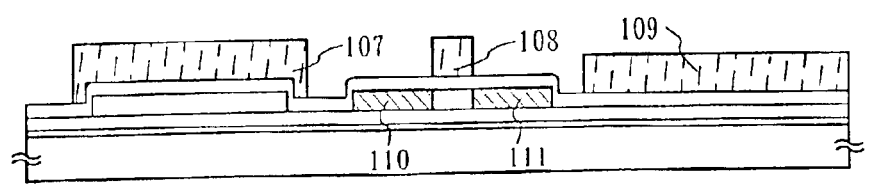
Figure 1C:
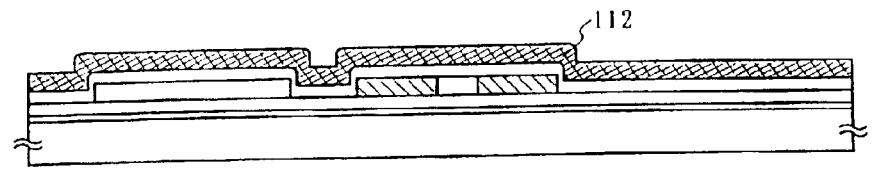

The first embodiment of the present invention will be explained with reference to FIGS. 1 and 2. This embodiment represents the case where n-channel TFTs and p-channel TFTs are fabricated on the same substrate and an inverter circuit as the basic construction of a CMOS circuit is constituted.

The substrate 101 can use a glass substrate, a plastic substrate, a ceramic substrate, and so forth. A silicon substrate and a metal substrate typified by a stainless steel substrate having an insulation film such as a silicon oxide film, or a silicon nitride film, formed on the surface thereof can also be used. Needless to say, a quartz substrate can be used, too.

An underlying film 102 comprising a silicon nitride film and an underlying film 103 comprising a silicon oxide film are formed on the main plane of the substrate 101 on which the TFTs are to be formed. These underlying films are formed by plasma CVD or sputtering, and are disposed in order to prevent detrimental impurities from diffusing into the TFTs from the substrate 101. Therefore, an underlying film 102 comprising a silicon nitride film is formed into a thickness of 20 to 100 nm, typically 50 nm, and another underlying film 103 comprising the silicon oxide film is formed into a thickness of 50 to 500 nm, typically 150 to 200 nm.

Needless to say, the underlying film may comprise only either one of the underlying film 102 of the silicon nitride film and the underlying film 103 of the silicon oxide film, but a two-layered structure is most preferable in view of reliability of the resulting TFTs.

A semiconductor layer, that is so formed in contact with the underlying film 103, preferably uses a crystalline semiconductor that is obtained by first forming an amorphous semiconductor by a film formation method such as plasma CVD, vacuum CVD or sputtering, and then crystallizing it by laser annealing or a solid phase growing method by heat-treatment. A micro-crystal semiconductor formed by the film formation method described above can also be used. The semiconductor material that can be used in this case includes silicon (Si), germanium (Ge), a silicon germanium alloy, silicon carbide, and compound semiconductor materials such as gallium arsenic.

Alternatively, the semiconductor layer to be formed on the substrate 101 may be an SOI (Silicon-On-Insulator) substrate having a single crystal silicon layer formed thereon. Several kinds of the structures of the SOI substrate, and the method of fabricating the same, are known. Typically, SIMOX (Separation by Implanted Oxygen), ELTRAN (Epitaxial Layer Transfer: a registered trade name of Canon Co.) substrate, Smart-Cut (a registered trade name of SOITEC Co.) can be used. Other SOI substrates can be used naturally.

The semiconductor layer is formed into a thickness of 10 to 100 nm, typically 50 nm. The amorphous semiconductor film formed by plasma CVD contains about 10 to about 40 atom % of hydrogen in the film. It is therefore preferable to conduct heat-treatment at 400 to 500° C. prior to the crystallization process so that hydrogen can dissociate from the film and the hydrogen content is not more than 5 atom %. Though the amorphous silicon film may be formed by other formation methods such as sputtering or vacuum deposition, impurity elements contained in the film such as oxygen and nitrogen are preferably reduced sufficiently.

Because the underlying films and the amorphous semiconductor film can be formed by the same film formation method, it is advisable to continuously form the underlying film 102, the underlying film 103 and the semiconductor layer. Because its surface is not exposed to the atmosphere after each of these films is formed, surface contamination can be prevented. As a result, one of the factors that cause variation of TFT performance can be obviated.

A known laser annealing technology or a known heat annealing technology may be employed in order to crystallize the amorphous semiconductor film. The crystalline semiconductor film can be used when the heat annealing technology using a catalytic element is employed. Furthermore, excellent TFT performance can be obtained by applying gettering and removing the catalytic element, after forming crystalline semiconductor film by the heat annealing technology using the catalytic element.

The crystalline semiconductor film so formed is patterned by a known patterning process using a first photo-mask to form a resist mask, and a second island semiconductor layer 104 and a first island semiconductor layer 105 are formed by dry etching.

Next, a gate insulation film 106 consisting of silicon oxide or silicon nitride as a principal component is formed on the surface of the second island semiconductor layer 104 and on the surface of the first island semiconductor layer 105. This gate insulation film 106 is formed by plasma CVD or sputtering to a thickness of 10 to 200 nm, preferably 50 to 150 nm (see FIG. 1(A)).

Resist masks 107 and 108 to cover the channel formation regions of the second and first island semiconductor layers 104 and 105 are formed with a second photo-mask. At this time, a resist mask 109 may be formed in a region in which wiring is to be made.

A process step for forming a second impurity region is carried out by adding an impurity element for imparting the n type. Phosphorus (P), arsenic (As) and antimony (Sb) are known as the impurity elements that impart the n type conductivity to the crystalline semiconductor material, but phosphorus is used here and added by ion doping using phosphine ($PH_3$). In this process step, an acceleration voltage is set to a rather high level of 80 keV in order to add phosphorus into the semiconductor layer below the gate insulation film 106 through this film 106. The concentration of P doped into the semiconductor layer is preferably within the range of $1\times10^{16}$ to $1\times10^{19}$ atoms/cm$^3$, and is $1\times10^{18}$ atoms/cm$^3$ in this case. In this way, regions 110 and 111 in which P is doped into the semiconductor layer are formed. A part of the second impurity region formed in this process functions as the LDD region (FIG. 1(B)).

An alkaline peeling solution that is commercially available may be used in order to remove the resist mask, but the resist mask can be effectively removed by ashing. Ashing is the method in which plasma is generated in an oxidizing atmosphere, and exposes and removes the cured resist. It can be carried out effectively when steam is added to the atmosphere besides oxygen.

The first conductor layer 112 is formed on the surface of the gate insulation film 106. This first conductor layer 112 is formed from a conductive material selected from the group consisting of Ta, Ti, Mo and W as the principal component. The first conductor layer 107 is formed preferably to a thickness of 10 to 100 nm, more preferably 150 to 400 nm (FIG. 1(C)).

Compounds such as WMo, TaN, MoTa or $WSi_x$ (x=2.4<x<2.7), for example, can be used.

The conductive materials such as Ta, Ti, Mo and W have higher resistivity than Al and Cu. However, they can be used without any problem up to about 100 cm$^2$ in connection with the area of the circuit to be fabricated.

Next, resist masks 113, 114, 115 and 116 are formed using a third photo-mask. The resist mask 113 is for forming the gate electrode of a p-channel TFT, and the resist masks 115 and 116 are for forming gate wiring and gate bus line. The resist mask 114 is so formed as to cover the entire surface of the first island semiconductor layer, and functions as a mask for preventing impurities from being added in the next process step.

Unnecessary portions of the first conductor layer are etched away by drying etching, giving a second gate electrode 117, a gate wiring 119 and a gate bus line 120. Here, ashing is preferably carried out if any etching residues remain.

Next, a process step for forming a third impurity region is carried out by adding an impurity element for imparting the p type to a part of the second island semiconductor layer 104, in which the p-channel TFT is to be formed, while the resist masks 113, 114, 115 and 116 are left as such. Boron (B), aluminum (Al) and gallium (Ga) are known as the impurity element for imparting the p type. This embodiment selects boron (B) and adds it by ion doping that uses diborane ($B_2H_6$). The acceleration voltage is also 80 keV and boron is doped in a dose of $2 \times 10^{20}$ atoms/cm$^3$. In this way, third impurity regions 121 and 122 doped with boron in a high concentration are formed as shown in FIG. 1(D).

Figure 1D:
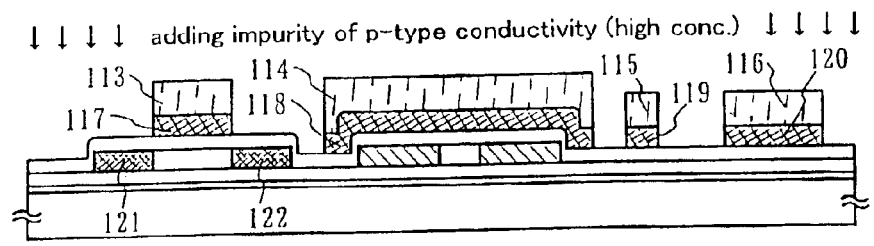

After the resist mask formed in FIG. 1(D) is removed, resist masks 123, 124 and 125 are formed using a fourth photo-mask. The fourth photo-mask is for forming the gate electrode of the n-channel TFT, and the first gate electrode 126 is formed by dry etching. At this time, the first gate electrode 126 is formed in such a fashion as to overlap with a part of the second impurity regions 110 and 111 through the gate insulation film (FIG. 1(E)).

After the resist masks 123, 124 and 125 are removed completely, resist masks 129, 130 and 131 are formed using a fifth photo-mask. The resist mask 130 is formed in such a fashion as to cover the first gate electrode 126 and to overlap with a part of the second impurity regions 110 and 111. The resist mask 130 decides the offset quantity of the LDD region.

The surface of the semiconductor layer where the first impurity region is formed may be exposed by removing a part of the gate insulation film by using this resist mask 130. This arrangement makes it possible to effectively conduct the process step of adding the impurity element for imparting the n conductivity type to be executed in the next step.

The process step of forming the first impurity region by adding the impurity element for imparting the n conductivity type is then carried out. There are formed a first impurity region 132 to serve as the source region and a first impurity region 133 to serve as the drain region. Ion doping using phosphine ($PH_3$) is used in this case. In this process step, too, the acceleration voltage is set to a rather high level of 80 keV in order to dope phosphorus into the semiconductor layer below the gate insulation film 106 through this film 106. In comparison with the process step of adding the first impurity element for imparting the n conductivity type, the P concentration of this region is higher, and is preferably from $1 \times 10^{19}$ to $1 \times 10^{21}$ atoms/cm$^3$. The concentration of $1 \times 10^{20}$ atoms/cm$^3$ is used in this embodiment (FIG. 2(A)).

First inter-layer insulation films 134 and 135 are then formed on the surface of each of the gate insulation film 106, the first and second gate electrodes 126 and 117, the gate wiring 127 and the gate bus line 128. The first inter-layer insulation film 134 is a silicon nitride film and is formed to a thickness of 50 nm. The first inter-layer insulation film 135 is a silicon oxide film and is formed to a thickness of 950 nm.

The first inter-layer insulation film 134 comprising silicon nitride film formed here is necessary for conducting the heat-treatment in the next process step. This is effective for preventing the surface of each of the first and second gate electrodes 126 and 117, the gate wiring 127 and the gate bus line 128 from being oxidized.

The heat-treatment step is necessary for activating the impurity elements doped in the respective concentrations to impart then and p type conductivities. This step may use heat annealing using an electric heating furnace, laser annealing using the excimer laser described above, or rapid thermal annealing (RTA) using a halogen lamp. Though laser annealing can execute activation at a low substrate heating temperature, the method cannot easily activate the regions hidden beneath the gate electrode. Therefore, this embodiment uses heat annealing for activation. The heat-treatment is carried out at 300 to 700° C., preferably 350 to 550° C., in a nitrogen atmosphere. In this embodiment, it is carried out at 450° C. for 2 hours.

In this heat-treatment step, 3 to 90% of hydrogen may be added to the nitrogen atmosphere. It is advisable to carry out a hydrogenation treatment in a 3 to 100% hydrogen atmosphere at 150 to 500° C., preferably 300 to 450° C., for 2 to 12 hours. A hydrogen plasma treatment at a substrate temperature of 150 to 500° C., preferably 200 to 450° C., may be carried out, as well. In any case, hydrogen compensates for defect remaining in the semiconductor layer and on its interface, and can improve TFT performance.

After a predetermined resist mask is formed using a sixth photo-mask, the first inter-layer insulation films 134 and 135 are etched to form contact holes reaching the source and drain regions of the respective TFTs. The second conductor layer is formed, and then the source electrodes 136 and 137 and the drain electrode 138 are formed by patterning with a seventh photo-mask. This embodiment uses, as the second conductor layer of this electrode, the electrode having a three-layered structure comprising a Ti film of 100 nm, a Ti-containing Al film of 300 nm and a Ti film of 150 nm that are formed continuously by sputtering.

As a result of the process steps described above, the p-channel TFTs are formed in the self-alignment configuration, whereas the n-channel TFTs are formed in the non-self-alignment configuration.

A channel formation region 142, first impurity regions 145 and 146 and second impurity regions 143 and 144 are formed in the n-channel TFTs of the CMOS circuit. Here, a second impurity region includes a region (GOLD region) 143a, 144a that overlaps with the gate electrode and a region (LDD region) 143b, 144b that does not. The first impurity region 145 functions as the source region and the first impurity region 146, as the drain region.

On the other hand, a channel formation region 139 and third impurity regions 140 and 141 are formed in the p-channel TFTs. The third impurity region 140 functions as the source region and the third impurity region 141, as the drain region (FIG. 2(B)).

FIG. 2(C) is a top view of an inverter circuit. In the drawing, the sectional structure taken along a line A–A' of the TFT portion, the B–B' sectional structure of the gate wiring portion and the C–C' sectional structure of the gate bus line portion correspond to those of FIG. 2(B), respectively. In the present invention, the gate electrode, the gate wiring and the gate bus line comprise the first conductor layer.

FIGS. 1 and 2 typically show the CMOS circuit formed by complementarily combining the n-channel TFTs and the p-channel TFTs by way of example. However, the present invention can be applied to an NMOS circuit using the n-channel TFTs or to the pixel area of the liquid display device.

[Embodiment 2]

Another embodiment will be explained with reference to FIGS. 3 and 4. This embodiment represents the formation of an inverter circuit as the basic construction of a CMOS circuit by forming the n-channel TFTs and the p-channel TFTs on the same substrate.

Figure 3A:
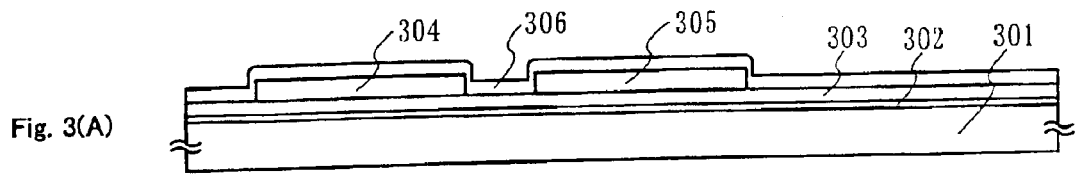
FIGS. 3(A–E) are sectional views showing a fabrication process of a TFT.
Figure 3B:
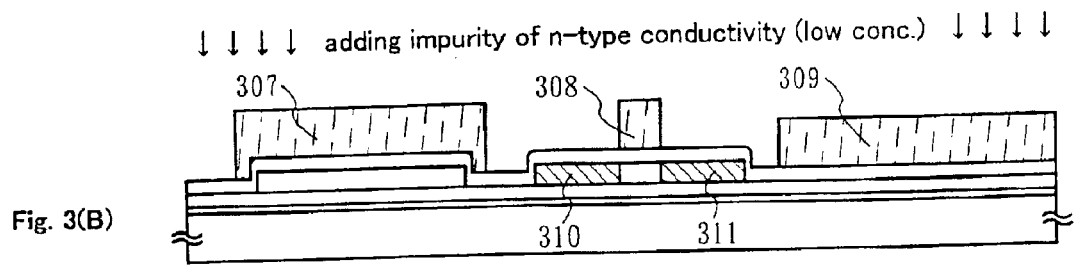
Figure 3C:
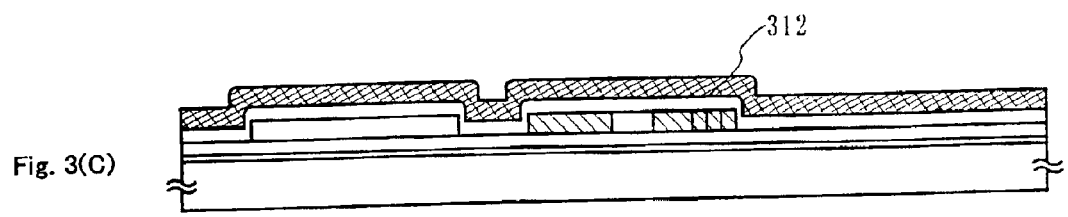
Figure 3D:
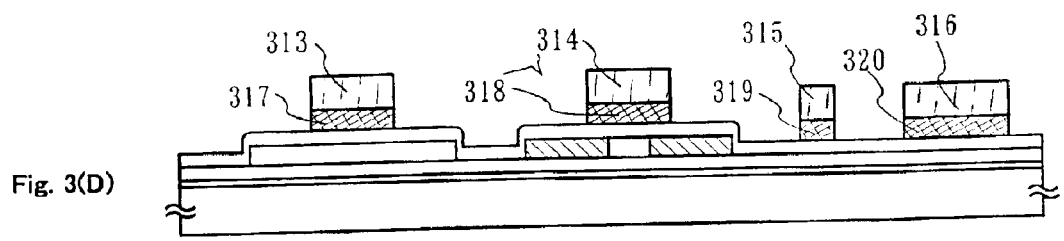
Figure 3E:
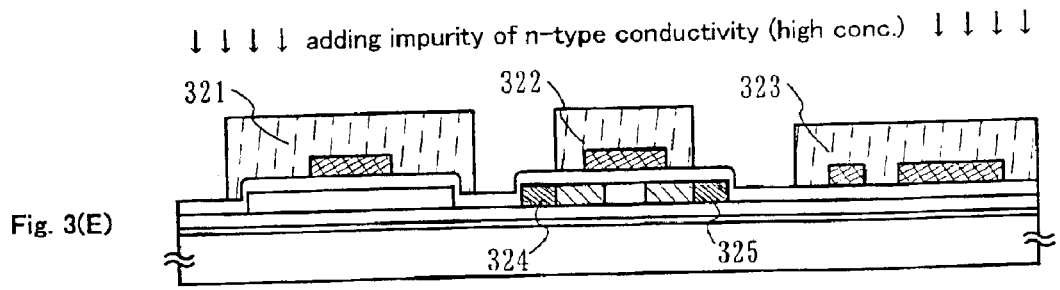

An underlying film 302 comprising a silicon nitride film, and then an-underlying film 303 comprising a silicon oxide film, a first island semiconductor layer 305, a second island semiconductor layer 304 and a gate insulation film 306 are formed first on a substrate 301 in the same way as in the first embodiment (FIG. 3(A)).

Resist masks 307 and 308 that cover the channel formation regions of the second and first island semiconductor layers 304 and 305, are formed using a second photo-mask. At this time, a resist mask 309 may be formed in the wiring formation region, too.

A process step of forming a second impurity region is carried out by adding an impurity element for imparting the n type conductivity. This embodiment employs ion doping of phosphorus using phosphine ($PH_3$). The P concentration doped into the first island semiconductor layer 305 is preferably within the range of $1\times10^{16}$ to $1\times10^{19}$ atoms/$cm^3$, and this embodiment uses the P concentration of $1\times10^{18}$ atoms/$cm^3$. P-doped regions 310 and 311 are thus formed in the semiconductor layer. A part of the resulting second impurity region is to function as the LDD region (FIG. 3(B)).

Next, a first conductor layer 312 is formed on the surface of the gate insulation film 306. The first conductor layer 312 uses a conductive material selected from the group consisting of Ta, Ti, Mo and W as the principal component. The thickness of this first conductor layer 312 is 100 to 1,000 nm, preferably 150 to 400 nm (FIG. 3(C)).

Resist masks 313, 314, 315 and 316 are then formed using a third photo-mask. A part of the first conductor layer 312 is etched away by dry etching using the resist masks, forming thereby a first gate electrode 318, a second gate electrode 317, a gate wiring 319 and a gate bus line 320 (FIG. 3(D)).

After the resist masks 313, 314, 315 and 316 are completely removed, resist masks 321, 322 and 323 are formed using a fourth photo-mask. The resist mask 322 is formed in such a fashion as to cover the first gate electrode 318 and to overlap with a part of the second impurity regions 310 and 311. The resist mask 322 decides the offset quantity of the LDD region.

A process step of forming the first impurity region is carried out by adding an impurity element for imparting the n type conductivity. There are thus formed the first impurity region 325 to function as the source region and the first impurity region 324 to function as the drain region. This embodiment employs ion doping of P using phosphine ($PH_3$). In this process step, too, the acceleration voltage is set to a rather high level of 80 keV in order to dope phosphorus into the semiconductor layer beneath the gate insulation film 106 through this film 106. The P concentration of this region is preferably $1\times10^{19}$ to $1\times10^{21}$ atoms/$cm^3$. This embodiment uses the P concentration of $1\times10^{20}$ atoms/$cm^3$ (FIG. 3(E)).

Figure 4A:
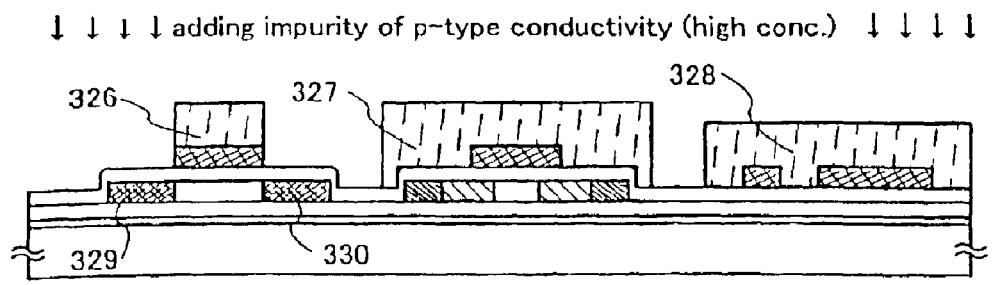
FIGS. 4(A-C) are sectional views showing a fabrication process of a TFT and a plan view of a CMOS circuit.

Next, resist masks 326, 327 and 328 are formed using a fifth photo-mask. A process step of forming a third impurity region is carried out by adding an impurity element for imparting the p type conductivity to a part of a second island semiconductor layer 304 in which p-channel TFTs are formed. This embodiment uses boron as the impurity element and conducts ion doping using diborane ($B_2H_6$). The acceleration voltage is set to 80 keV, too, in order to dope boron in a concentration of $2\times10^{20}$ atoms/$cm^3$. There are thus formed third impurity regions 329 and 330 doped with boron in a high concentration as shown in FIG. 4(A).

First inter-layer insulation films 329 and 330 are formed over the surface of the gate insulation film 306, the first and second gate electrodes 318 and 317, the gate wiring 319 and the gate bus line 320. The first inter-layer insulation film 329 is a silicon nitride film and is formed to a thickness of 50 nm.

The first inter-layer insulation film 330 is a silicon oxide film and is formed to a thickness of 950 nm.

Subsequently, the heat-treatment step is carried out in the same way as in the Embodiment 1 to form source electrodes 331 and 332 and the drain electrode 333, and a channel formation region 337, first impurity regions 340 and 341 and second impurity regions 338 and 339 are formed in n-channel TFTs of a CMOS circuit. Here, regions (GOLD regions) 338a and 339a overlapping with the gate electrode and regions (LDD regions) 338b and 339b not overlapping the gate electrode are formed in the second impurity region. The first impurity region 340 functions as the source region and the first impurity region 341 functions as the drain region.

Figure 4B:
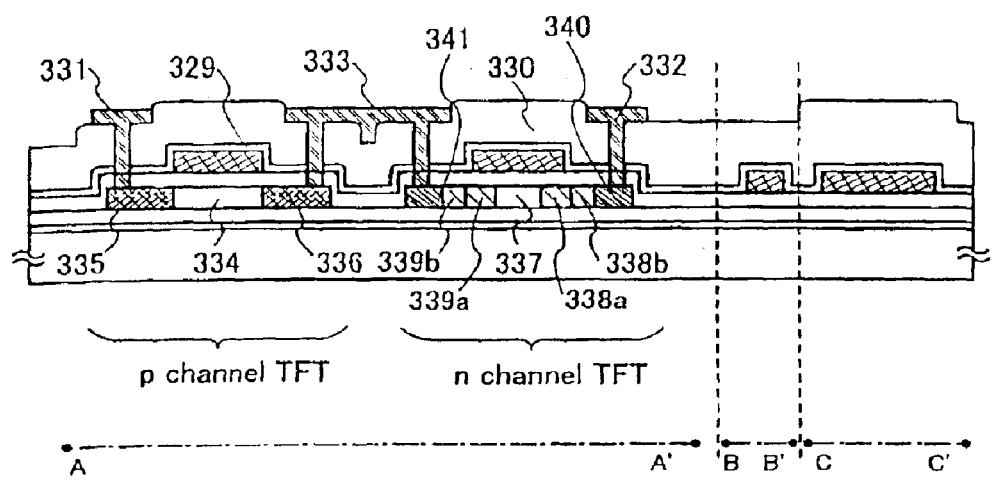

On the other hand, a channel formation region 334, a third impurity region 335 to function as the source region and a third impurity region 336 to function as the drain region are formed in the p-channel TFT (FIG. 4(B)).

Figure 4C:
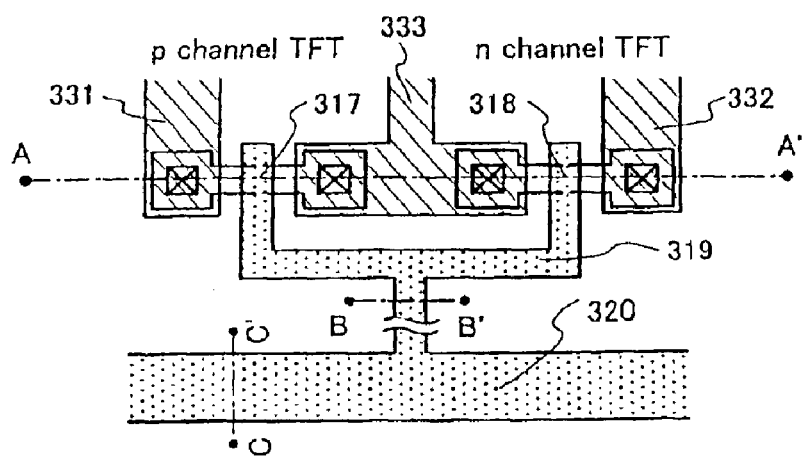

FIG. 4(C) is a top view of an inverter circuit. The A–A' sectional structure of the TFT portion, the B–B' sectional structure of the gate wiring portion and the C–C' sectional structure of the gate bus line portion correspond to those shown in FIG. 4(B), respectively. In the present invention, the gate electrode, the gate wiring and the gate bus line are comprised of the first conductor layer.

FIGS. 3 and 4 show a CMOS circuit comprising a complementary combination of n-channel TFTs and p-channel TFTs by way of example, but the present invention can be applied also to an NMOS circuit using the n-channel TFTs and to a pixel area of a liquid crystal display device.

[Embodiment 3]

Figure 26A:
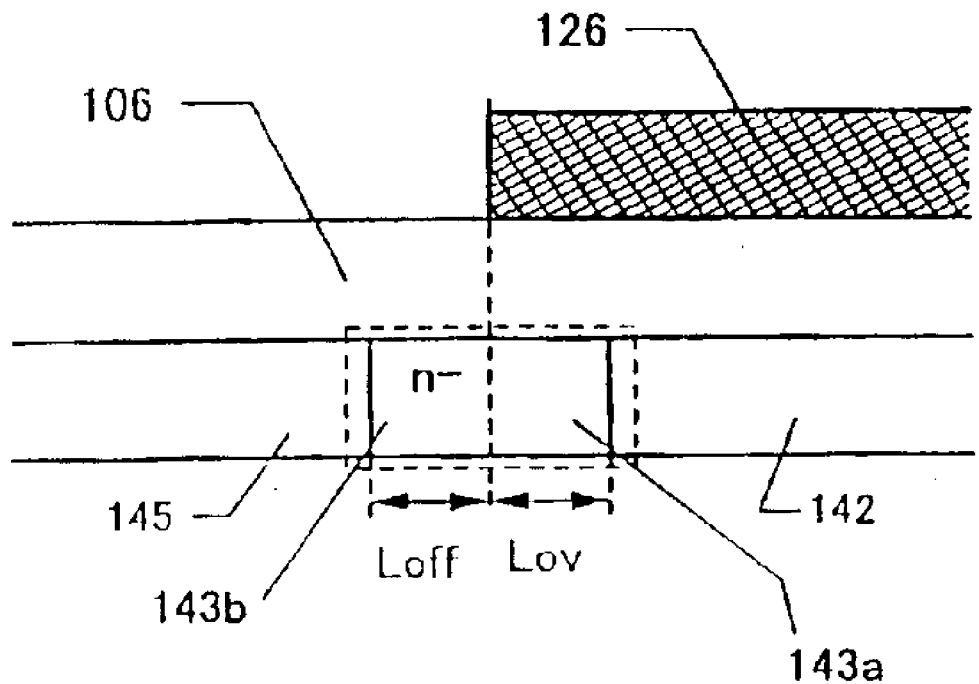
FIGS. 26(A) and 26(B) are explanatory views useful for explaining the relation between a gate electrode and an LDD region in the present invention.
Figure 26B:
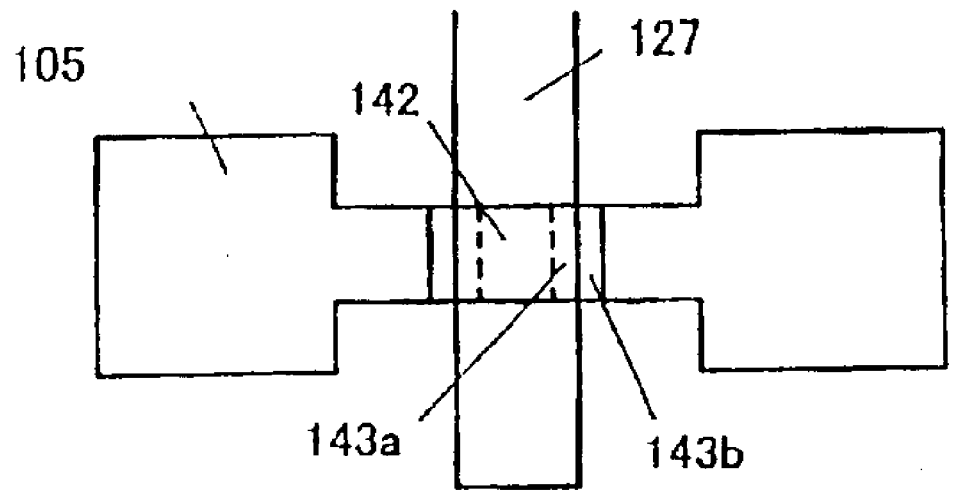

The construction of the TFTs according to the present invention will be explained in further detail with reference to FIG. 26. Each reference numeral in FIG. 26 corresponds to the one used in FIGS. 1 and 2. The second impurity region as the LDD region can be divided into the second impurity region 143a overlapping with the first gate electrode 126 and the second impurity region 143b not overlapping with the gate electrode 126. In other words, there are formed the LDD region (Lov) overlapping with the gate electrode and the LDD region (Loff) not overlapping with the gate electrode.

The lengths of Lov and Loff in the LDD regions can be easily determined by using three photo-masks as represented in Embodiment 1. In the process step of Embodiment 1, the resist mask is formed using the second photo-mask and the second impurity region is formed by the doping step that imparts the n-type conductivity. A part of this region functions as the LDD region. The first gate electrode is formed using the fourth photo-mask, and the overlapping region (Lov) of the LDD is formed at this time. Furthermore, the LDD region (Loff) is formed using the resist mask that is formed using the fifth. photo-mask.

The three photo-masks described are directed to form the resist masks in the doping step and in addition, they are the masks for patterning the gate electrode. They have both of these functions.

Therefore, design freedom can be given to the lengths of Lov and Loff, and the lengths can be set arbitrarily in conjunction with the size of the TFTs to be fabricated. This method has been extremely advantageous when TFTs having mutually different driving voltages are fabricated for respective functional circuits in the large area integrated circuit. FIG. 26 shows an example of design values of the TFTs used in the logic circuit portion, the buffer circuit portion, the analog switch portion and the pixel area of the active matrix liquid crystal display device, by way of example. At this time, not only the channel length but also the length of each of the second impurity region 143a overlapping the gate electrode and the second impurity region 143b not overlapping with the gate electrode can be set appropriately in consideration of the driving voltages of the respective TFTs.

The ON characteristics of the TFTs of the shift register circuit of the driver circuit of the liquid crystal display device and of the TFTs of the buffer circuit are basically of importance. Therefore, the second impurity region 143b not overlapping with the gate electrode is not always necessary to be disposed so long as only the so-called "GOLD structure" is disposed. When it is disposed, however, the Loff value may be set to the range of 0.5 to 3 μm in consideration of the driving voltages. When the withstand voltage is taken into consideration, the value of the second impurity region 143b not overlapping with the gate electrode is preferably greater as the driving voltage becomes higher.

In order to prevent the increase of the OFF current of the TFTs disposed in the sample circuit or in the pixel unit, the length of the second impurity region 143a may be set to 1.5 μm and the length of the second impurity region 143b not overlapping with the gate electrode, to 1.5 m, when the channel length is 3 μm. Needless to say, the present invention is not specifically limited to these design values but may select appropriate design values.

On the other hand, only the channel formation region, the source region and the drain region may be formed in the p-channel TFT. Though the structure similar to that of the n-channel TFT may be used, it is more preferred to secure the ON current and to keep the balance of performance with the n-channel TFT because the p-channel TFT has high reliability from the outset. When the present invention is applied to the CMOS circuit as shown in FIG. 1, this balance of performance is of utmost importance. However, no problem develops when the construction of the present invention is applied to the p-channel TFT.

[Embodiment 4]

The fourth embodiment of the present invention will be explained with reference to FIG. 5. The explanation is given on the embodiment in which the n-channel TFTs and the p-channel TFTs are fabricated on the same substrate to form the inverter circuit as the basic construction of the CMOS circuit.

To begin with, the substrate under the state shown in FIG. 1(A) is formed in the same way as in Embodiment 1. Resist masks 501, 502 and 503 are formed using the second photo-mask.

The process step for forming the third impurity region is conducted by adding an impurity element that imparts the p type conductivity. Here, boron is the impurity element, and ion doping is carried out using diborane ($B_2H_6$). The acceleration voltage is 80 keV, too, and boron is doped in a dose of $2\times10^{20}$ atoms/$cm^3$. There are thus formed the third impurity regions 504 and 505 doped with boron in a high concentration.

Resist masks 506, 507 and 508 are formed using the third photo-mask, and the process step for forming the second impurity region is conducted by doping an impurity element for imparting the n type conductivity to a selected region of the first island semiconductor layer. Here, phosphorus is used as the impurity element, and ion doping is conducted using phosphine ($PH_3$). The concentration of phosphorus added here is preferably within the range of $1\times10^{16}$ to $1\times10^{19}$ atoms/$cm^3$, and a dose of $1\times10^{18}$ atoms/$cm^3$ is employed. There are thus formed phosphorus-doped regions 509 and 510 in the semiconductor layer. A part of the resulting second impurity region functions as the LDD region (FIG. 5(B)).

The first conductor layer 511 is formed on the surface of the gate insulation film 106 using a conductive material consisting of the element selected from Ta, Ti, Mo and W as the principal component. The first conductor layer 511 is formed to a thickness of 100 to 1,000 nm, preferably 150 to 400 nm (FIG. 5(C)).

Next, resist masks 512, 513, 514 and 515 are formed using the fourth photo-mask. A part of the first conductor layer 511 is etched away by dry etching using the resist masks, thereby forming the first gate electrode 517, the second gate electrode 516, the gate wiring 518 and the gate bus line 519 (FIG. 5(D)).

Resist masks 520, 521 and 522 are formed using the fifth photo-mask. The resist mask 521 is formed in such a fashion as to cover the first gate electrode 517 and to partially overlap with the second impurity regions 509 and 510. The resist mask 521 determines the offset amount of the LDD region.

The process step for forming the first impurity region by adding an n-type imparting impurity element is conducted. There are thus formed the first impurity region 524 to function as the source region and the first impurity region 523 to function as the drain region. Here, ion doping using phosphine ($PH_3$) is employed. The P concentration in this region is preferably within the range of $1\times10^{19}$ to $1\times10^{21}$ atoms/$cm^3$ and is $1\times10^{20}$ atoms/$cm^3$ (FIG. 5(E)) in this case.

Subsequently, the heat-treatment step is conducted in the same way as in Embodiment 1, and the source electrodes 527 and 528 and the drain electrode 529 are formed. The channel formation region 533, the first impurity regions 536 and 537 and the second impurity regions 534 and 535 are formed in the n-channel TFTs of the CMOS circuit. Here, the regions (GOLD region) 534a and 535a overlapping the gate electrode and the regions (LDD region) 534b and 535b not overlapping with the gate electrode are formed in the second impurity region. The first impurity region 536 functions as the source region and the first impurity region 537, as the drain region. On the other hand, the channel formation region 530, the third impurity region 531 to function as the source region and the third impurity region 532 to function as the drain region are formed in the p-channel TFT (FIG. 5(F)).

[Embodiment 5]

The fifth embodiment of the present invention will be explained with reference to FIG. 6. The explanation is given on the embodiment in which the n-channel TFTs and the p-channel TFTs are fabricated on the same substrate to form the inverter circuit as the basic construction of the CMOS circuit.

To begin with, the substrate under the state shown in FIG. 1(A) is formed in the same way as in Embodiment 1. Resist masks 601, 602 and 603 are formed using the second photo-mask.

Figure 6A:
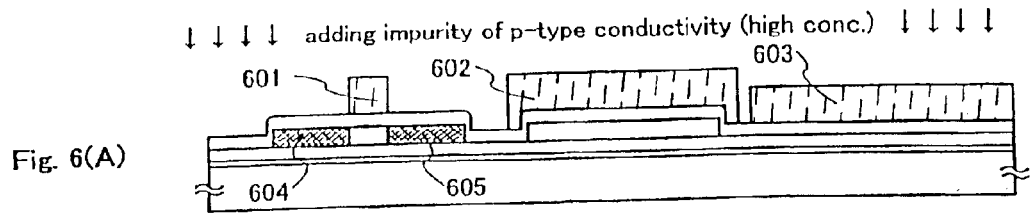
FIGS. 6(A–F) are sectional views showing a fabrication process of a TFT.
Figure 6B:
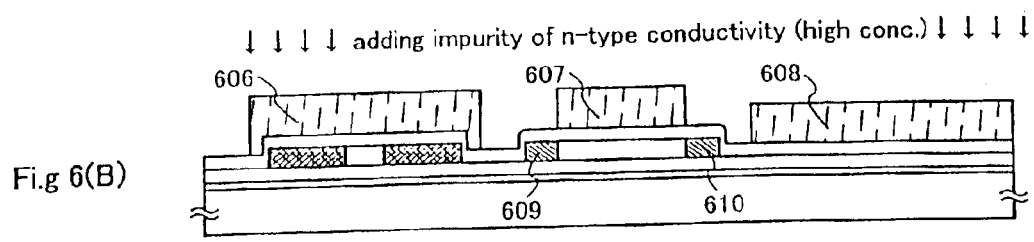
Figure 6C:
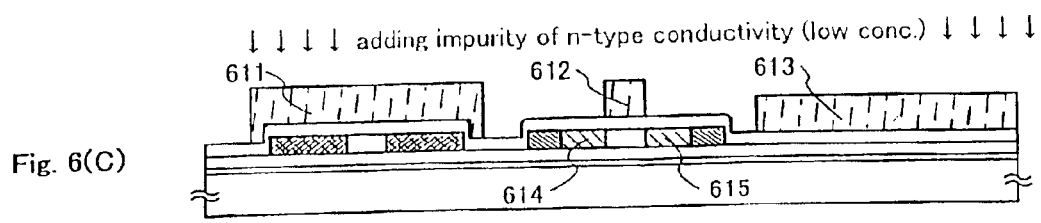
Figure 6D:
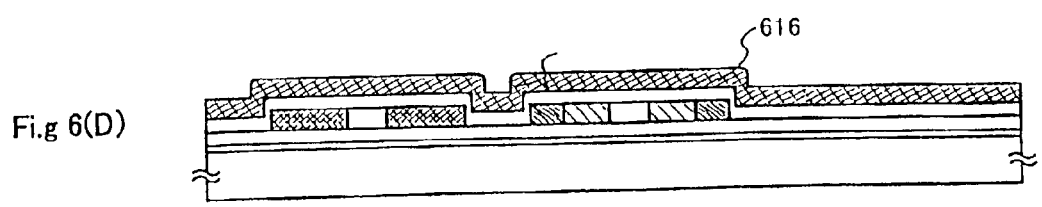
Figure 6E:
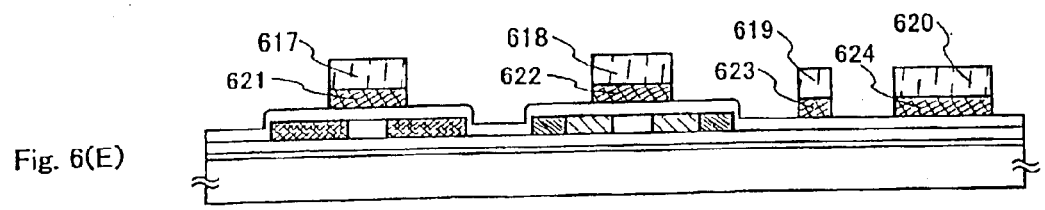
Figure 6F:
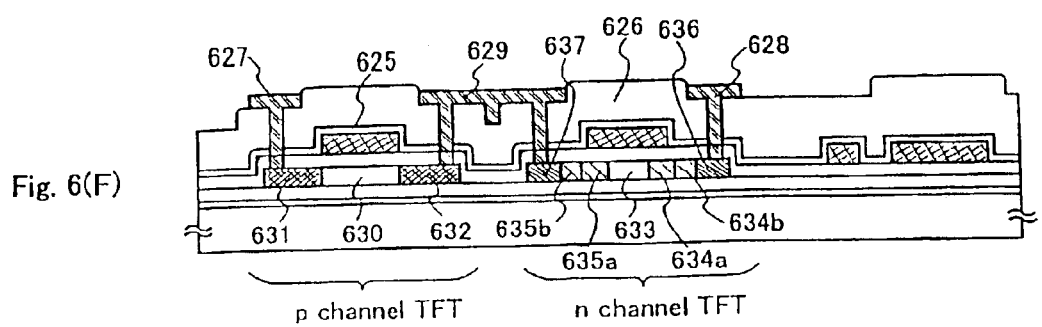

The process step for forming the third impurity region by adding a p type conductivity imparting impurity element is conducted. Here, boron is the impurity element, and ion doping is conducted using diborane ($B_2H_6$). The acceleration voltage is 80 keV and boron is doped in a dose of $2\times10^{20}$ atoms/$cm^3$. There are thus formed the third impurity regions 604 and 605 doped with boron in a high concentration as shown in FIG. 6(A).

Resist masks 606, 607 and 608 are formed using the third photo-mask. The process step for forming the first impurity region by adding the n type conductivity imparting impurity element is conducted into the first island semiconductor layer 105. There are thus formed the first impurity region 610 to function as the source region and the first impurity region 609 to function as the drain region. Here, ion doping using phosphine (PH$_3$) is conducted. The phosphorus concentration in this region is preferably within the range of 1×10$^{19}$ to 1×10$^{21}$ atoms/cm$^3$, and it is 1×10$^{20}$ atoms/cm$^3$ in this case (FIG. 6(B)).

Next, resist masks 611, 612 and 613 are formed using the fourth photo-mask, and the process step for forming the second impurity region by adding the n type imparting impurity element to a selected region of the first island semiconductor layer 105 is conducted. Here, phosphorus is used as the impurity element and ion doping is conducted using phosphine (PH$_3$). The P concentration added here is preferably within the range of 1×10$^{16}$ to 1×10$^{19}$ atoms/cm$^3$, and it is 1×10$^{18}$ atoms/cm$^3$ in this case. There are thus formed phosphorus-doped regions 614 and 615 in the semiconductor layer. A part of the second impurity region formed here functions as the LDD region (FIG. 6(C)).

The first conductor layer 616 is formed on the surface of the gate insulation film 106 using a conductive material containing the element selected from Ta, Ti, Mo and W as the principal component. The first conductor layer 616 may be formed to a thickness of 100 to 1,000 nm, preferably 150 to 400 nm (FIG. 6(D)).

Next, resist masks 617, 618, 619 and 620 are formed using the fifth photo-mask. A part of the first conductor layer 616 is etched away by dry etching, forming the first gate electrode 622, the second gate electrode 621, the gate wiring 623 and the gate bus line 624 (FIG. 6(E)).

Subsequently, the heat-treatment step is conducted in the same way as in Embodiment 1, and the source electrodes 627 and 628 and the drain electrode 629 are formed. The channel formation region 633, the first impurity regions 636 and 637 and the second impurity regions 634 and 635 are formed in the n-channel TFTs of the CMOS circuit. The regions (GOLD region) 634a and 635a overlapping with the gate electrode and the regions (LDD region) 634b and 635b not overlapping with the gate electrode are formed in the second impurity region. The first impurity region 636 functions as the source region and the first impurity region 637 functions as the drain region. On the other-hand, the channel formation region 630, the third impurity region 631 to function as the source region and the third impurity region 632 to function as the drain region are formed in the p-channel TFT (FIG. 6(F)).

[Embodiment 6]

The sixth embodiment will be explained with reference to FIG. 7. Here, the explanation is given on the embodiment in which the n-channel TFTs and the p-channel TFTs are fabricated on the same substrate to form the inverter circuit as the basic construction of the CMOS circuit.

To begin with, the substrate under the state shown in FIG. 1(A) is formed in the same way as in Embodiment 1. Resist masks 701, 702 and 703 are formed using the second photo-mask.

First, the n type imparting impurity element is selectively added to the first island semiconductor layer 105 to form the first impurity region. Ion doping using phosphine (PH$_3$) is conducted in this case. The P concentration of this region is preferably 1×10$^{19}$ to 1×10$^{21}$ atoms/cm$^3$, and it is 1×10$^{20}$ atoms/cm$^3$ in this case. There are thus formed the regions 704 and 705 doped with P into the semiconductor layer (FIG. 7(A)).

Next, resist masks 706, 707 and 708 are formed using the third photo-mask. The process step for forming the second impurity region by adding the n type imparting impurity element to the selected region of the first island semiconductor layer is conducted. Here, the concentration of phosphorus is preferably within the range of 1×10$^{16}$ to 1×10$^{19}$ atoms/cm$^3$, and typically 1×10$^{18}$ atoms/cm$^3$. There are thus formed the regions 709 and 710 containing phosphorus doped into the semiconductor layer. A part of the second impurity region formed hereby functions as the LDD region (FIG. 7(B)).

The first conductor layer 711 is formed on the surface of the gate insulation film 106 using the element selected from Ta, Ti, Mo and W as the principal component. The thickness of the first conductor layer 711 is 100 to 1,000 nm, preferably 150 to 400 nm (FIG. 7(C)).

Next, the resist masks 712, 713 and 714 are formed using the fourth photo-mask. The resist mask 712 is to form the second gate electrode. The resist mask 713 is formed in such a fashion as to cover the entire surface of the first island semiconductor layer and to function as the mask for preventing the addition of the impurity in the following step.

Figure 7A:
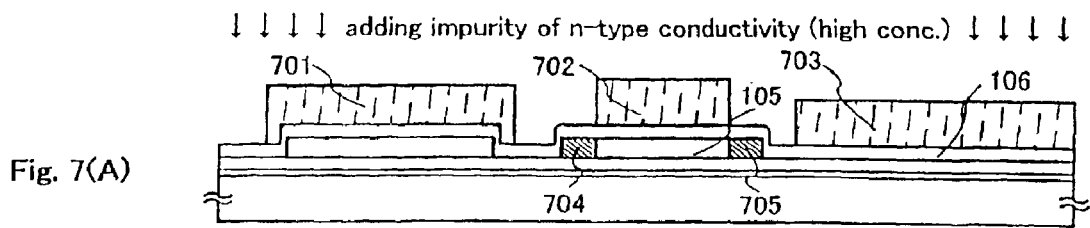
FIGS. 7(A–F) are sectional views showing a fabrication process of a TFT.
Figure 7B:
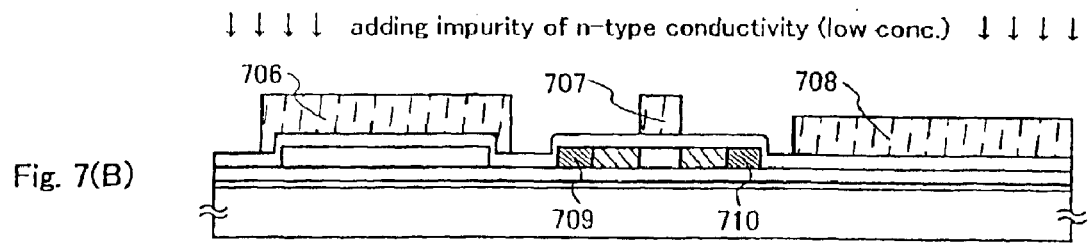
Figure 7C:
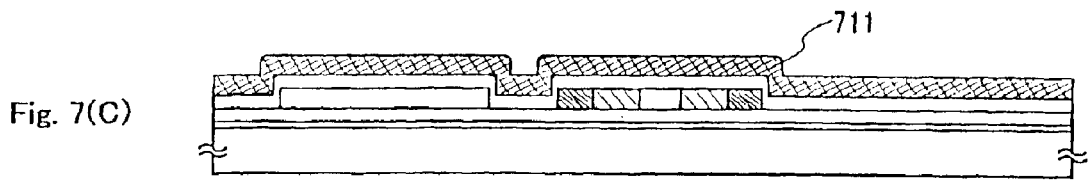
Figure 7D:
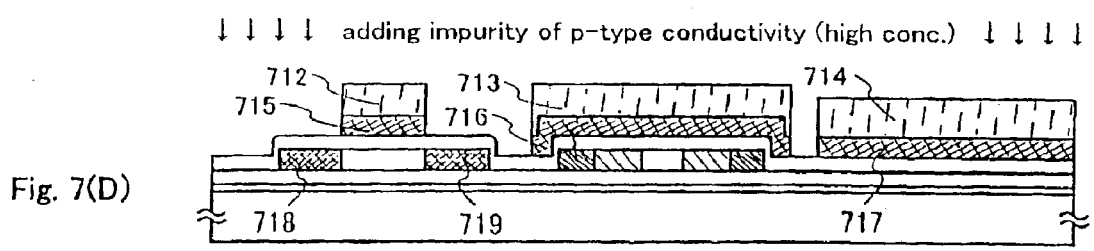
Figure 7E:
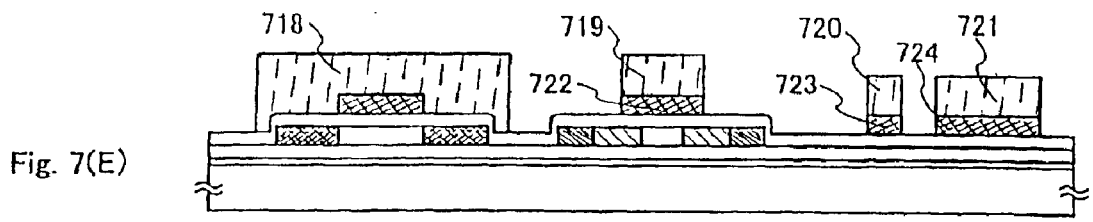
Figure 7F:
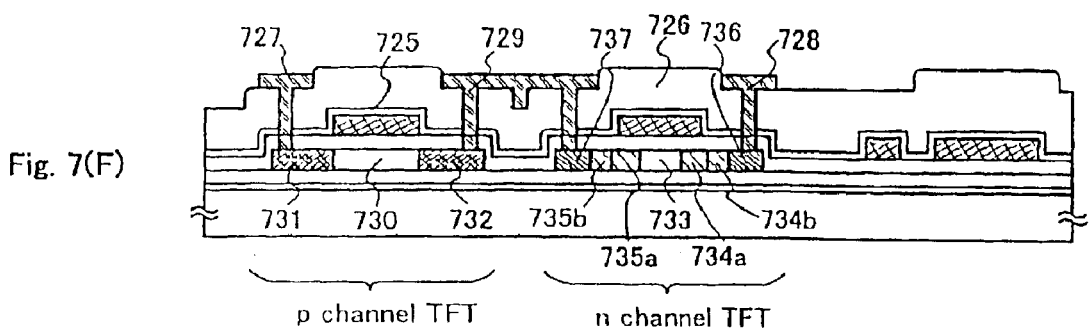

The unnecessary portions of the first conductor layer are etched away by dry etching, forming the second gate electrode 715. The process step for forming the third impurity region by adding the p-type imparting impurity element to a part of the second island semiconductor layer 104 for forming the p-channel TFT is conducted. The p-type imparting impurity element is boron, and is added in a dose of 2×10$^{20}$ atoms/cm$^3$. There are thus formed the third impurity regions 718 and 719 containing boron in a high concentration as shown in FIG. 7(D).

Next, the resist masks 718, 719, 720 and 721 are formed using the fifth photo-mask. A part of the first conductor layer 716 and 717 is etched away by dry etching, forming the first gate electrode 722, the gate wiring 723 and the gate bus line 721 (FIG. 7(E)).

Subsequently, in the same way as in Embodiment 1, the heat-treatment step is conducted and the source electrodes 727 and 728 and the drain electrode 729 are formed. The channel formation region 733, the first impurity region 736 and 737 and the second impurity regions 734 and 735 are formed in the n-channel TFT of the CMOS circuit. Here, the regions (GOLD region) 734a and 735a overlapping with the gate electrode and the regions (LDD region) 734b and 735b not overlapping with the gate electrode are formed in the second impurity regions, respectively. The first impurity region 736 functions as the source region and the first impurity region 737 functions as the drain region. On the other hand, the channel formation region 730, the third impurity region 731 to function as the source region and the third impurity region 732 to function as the drain region are formed in the p-channel TFT (FIG. 7(F)).

[Embodiment 7]

To begin with, the substrate under the state shown in FIG. 1(A) is formed in the same way as in Embodiment 1. Resist masks 801, 802 and 803 are formed using the second photo-mask.

Figure 8A:
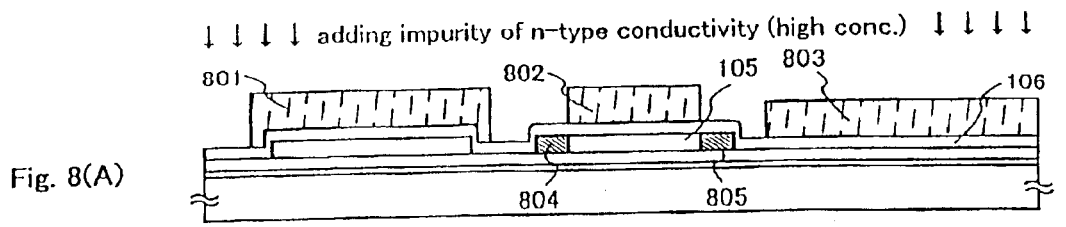
FIGS. 8(A–F) are sectional views showing a fabrication process of a TFT.

The first impurity region is first formed by selectively adding the n-type imparting impurity element to the first island semiconductor layer 105. Here, ion doping using phosphine (PH$_3$) is employed. The P concentration in this region is preferably 1×10$^{19}$ to 1×10$^{21}$ atoms/cm$^3$, and it is 1×10$^{20}$ atoms/cm$^3$ in this case. There are thus formed regions doped with phosphorus 804 and 805 in the semiconductor layer (FIG. 8(A)).

Figure 8B:
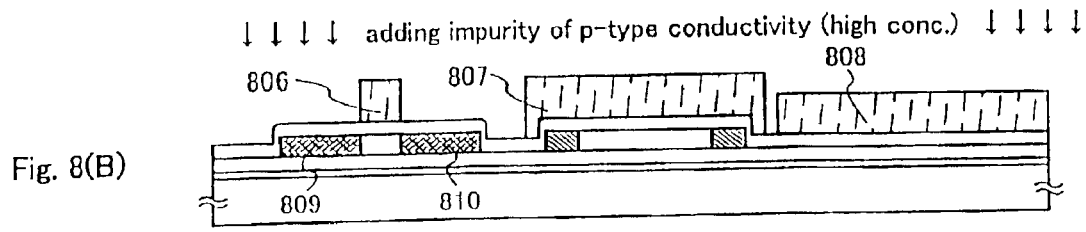

Next, the resist masks 806, 807 and 808 are formed using the third photo-mask, and the process step for forming the third impurity region by adding the p-type imparting impurity element is conducted. Here, boron is the impurity element, and ion doping is conducted using diborane (B$_2$H$_6$). The acceleration voltage is 80 keV in this case, too, and boron is added in a dose of 2×10$^{20}$ atoms/cm$^3$. There are thus formed the third impurity regions 809 and 810 doped with boron in a high concentration as shown in FIG. 8(B).

Figure 8C:
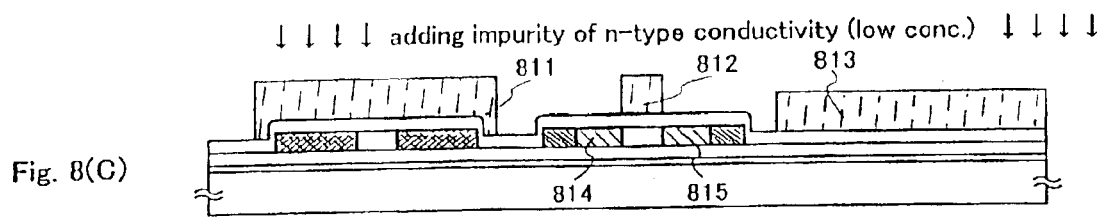
Figure 8D:
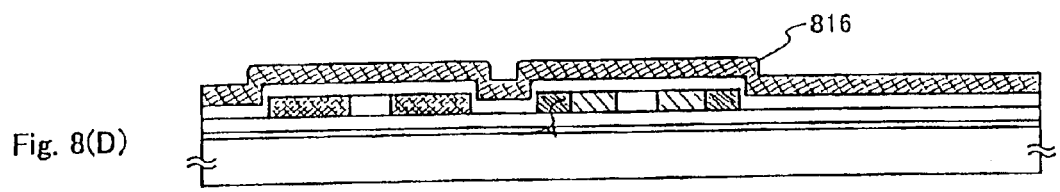

Next, the resist masks 811, 812 and 813 are formed using the third photo-mask. The process step for forming the second impurity region is conducted by adding the n-type imparting impurity element into a selected region of the first island semiconductor layer. Here, phosphorus is used, and ion doping using phosphine (PH$_3$) is conducted. The dose of phosphorus in this case is preferably within the range of $1\times10^{16}$ to $1\times10^{19}$ atoms/cm$^3$, and it is $1\times10^{18}$ atoms/cm$^3$. There are thus formed the regions 814 and 815 containing phosphorus in the semiconductor layer. A part of the resulting second impurity regions functions as the LDD region (FIG. 8(C)).

The first conductor layer 816 is formed on the surface of the gate insulation film 106 using a conductive material containing the element selected from Ta, Ti, Mo and W as the principal component. The first conductor layer 816 may be formed to a thickness of 100 to 1,000 nm, preferably 150 to 400 nm (FIG. 8(C)).

Figure 8E:
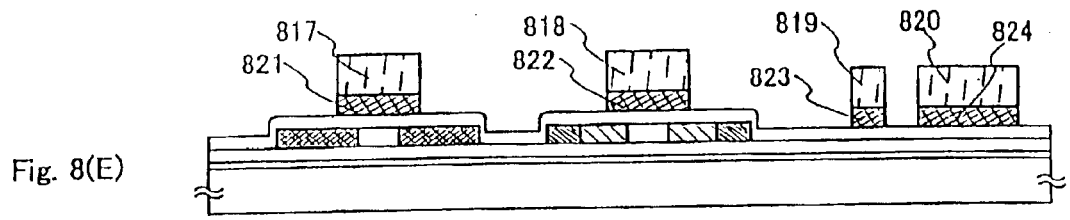

Next, the resist masks 817, 818, 819 and 820 are formed using the fourth photo-mask. A part of the first conductor layer 816 is etched away by dry etchin using the resist masks, forming the first gate electrode 822, the second gate electrode 821, the gate wiring 823 and the gate bus line 824 (FIG. 8(E)).

Figure 8F:
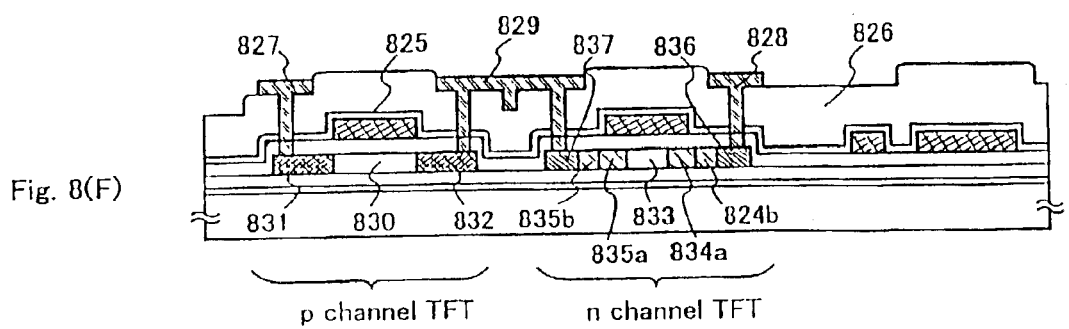

Subsequently, in the same way as in Embodiment 1, the heat-treatment step is conducted and the source electrodes 827 and 828 and the drain electrode 829 are formed. The channel formation region 833, the first impurity regions 836 and 837 and the second impurity regions 834 and 835 are formed in the n-channel TFT of the CMOS circuit. Here, the regions (GOLD region) 834a and 835a overlapping with the gate electrode and the regions (LDD regions) 834b and 835b not overlapping with the gate electrode are formed in the second impurity regions, respectively. The first impurity region 836 functions as the source region and the first impurity region 837, as the drain region. On the other hand, the channel formation region 830, the third impurity region 831 to function as the source region and the third impurity region 832 to function as the drain region are formed in the p-channel TFT (FIG. 8(F)).

[Embodiment 8]

Figure 1E:
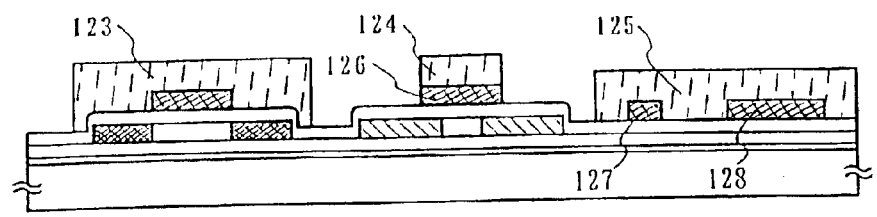
Figure 9A:
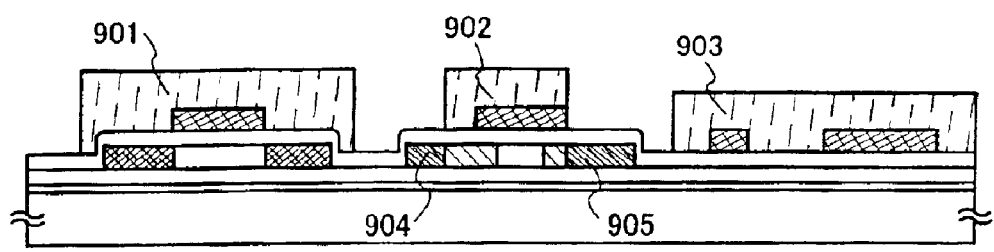
FIGS. 9(A–B) are sectional views showing a fabrication process of a TFT.

To begin with, the state shown in FIG. 1(E) is obtained in the same way as in Embodiment 1. Next, the resist masks 901, 902 and 903 are formed as shown in FIG. 9(A). The resist mask 902 is formed in such a fashion as to cover the first gate electrode 126 of the n-channel TFT and a part of the second impurity region, and is used for forming the LDD. Here, the resist mask 902 is formed only on the drain side of the n-channel TFT. The LDD prevents the increase of the leakage current, and a sufficient effect can be obtained by disposing it only on the drain side (FIG. 9(A)).

Figure 9B:
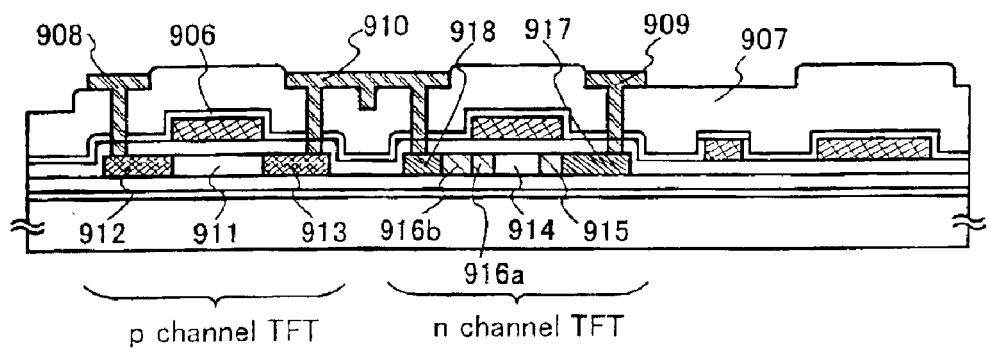

The subsequent process steps are conducted in the same way as in Embodiment 1, forming the CMOS circuit shown in FIG. 9(B). The channel formation region 914, the first impurity regions 917 and 918 and the second impurity regions 915 and 916 are formed in the n-channel TFT. Here, the region (GOLD region) 916 overlapping with the first gate electrode and the region (LDD region) 916b not overlapping with the first gate electrode are formed in the second impurity region 916. The first impurity region 917 functions as the source region and the first impurity region 918, as the drain region.

[Embodiment 9]

Figure 10A:
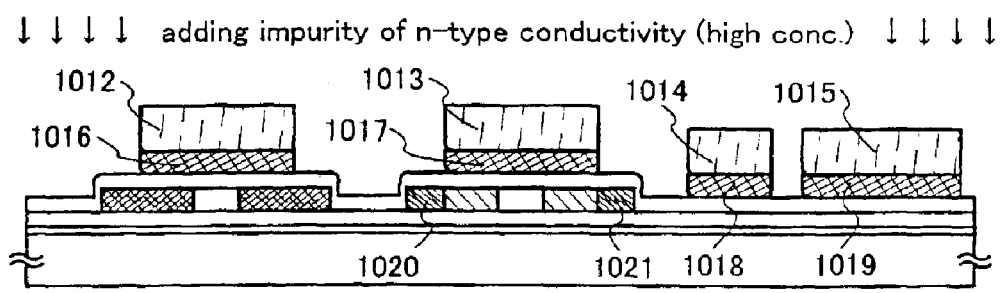
FIGS. 10(A–C) are sectional views showing a fabrication process of a TFT.

This embodiment will be explained with reference to FIG. 10. To begin with, the state shown in FIG. 5(C) is obtained in the same way as in Embodiment 1.

The resist masks 1012, 1013, 1014 and 1015 are formed using a photo-mask, and a part of the first conductor layer 511 is etched away by dry etching. Thereafter, by using this resist mask, the second doping process for imparting the n-type is conducted to form the regions 1010, 1011, 1020 and 1021 containing phosphorus doped into the semiconductor layers 104 and 105 (FIG. 10(A)).

Figure 10B:
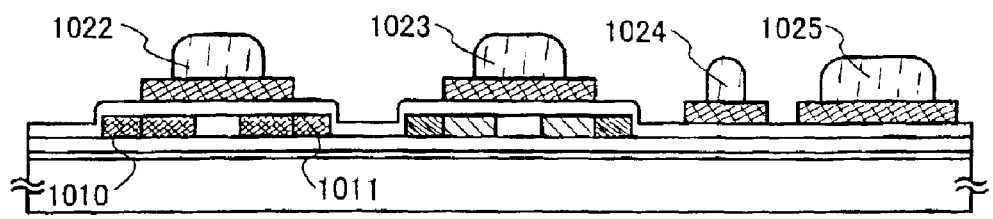

Here, the resist masks are completely removed by ashing and an alkaline peeling solution. A photo-resist film is formed again, and the patterning process is conducted by the exposure from the back. In this case, the patterns of the gate electrode, the gate wiring and the gate bus line exhibit the same function as that of the photo-mask, and the resist masks 1022, 1023, 1024 and 1025 are formed on the respective patterns. The exposure from the back is effected by using direct light and scattered light, and the resist masks can be formed inside and on the gate electrode as shown in FIG. 10(B) when the exposure condition such as the light intensity, the exposure time, and so forth, is adjusted.

The first gate electrode 1002, the second gate electrode 1001, the gate wiring 1003 and the gate bus line 1004 are formed by etching away a part of the gate electrode, the gate wiring and the gate bus line by dry etching.

Figure 10C:
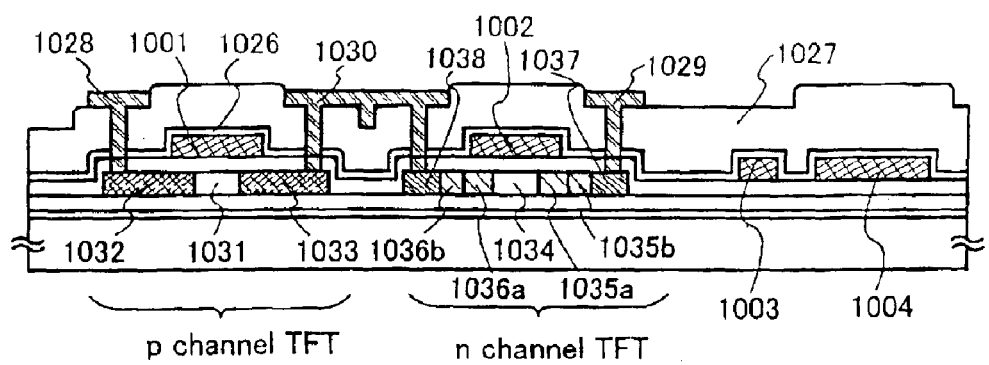

Subsequently, the process steps are conducted in the same way as in Embodiment 5, forming the CMOS circuit shown in FIG. 10(C). The channel formation region 1034, the first impurity regions 1037 and 1038 and the second impurity regions 1035 and 1036 are formed in the n-channel TFT. Here, the regions (GOLD regions) 1035a and 1036a overlapping with the first gate electrode and the regions (LDD regions) 1035b and 1036b not overlapping with the first gate electrode are formed in the second impurity regions. The first impurity region 1037 functions as the source region and the first impurity region 1038, as the drain region.

EXAMPLES

Example 1

In this example, the construction of the present invention and the method of simultaneously fabricating the pixel area and the CMOS circuit, which is the basic form of the driving circuit to be disposed round the pixel area, will be explained with reference to FIGS. 11 to 13.

In FIG. 11, an alkali-free glass substrate typified by "Corning 1737 glass" substrate is used for a substrate 1101. An underlying layer 1102 is formed on the surface of the substrate 1101, on which TFTs are to be formed, by plasma CVD or sputtering. A silicon nitride film and a silicon oxide film are formed to a thickness of 50 nm (generally 25 to 100 nm) and 150 nm (generally 50 to 300 nm), respectively, as the underlying layer 1102, though the films are not shown in the drawing. The underlying layer 1102 may use only the silicon nitride film or the silicon nitride oxide film.

Besides the materials described above, the underlying layer 1102 may have a two-layered structure in which a first silicon oxide nitride film is formed from SiH$_4$, NH$_3$ and N$_2$O to a thickness of 10 to 100 nm, and a second silicon oxide nitride film is formed from SiH$_4$ and N$_2$O on the former to a thickness of 100 to 200 nm.

The first silicon oxide nitride film is formed by parallel flat sheet type plasma CVD. This silicon oxide nitride film is formed by the steps of introducing SiH$_4$ at 10 sccm, NH$_3$ at 100 sccm and N$_2$O at 20 sccm into a reaction chamber, and setting a substrate temperature to 325° C., a reaction pressure to 40 Pa, a discharge power density to 0.41 W/cm$^2$ and a discharge frequency to 60 MHz. On the other hand, the second silicon oxide nitride film is formed by the steps of introducing SiH$_4$ at 4 sccm and N$_2$O at 400 sccm into the reaction chamber, and setting the substrate temperature to 400° C., the reaction pressure to 40 Pa, the discharge power density to 0.41 W/cm$^2$ and the discharge frequency to 60 MHz. These films can be formed continuously only by changing the substrate temperature and switching the reaction gas. The first silicon oxide nitride film is formed so that the internal stress functions as the tensile stress as the substrate is considered as the center. The second silicon oxide nitride film is also provided with the internal stress in the same direction. However, the stress of the second silicon oxide nitride film may be formed so that the absolute value of its internal stress is smaller than that of the first silicon oxide nitride film.

Next, a 50 nm-thick amorphous silicon film is formed by plasma CVD on the underlying layer 1102. Though depending on the hydrogen content, a dehydrogenation heat-treatment is conducted preferably at 400 to 550° C. for several hours. It is preferred to carry out crystallization after the hydrogen content is decreased to 5 atom % or below in this way, a crystallization step is carried out. Though the amorphous silicon film may be formed by other fabrication methods such as sputtering or vacuum deposition, impurity elements contained in the film such as oxygen and nitrogen are preferably lowered sufficiently.

Here, both the underlying layer and the amorphous silicon film are formed here by plasma CVD, and they may be formed continuously in this case in vacuum. If the process step that inhibits the exposure of the underlying film to the atmospheric air after it is formed is employed, surface contamination can be prevented, and variance of performance of the resulting TFTs can be decreased.

The crystallization step of the amorphous silicon film may use known laser annealing or thermal annealing. In this example, a crystalline silicon film is formed by condensing a pulse oscillation type KrF excimer laser beam into a linear shape and radiating it to the amorphous silicon film.

Incidentally, though this example forms the crystalline silicon film from the amorphous silicon film, a microcrystalline silicon film may be used, or a crystalline silicon film may be formed directly.

The crystalline silicon film so formed is patterned using a first photo-mask, giving island semiconductor layers 1103, 1104 and 1105.

Next, a gate insulation film 1106 consisting of silicon oxide or silicon nitride as the principal component is formed in such a fashion as to cover the island semiconductor layers 1103, 1104 and 1105. A silicon nitride oxide film using N$_2$O and SiH$_4$ as the starting materials may be formed by plasma CVD to a thickness of 10 to 200 nm, preferably 50 to 150 nm, as the gate insulation film 1106. The thickness is 100 nm in this example (FIG. 11(A)).

Resist masks 1107, 1108, 1109, 1110 and 1111 are formed using the second photo-mask in such a fashion as to cover the semiconductor layers 1103, and channel formation regions of island semiconductor layers 1104 and 1105. A resist mask 1109 may be formed also on the region in which wiring is to be formed.

A process step for forming the second impurity region is conducted by adding an n-type imparting impurity element. Here, phosphorus is used, and ion doping is conducted with phosphine (PH$_3$). In this process step, the acceleration voltage is set to 65 keV in order to add phosphorus into a semiconductor layer beneath the gate insulation film 1106 through this film. The P concentration added to the semiconductor layer is preferably 1×10$^{16}$ to 1×10$^{19}$ atoms/cm$^3$, and it is 1×10$^{18}$ atoms/cm$^3$ in this case. Regions 1112, 1113, 1114, 1115 and 1116 in which phosphorus is doped are thus formed. A part of the phosphorus-doped regions is to become the second impurity regions that function as the LDD regions (FIG. 11(B)).

Next, the resist mask is removed, and a first conductor layer 1117 is formed on the entire surface. This first conductor layer 1117 uses a conductive material containing the element selected from Ta, Ti, Mo and W as the principal component. The thickness of the first conductor layer 1117 is 100 to 1,000 nm, preferably 150 to 400 nm. Here, the first conductor layer 1117 is formed by sputtering of Ta (FIG. 11(C)).

When the Ta film is used for the first conductor layer, sputtering can be employed. To form the Ta film, Ar is used as the sputtering gas. If a suitable amount of Xe or Kr is added to the sputtering gas, it becomes possible to mitigate the internal stress of the resulting film and to prevent the film from peeling. Resistivity of the α phase Ta film is about 20 μΩcm, and the film can be used for the gate electrode. However, resistivity of the β phase Ta film is about 180 μΩ and the film is not suitable for the gate electrode. Because the TaN film has a crystal structure approximate to the α phase, the α phase Ta film can be easily obtained when the Ta film is formed on the TaN film. Therefore, the TaN film may be formed to a thickness of 10 to 50 nm beneath the first conductor film, though it is not shown in the drawing. Similarly, a phosphorus-doped silicon film can be formed effectively to a thickness of about 2 to about 20 nm beneath the first conductor film, though this silicon film is not shown, either. In this way, it becomes possible to improve adhesion power of the conductor film, to prevent its oxidation and to prevent the diffusion of the alkali metal elements contained in trace amounts in the first or second conductor film into the gate insulation film 1106. In any way, the first conductor film has preferably a resistivity of 10 to 50 μΩcm.

It is further possible to use a W film. In such a case, the W film is formed to a thickness of 200 nm by sputtering that uses W as the target and introduces an argon (Ar) gas and a nitrogen (N$_2$) gas. The W film can be formed by thermal CVD using tungsten hexafluoride (WF$_6$). In order to use it as the gate electrode, its resistance must be lowered. Therefore, the resistivity of the W film is preferably not greater than 20 μΩcm. The resistivity of the W film can be lowered by increasing its crystal grain size. However if large amounts of impurities such as oxygen are contained in the W film, crystallization is impeded and the resistivity becomes high. Therefore, when sputtering is employed, the W film must be formed by using a W target having a purity of 99.9999% while sufficient caution is taken so as not to allow mixing of the impurities from the gaseous phase. A resistivity of 9 to 20 μΩcm can be realized in this way.

Next, the resist masks 1118, 1119, 1120, 1121, 1122 and 1123 are formed using the third photo-mask. The fourth photo-mask is used for forming the gate electrode of the p-channel TFTs, the gate wiring of the CMOS circuit and the pixel area and the gate bus lines. Because the gate electrode of the n-channel TFT is formed in the later process step, the resist masks 1119 and 1123 are formed in such a fashion that the first conductor layer 1117 remains on the entire surface of the semiconductor layer 1104.

The unnecessary portions of the first conductor layer are etched away by drying etching. Etching of Ta is effected using a mixed gas of CF$_4$ and O$_2$. There are thus formed the gate electrode 1124, the gate wirings 1126 and 1128 and the gate bus line 1127.

A process step for adding a p-type imparting impurity element is conducted into a part of the semiconductor layer 1103 where the p-channel TFT is formed, while the resist masks 1118, 1119, 1120, 1121, 1122 and 1123 are left as such. Here, boron is used as the impurity element, and ion doping is conducted using diborane ($B_2H_6$). The acceleration voltage is also 80 keV in this case, and boron is doped in a dose of $2\times10^{20}$ atoms/$cm^3$. There are thus formed the third impurity regions 1130 and 1131 doped with boron in a high concentration as shown in FIG. 12(A).

After the resist mask disposed in the step shown in FIG. 12(A) is removed, resist masks 1124, 1125, 1126, 1127, 1128, 1129 and 1130 are formed afresh using the fourth photo-mask. The fourth photo-mask is for forming the gate electrode of the n-channel TFT, and the gate electrodes 1131, 1132 and 1133 are formed by dry etching. At this time, the gate electrodes 1131, 1132 and 1133 are so formed as to overlap partially with the second impurity regions 1112, 1113, 1114, 1115 and 1116 (FIG. 12(B)).

After the resist mask is completely removed, new resist masks 1135, 1136, 1137, 1138, 1139, 1140 and 1141 are formed. The resist masks 1136, 1139 and 1140 are so formed as to cover the gate electrodes 1131, 1132 and 1133 of the n-channel TFTs and partially the second impurity region. Here, the resist masks 1136, 1139 and 1140 determine the offset amount of the LDD region.

A process step for forming the first impurity region is conducted by adding an n-type imparting impurity element. There are thus formed the first impurity regions 1143 and 1144 to function as the source region and the first impurity regions 1142, 1145 and 1146 to function as the drain region. Here, ion doping is conducted using phosphine ($PH_3$). In order to add phosphorus into the semiconductor layer below the gate insulation film 1106 through this film 1106, the acceleration voltage in this step is set to 80 keV, too. The P concentration in this step is higher than the concentration of the step for adding the n-type imparting first impurity element and is preferably $1\times10^{19}$ to $1\times10^{21}$ atoms/$cm^3$. In this example, it is $1\times10^{20}$ atoms/$cm^3$ (FIG. 12(C)).

After the process steps up to FIG. 12(C) are completed, a process step for forming the first inter-layer insulation films 1147 and 1148 are conducted. First, a silicon nitride film 1147 is formed to a thickness of 50 nm. This silicon nitride film 1147 is formed by plasma CVD. $SiH_4$, $NH_3$ and $N_2$ are introduced at 5 sccm, 40 sccm and 100 sccm, respectively, at a pressure of 0.7 Torr and radio frequency power of 300 W. Subsequently, a silicon oxide film as the first inter-layer insulation film 1148 is formed to a thickness of 950 nm by introducing TEOS at 500 sccm and $O_2$ at 50 sccm, at a pressure of 1 Torr and radio frequency power of 200 W (FIG. 13).

The heat-treatment is then conducted. This heat-treatment is necessary for activating the n- or p-type imparting impurity element added in each concentration. This step may be carried out by thermal annealing using an electric heating furnace, laser annealing using the excimer laser described above, a rapid thermal annealing using a halogen lamp (RTA), and so forth. In this example, the activation step is carried out by thermal annealing. The heat-treatment is done at 300 to 700° C., preferably 350 to 550° C., and at 450° C. in this example, for 2 hours in a nitrogen atmosphere.

The first inter-layer insulation films 1147 and 1148 are thereafter patterned and contact holes reaching the source region and the drain region of each TFT are formed. The source electrodes 1149, 1150 and 1151 and the drain electrodes 1152 and 1153 are formed. This example uses the electrodes each having a three-layered structure comprising a Ti film having a thickness of 100 nm, a Ti-containing Al film having a thickness of 300 nm and a Ti film having a thickness of 150 nm that are formed continuously by sputtering.

As a result of the process steps described above, the channel formation region 1157, the first impurity regions 1160 and 1161 and the second impurity regions 1158 and 1159 are formed in the n-channel TFTs of the CMOS circuit. Here, regions (GOLD regions) 1158a and 1159a overlapping with the gate electrode and regions (LDD regions) 1158b and 1159b not overlapping the gate electrode are formed in the second impurity regions, respectively. The first impurity region 1160 functions as the source region and the first impurity region 1161, as the drain region.

The channel formation region 1154 and the third impurity regions 1155 and 1156 are formed in the p-channel TFTs. The third impurity region 1155 functions as the source region and the third impurity region 1156, as the drain region.

The n-channel TFT of the pixel area has a multi-gate structure, and there are formed the channel formation regions 1162 and 1163, the first impurity regions 1168, 1169 and 1145 and the second impurity regions 1164, 1165, 1166 and 1167. The regions 1164a, 1165a, 1166a and 1167a overlapping with the gate electrode and the regions 1164b, 1165b, 1166b and 1167b not overlapping with the gate electrode are formed in the second impurity regions.

Figure 13:
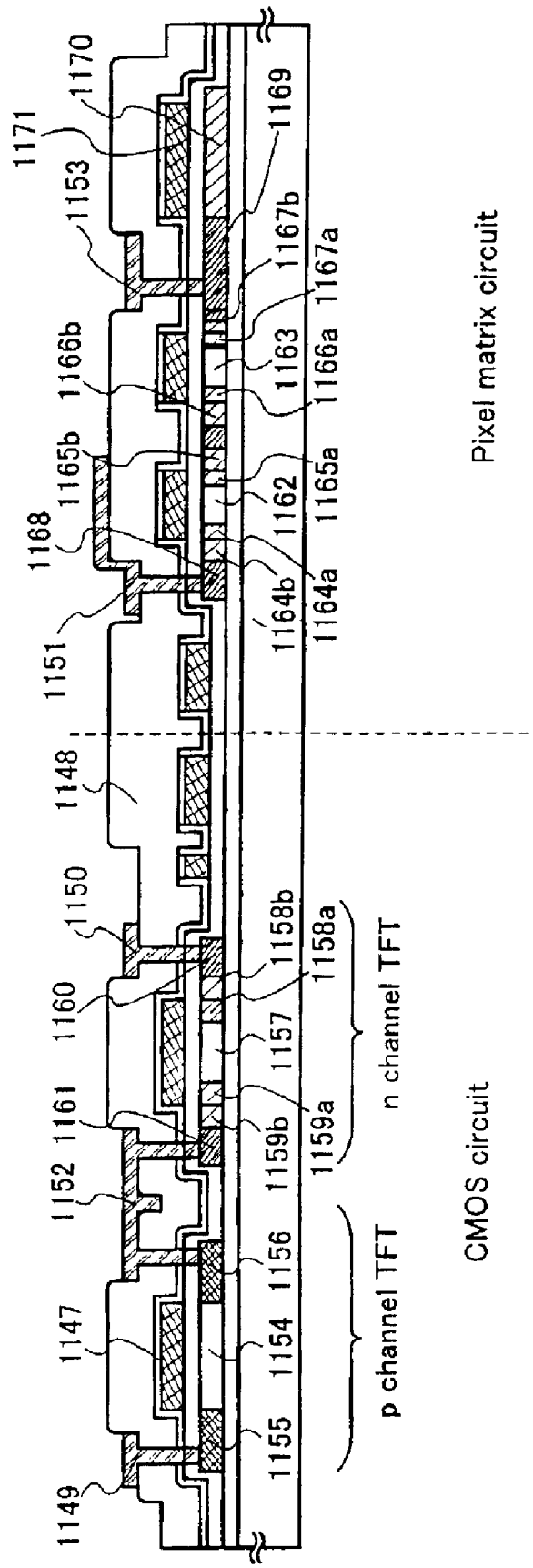
FIG. 13 is a sectional view showing a fabrication process of an active matrix substrate.

In this way, the active matrix substrate having the CMOS circuit and the pixel area formed on the substrate 1101 is formed as shown in FIG. 13. A low concentration impurity region 1170, to which the n-type imparting impurity element is added in the same concentration as the second impurity region, a gate insulation film 1106 and a holding capacitance electrode 1171 are formed on the drain side of the n-channel TFT of the pixel unit. A holding capacitance to be disposed in the pixel unit is formed simultaneously.

Example 2

This example represents the case where the crystalline semiconductor film used as the semiconductor layer in Example 1 is formed by thermal annealing by use of a catalytic element. When the catalytic element is used, the technology described in Japanese Patent Laid-Open Nos. Hei 7-130652(1995) and Hei 8-78329(1996) is preferably employed.

FIG. 18 shows the case where the technology described in Japanese Patent Laid-Open No. Hei 7-130652(1995) is applied to the present invention. First, a silicon oxide film 1802 is deposited to a substrate 1801, and an amorphous silicon film 1803 is formed on this silicon oxide film 1802. Furthermore, a nickel-containing layer 1804 is formed by applying a nickel acetate solution containing 10 ppm of nickel calculated by weight (FIG. 18(A)).

After a dehydrogenation step is carried out at 500° C. for 1 hour, heat-treatment is conducted at 500 to 650° C. for 4 to 12 hours, or at 550° C. for 8 hours, for example, to form a crystalline silicon film 1805. The crystalline silicon film 1805 obtained in this way has extremely excellent crystallinity (FIG. 18(B)).

The technology described in Japanese Patent Laid-Open No. Hei 8-78329(1996) makes it possible to selectively crystallize the amorphous semiconductor film by selectively adding the catalytic element. The application of this technology to the present invention will be explained with reference to FIG. 19.

First, a silicon oxide film 1902 is disposed on a glass substrate 1901, and an amorphous silicon film 1903 and a silicon oxide film 1904 are continuously formed on the silicon oxide film 1902. The thickness of this silicon oxide film 1904 is 150 nm at this time.

Next, the silicon oxide film 1904 is patterned to form selectively each hole portion 1905, and a nickel acetate solution containing 10 ppm of nickel, calculated by weight, is applied. In this way, a nickel-containing layer 1906 is formed. This nickel-containing layer 1906 is brought into contact with the amorphous silicon film 1902 only at the bottom of the hole portion 1905 (FIG. 19(A)).

Heat-treatment is then conducted at 500 to 650° C. for 4 to 24 hours, for example, at 570° C. for 14 hours, to form a crystalline silicon film 1907. During this crystallization process, the portion of the amorphous silicon film keeping contact with nickel is first crystallized, and crystallization proceeds from thence in the lateral direction. The crystalline silicon film 1907 thus formed comprises the aggregate of rod- or needle-like crystals, and each crystal grows with certain specific directivity when watched macroscopically. Therefore, the crystalline silicon film 1907 has the advantage that its crystallinity is uniform (FIG. 19(B)).

The catalytic element that can be used in the two technologies described above includes germanium (Ge), iron (Fe), palladium (Pd), tin (Sn), lead (Pb), cobalt (Co), platinum (Pt), copper (Cu) and gold (Ag) other than nickel (Ni).

The semiconductor layer of the crystalline TFT can be fabricated by first forming the crystalline semiconductor film (inclusive of the crystalline silicon film and the crystalline silicon germanium film) and then conducting patterning in accordance with these technologies. The TFT fabricated from the crystalline silicon film using the technology of this example provides excellent characteristics, and high reliability is required. However, when the TFT structure of the present invention is employed, the TFT making the most of the advantage of this example can now be fabricated.

Example 3

This example represents the case where the crystalline semiconductor film is formed as the initial film using the catalytic element described above to form the amorphous semiconductor film and then removing the catalytic element from the crystalline semiconductor film, as the method of forming the semiconductor layer used in Example 1. This example uses the technologies disclosed in Japanese Patent Laid-Open No. Hei 10-247735(1998), Hei 10-135468(1998) or Hei 10-135469(1998) for forming the semiconductor layer.

The technology described in each reference is the technology for removing the catalytic element used for crystallization of the amorphous semiconductor film by employing the P gettering function after crystallization. This technology makes it possible to reduce the concentration of the catalytic element in the amorphous semiconductor film to not higher than $1\times10^{17}$ atoms/cm$^3$, preferably $1\times10^{16}$ atoms/cm$^3$.

Figure 20A:
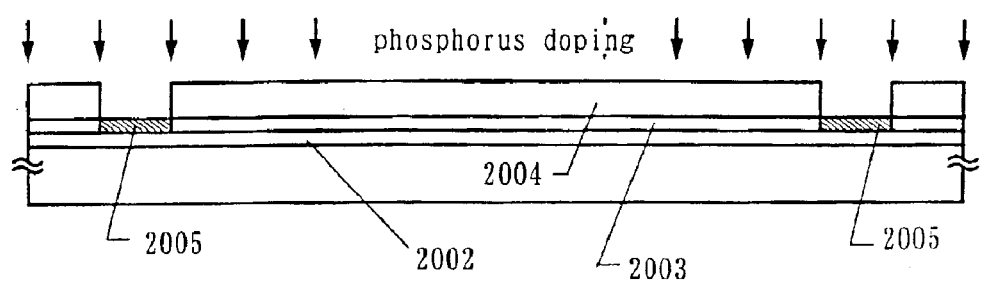
FIGS. 20(A–B) show a fabrication process of the crystalline silicon film.
Figure 20B:
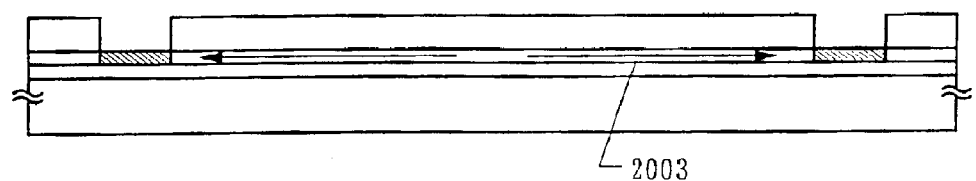

The construction of this example will be explained with reference to FIG. 20. An alkali-free glass substrate typified by a Corning 1737 substrate is used in this example. FIG. 20(A) shows the state where an underlying layer 2002 and a crystalline silicon film 2003 are formed by using the crystallization technology described in Example 3. A silicon oxide film 2004 for masking is formed to a thickness of 150 nm on the surface of the crystalline silicon film 2003. A region in which each hole portion is formed by patterning and the crystalline silicon film is exposed is formed. A process step for adding phosphorus is conducted to give a region 2005 where phosphorus is added to the crystalline silicon film.

When heat-treatment is carried out under this state at 550 to 800° C. for 5 to 24 hours, for example, at 600° C. for 12 hours, in a nitrogen atmosphere., the region 2005 in which P is doped into the crystalline silicon film functions as a gettering site. In consequence, the catalytic element remaining in the crystalline silicon film 2003 can be segregated into the phosphorus-doped region 2005.

The silicon oxide film 2004 for masking and the phosphorus doped region 2005 are etched away by etching. As a result, the crystalline silicon film, in which the concentration of the catalytic element used in the crystallization process is reduced to $1\times10^{17}$ atoms/cm$^3$ or below, can be obtained. This crystalline silicon film can be used as such for the semiconductor layer of the TFT of the present invention illustrated in Example 1.

Example 4

Figure 21A:
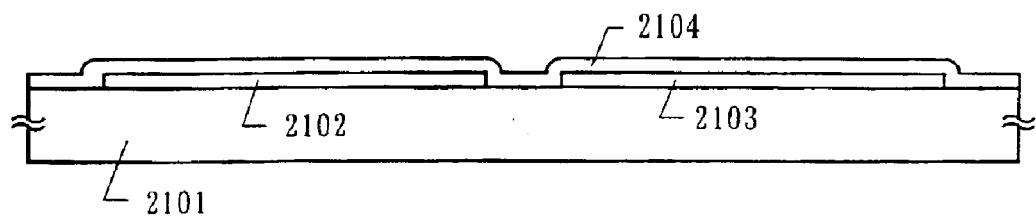
FIGS. 21(A–B) show a fabrication process of the crystalline silicon film.
Figure 21B:
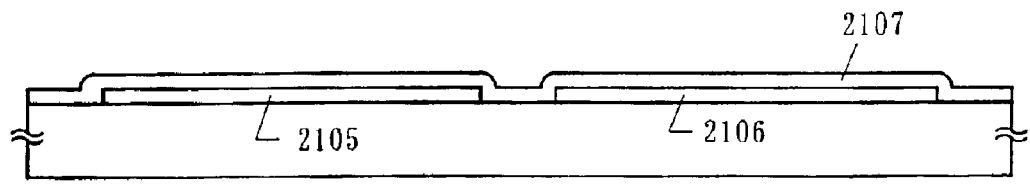

In the fabrication process of the TFT according to the present invention illustrated in Example 1, this example represents another example for forming the semiconductor layer and the gate insulation film. The construction of this example will be explained with reference to FIG. 21.

A substrate having heat-resistance to at least 700 to 1,100° C. is necessary in this example, and a quartz substrate 2101 is used. The crystalline semiconductor is formed using the technology shown in Examples 2 and 3. To obtain the semiconductor layers of the TFT, this semiconductor is patterned into the island shape, giving the semiconductor layers 2102 and 2103. The gate insulation film 2104 is formed in such a fashion as to cover the semiconductor layers 2102 and 2103 by the use of a film consisting of silicon oxide as the principal component. In this example, a silicon nitride oxide film is formed to a thickness of 70 nm by plasma CVD (FIG. 21(A)).

Heat-treatment is conducted in an atmosphere containing a halogen (typically, chlorine) and oxygen. In this example, it is conducted at 950° C. for 30 minutes. Incidentally, the heat-treatment temperature may be selected from the range of 700 to 1,100° C., and the treatment time, from the range of 10 minutes to 8 hours (FIG. 21(B)).

As a result, the thermal oxide film is formed in the interface between the semiconductor layers 2102, 2103 and the gate insulation film 2104, and the gate insulation film 2107 is formed. In the oxidation process in the halogen atmosphere, a metal impurity element among the impurities contained in the gate insulation film 2104 and in the semiconductor layers 2102 and 2103 forms a compound with the halogen, and can be removed into the gaseous phase.

The gate insulation film 2107 formed in the process steps described above has a high dielectric withstand voltage, and the interface between the semiconductor layer 2105, 2106 and the gate insulation film 2107 is extremely excellent. The subsequent process steps for obtaining the TFT construction of the present invention are the same as those of Example 1.

Example 5

Figure 11A:
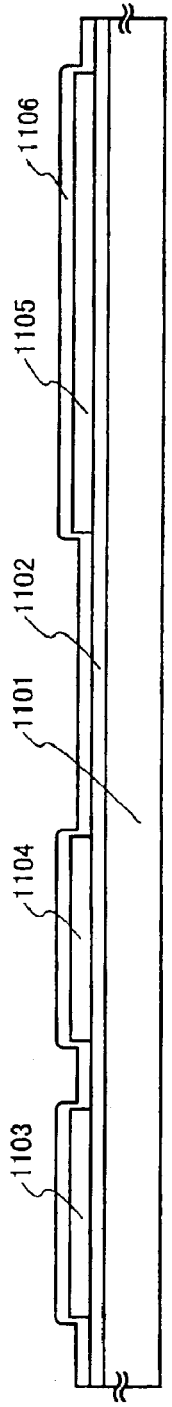
FIGS. 11(A–C) are sectional views showing a fabrication process of an active matrix substrate.
Figure 11B:
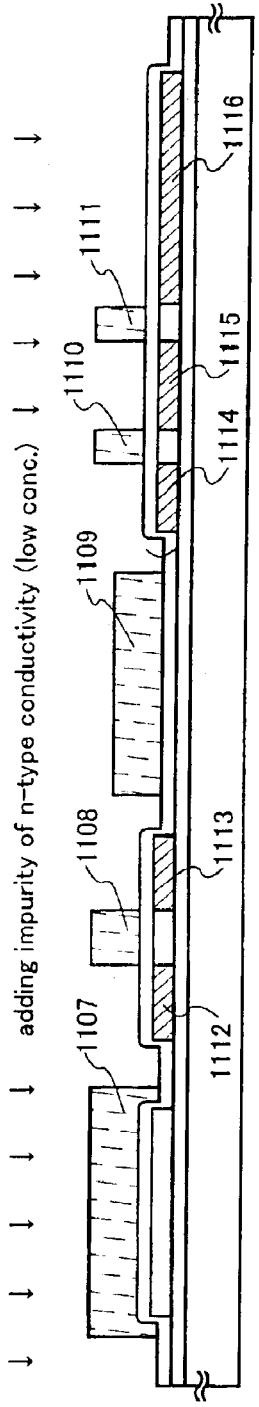
Figure 11C:
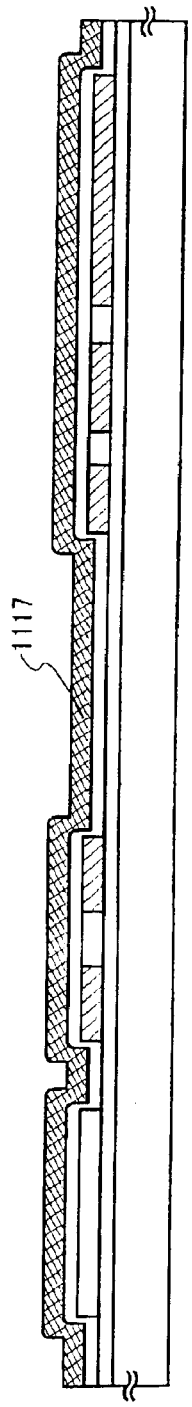

In the fabrication method for forming the crystalline semiconductor film by the method described in Example 2 and the active material substrate by the steps shown in Example 1, this example represents the example where the catalytic element used for the crystallization process is removed by gettering. First, in Example 1, the semiconductor layers 1103, 1104 and 1105 shown in FIG. 11(A) are the crystalline silicon films using the catalytic element. Since the catalytic element used for the crystallization process remains in the semiconductor layer at this time, the gettering process is preferably carried out.

Here, the process step shown in FIG. 12(B) is as such carried out. Then, new resist masks 2201, 1136, 1137, 1138, 1139 and 1140 are formed as shown in FIG. 22. Next, the formation step of the first impurity region is conducted by adding the n-type imparting impurity. There are thus formed the regions 2202, 2203, 1142, 1143, 1144, 1145 and 1146 in which phosphorus is added into the semiconductor layer (FIG. 22(A)).

Boron as the p-type imparting impurity element has been already added to these P-doped regions 2202 and 2203. The P concentration at this time is $1\times10^{19}$ to $1\times10^{21}$ atoms/cm$^3$ and is about ½ of the concentration of boron. Therefore, no influences are observed on the characteristics of the p-channel TFT.

Heat-treatment is carried out under this state at 400 to 800° C. for 1 to 24 hours, for example, at 500° C. for 12 hours, in a nitrogen atmosphere. This step can activate the n- and p-type imparting impurity elements. Furthermore, because the P-doped regions function as the gettering site, the catalytic elements remaining after the crystallization step can be segregated. As a result, the catalytic element can be removed from the channel formation region (FIG. 22(B)).

After the process step in FIG. 22(B) is completed, the subsequent steps are conducted in the same way as those in Example 1, and the active matrix substrate can be fabricated.

Example 6

Figure 14A:
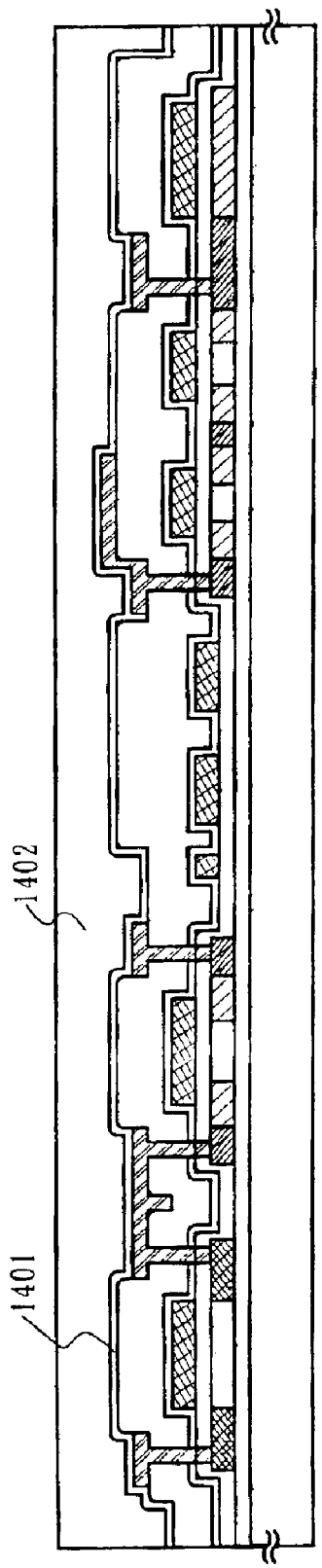
FIGS. 14(A–B) are sectional views showing a fabrication process of a liquid crystal display device.
Figure 14B:
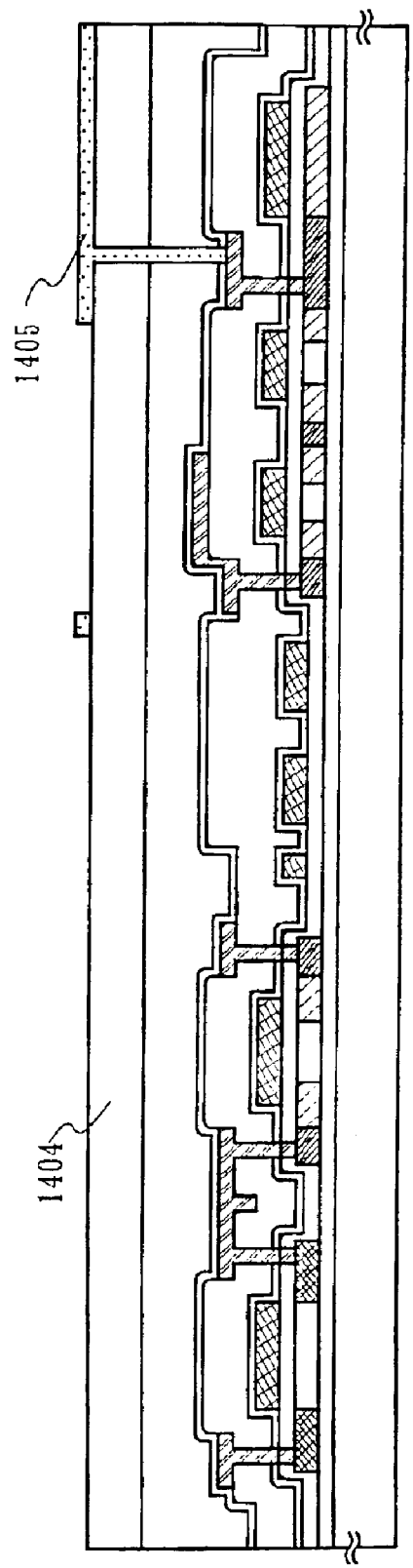

In this example, the process step for fabricating an active matrix liquid crystal display device from the active matrix substrate fabricated in Example 1 will be explained with reference to FIG. 14.

A passivation film 1401 is formed over the active matrix substrate under the state shown in FIG. 13. The passivation film 1401 comprises a silicon nitride film having a thickness of 50 nm. A second inter-layer insulation film 1402 formed of an organic resin is further deposited to a thickness of about 1,000 nm. A polyimide resin, an acrylic resin or a polyimideamide resin can be used for the organic resin film. The organic resin film provides the advantages that the film formation method is simple and easy, the parasitic capacitance can be reduced because its specific dielectric constant is low, and it has high planarity. Organic resin films other than those described above can be used, too. This example uses polyimide of the type that is thermally polymerized after the application to the substrate, and the film is formed by baking at 300° C.

The third inter-layer insulation film is further formed. The third inter-layer insulation film 1404 is composed of an organic resin film such as polyimide. Contact holes reaching the drain electrode 1153 are formed in the third inter-layer insulation film 1404, the second inter-layer insulation film 1402 and the passivation film 1401, and then pixel electrode 1405 is formed. The pixel electrode 1405 uses a transparent conductive film for a transmission type liquid crystal display device, and a metallic film for a reflection type liquid crystal display device. Since this example deals with the transmission type liquid crystal display device, an indium oxide-tin (ITO) film is formed by sputtering to a thickness of 100 nm, giving the pixel electrode 1405.

Figure 15:
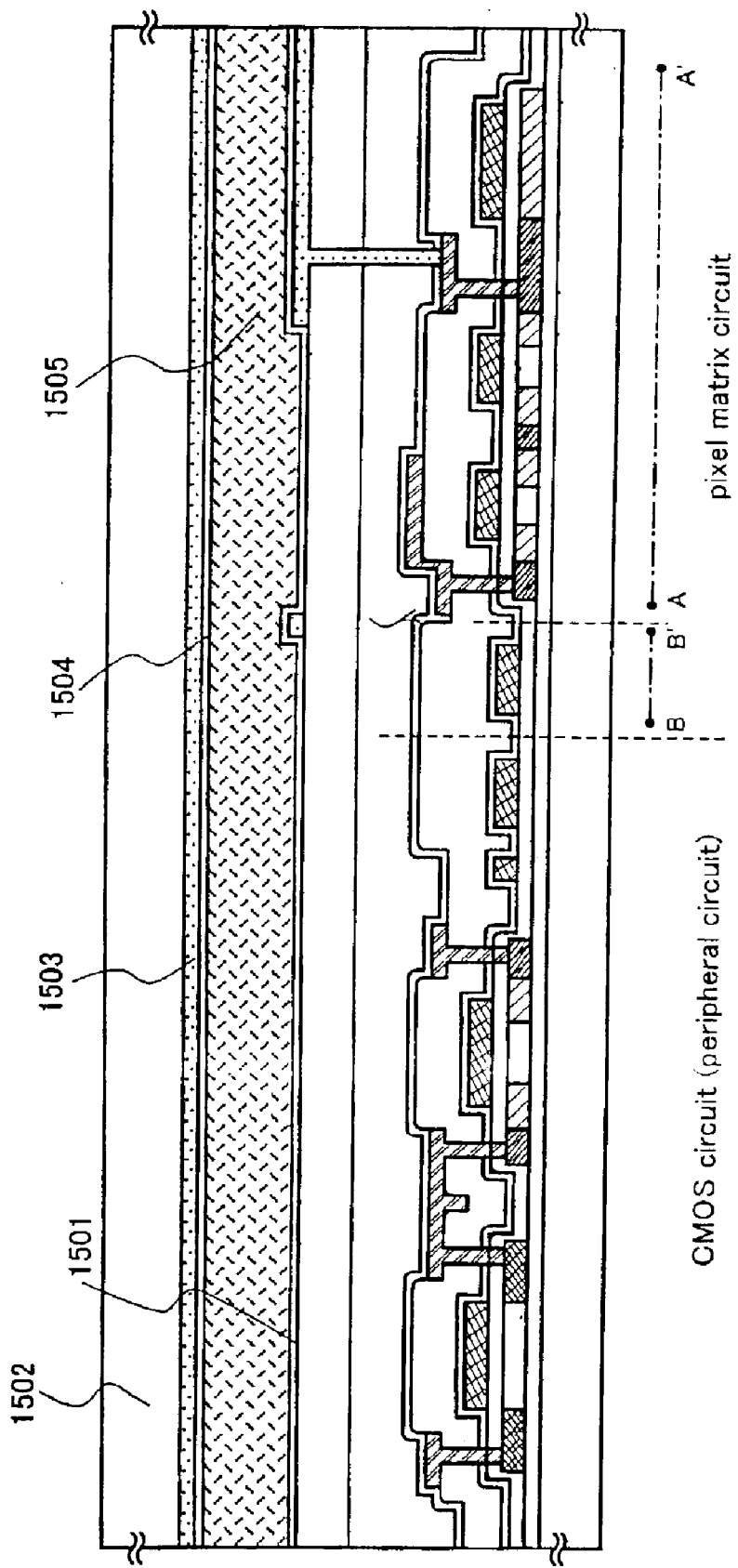
FIG. 15 is a sectional view of a liquid crystal display device.

Next, as shown in FIG. 15, an orientation film 1501 is formed on the surface of the third inter-layer insulation film 1404 and the pixel electrode 1405. Generally, the liquid crystal display device uses a polyimide resin for the orientation film in most cases. A transparent conductive film 1503 and an orientation film 1504 are formed on the substrate 1502 on the opposite side. After the orientation film is formed, it is subjected to rubbing treatment so that the liquid crystal molecules are oriented in parallel with a certain pre-determined pre-tilt angle.

After the above-described process steps are completed, the pixel unit, the active matrix substrate on which the CMOS circuit has been formed and the opposing substrate are bonded through a sealant and spacers (both are not shown) by a known cell assembly step. Thereafter, a liquid crystal material 1505 is injected between both substrates and is completely sealed by a sealant (not shown). The active matrix type liquid crystal display device shown in FIG. 15 is thus completed.

Figure 16:
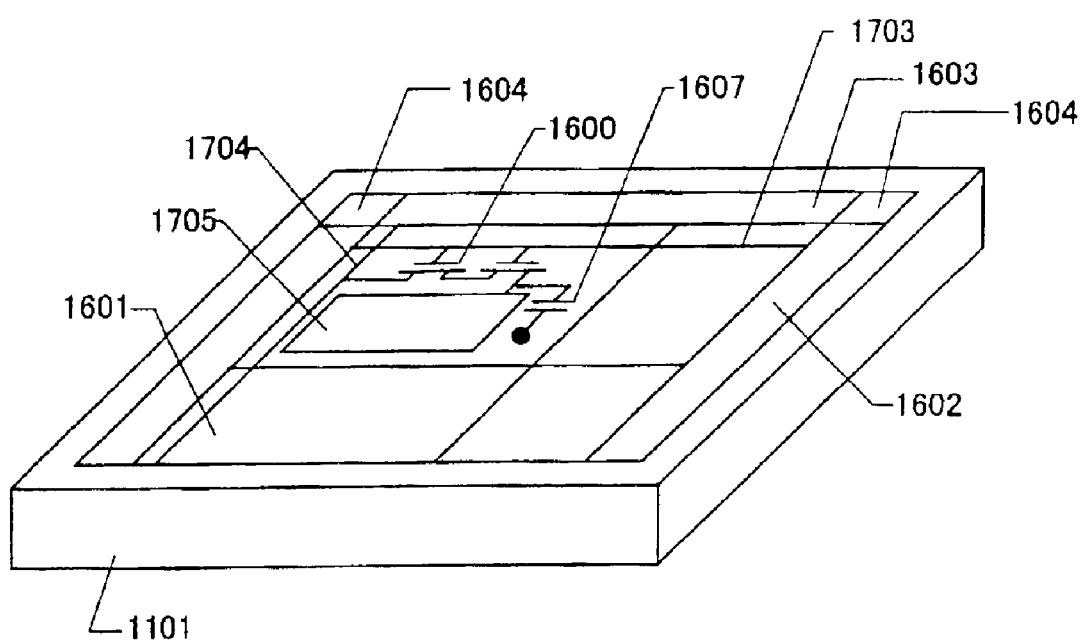
FIG. 16 is a perspective view of an active matrix substrate.

Next, the construction of the active material liquid crystal display device of this example will be explained with reference to FIGS. 16 and 17. FIG. 16 is a perspective view of the active matrix substrate of this example. The active matrix substrate comprises a pixel area 1601 formed on the glass substrate 1101, a scanning (gate) line driving circuit 1603 and a signal (source) line driving circuit 1604. Each pixel TFT 1600 of the pixel area is the n-channel TFT, and the driving circuit round the pixel TFTs basically comprises a CMOS circuit. The scanning (gate) line driving circuit 1603 and the signal (source) line driving circuit 1604 are connected to the pixel area 1601 through the gate wires 1703 and the source wires 1704.

FIG. 17 is a top view of the pixel area 1601, and is substantially a top view of one pixel. The n-channel TFTs are disposed in the pixel area. Each gate electrode 1702 that is formed continuously to the gate wire 1703 crosses the semiconductor layer 1701 therebelow through a gate insulation film, not shown. The source region, the drain region and the first impurity region are formed in the semiconductor layer, though they are not shown in the drawing. A holding capacitance 1707 is constituted by the semiconductor layer, the gate insulation film and the electrode made of the same material as that of the gate electrode, on the drain side of the pixel TFT. The sectional structures taken along a line A–A' and B–B' in FIG. 17 correspond to the sectional view of the pixel unit shown in FIG. 15.

The pixel TFT 1600 in this example has a double-gate structure, but it may be a single gate structure or a multi-gate structure made as triple gate. The structure of the active matrix substrate of this example is not particularly limited to the structure of this example. The feature of the construction of the present invention resides in the structure of the gate electrode, and in the structures of the source region of the semiconductor layer disposed through the gate insulation film, the drain region and other impurity regions. Therefore, constructions other than the construction of the present invention may be appropriately selected and determined.

Example 7

Figure 23:
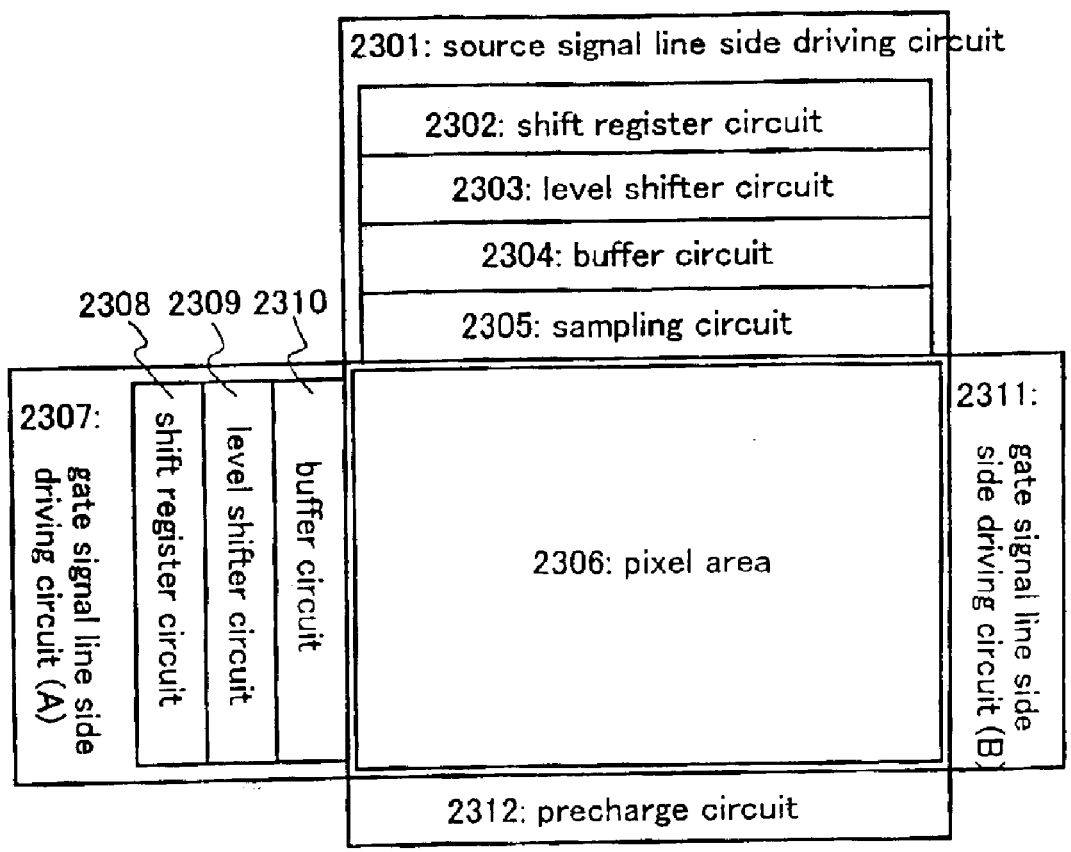
FIG. 23 is a block circuit diagram of an active matrix liquid crystal display device according to one embodiment of the present invention.

FIG. 23 shows an example of the circuit construction of the active matrix type liquid crystal display device shown in Example 6. The active matrix type liquid crystal display device of this example includes a source signal line side driving circuit 2301, a gate signal line side driving circuit (A) 2307, a gate signal line side driving circuit (B) 2311, a pre-charge circuit 2312 and a pixel area 2306.

The source signal line side driving circuit 2301 includes a shift register circuit 2302, a level shifter circuit 2303, a buffer circuit 2304 and a sampling circuit 2305.

The gate signal line side driving circuit (A) 2307 includes a shift register circuit 2308, a level shifter circuit 2309 and a buffer circuit 2310. The gate signal line side driving circuit (B) 2311 has a similar construction.

An example of the driving voltage of each of these circuits are such that the shift register circuits 2302 and 2308 have a voltage of 10 to 16 V. The driving voltage of each of the level shifter circuits 2303 and 2309, the buffer circuits 2304 and 2310, the sampling circuit 2305 and the pixel area 2306 is 14 to 16 V. The voltage of the sampling circuit 2305 and the pixel unit 2306 is the amplitude of the voltage, and the voltages the polarity of which is inverted are generally applied alternately.

It is easy according to the present invention to make the lengths of the second impurity regions functioning as the LDD region different in consideration of the driving voltage of the n-channel TFTs, and to fabricate the optimum shape for the TFTs constituting each TFT in the same process step.

FIG. 24(A) shows a structural example of the TFT of the shift register circuit. The n-channel TFT of the shift register circuit is of the single gate type, and the second impurity region to function as the LDD region is disposed only on the drain side. Here, the length of the LDD region (GOLD region) 206a overlapping with the gate electrode and the length of the LDD region 206b not overlapping with the gate electrode may be the length shown in FIG. 26, for example. They can be formed to a length of 2.0 μm for 206a and 1.0 μm for 206b, for example.

FIG. 24(B) shows a structural example of the TFTs of the level shifter circuit and the buffer circuit. The n-channel TFTs of these circuits are of the double-gate type, and the second impurity regions to function as the LDD regions are disposed on the drain side. The length of the LDD regions (GOLD regions) 205a and 205c overlapping with the gate electrode is 2.5 μm, for example, and the length of the LDD regions 205b and 205d not overlapping with the gate electrode is 2.5 μm, for example.

FIG. 24(C) shows a structural example of the TFTs of the sampling circuit. The n-channel TFTs of this circuit are of the single gate type. Because the polarity is inverted, however, the second impurity regions to function as the LDD regions are disposed on both sides of the source and drain sides. The lengths of the LDD regions (GOLD regions) 205a and 206a overlapping with the gate electrode are preferably equal to each other, and the lengths of the LDD regions 205b and 206b not overlapping with the gate electrode are preferably equal to each other. The length of the LDD regions (GOLD regions) 205a and 206a is 1.5 μm, for example, and the lengths of the LDD regions 205b and 206b not overlapping with the gate electrode are 1.0 μm, for example.

FIG. 24(D) shows a structural example of the pixel area. The n-channel TFT of this circuit is of the multi-gate type, and because the polarity is inverted, the second impurity regions to function as the LDD region are disposed on both of the source and drain sides. For example, the length of the LDD regions (GOLD regions) 205a, 205b, 206a and 206c overlapping with the gate electrode may have a length of 1.5 μm, and the length of the LDD regions 206b and 206d not overlapping with gate electrode is 1.5 μm.

Example 8

This example represents a semiconductor device incorporating the active matrix type liquid crystal display device using the TFT circuit according to the present invention. The explanation will be given with reference to FIGS. 25, 33 and 34.

Examples of such a semiconductor device include mobile information terminals (electronic notebook, mobile computer, cellular telephone, etc.), video cameras, still cameras, personal computers, television sets, and so forth. Examples of such devices are shown in FIGS. 25, 33 and 34.

Figure 25A:
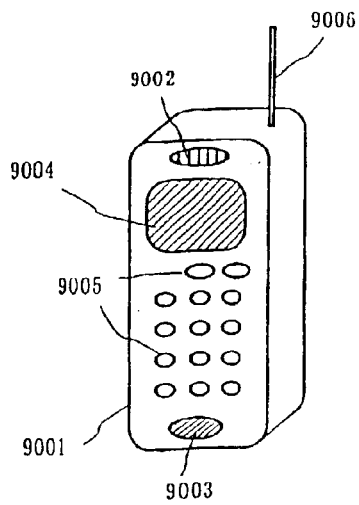
FIGS. 25(A–E) are perspective views showing examples of a semiconductor device.

FIG. 25(A) shows the cellular telephone, that comprises a main body 9001, a sound output unit 9002, a sound input unit 9003, a display device 9004, an operation switch 9005 and an antenna 9006. The present invention can be applied to the display device 9004 equipped with the sound output unit 9002, the sound input unit 9003 and the active matrix substrate.

Figure 25B:
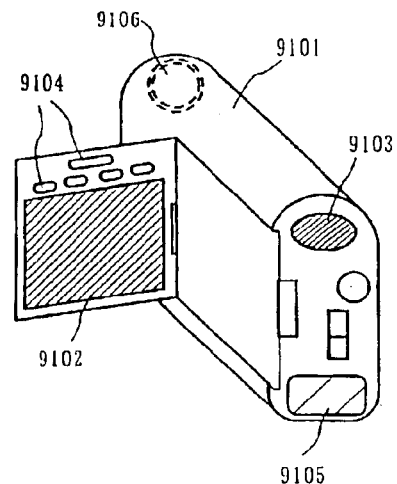

FIG. 25(B) shows the video camera, that comprises a main body 9101, a display device 9102, a sound input unit 9103, an operation switch 9104, a battery 9105 and an image reception unit 9106. The present invention can be applied to the display device 9102 equipped with the active matrix substrate, the sound input unit 9103 and to the image reception unit 9106.

Figure 25C:
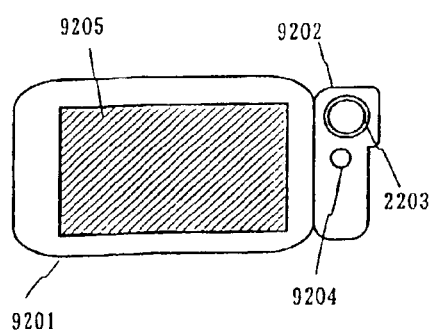

FIG. 25(C) shows the mobile computer, that comprises a main body 9201, a camera unit 9202, an image reception unit 9203, an operation switch 9204 and a display device 9205. The present invention can be applied to the display device 9205 equipped with the image reception unit 9203 and the active matrix substrate.

Figure 25D:
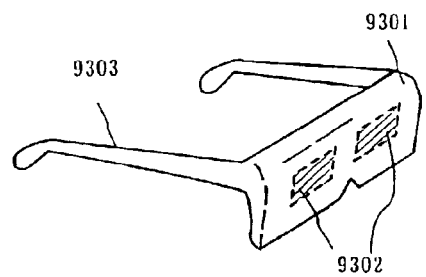

FIG. 25(D) shows a head-mount display, that comprises a main body 9301, a display device 9302 and an arm unit 9303. The present invention can be applied to the display device 9302. The present invention can be applied also to other signal control circuits, though not shown in the drawings.

Figure 25E:
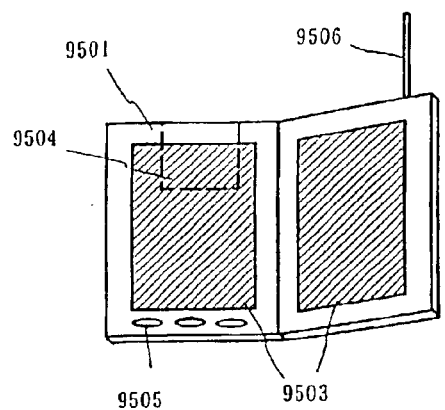

FIG. 25(E) shows a portable book, that comprises a main body 9501, display devices 9502 and 9503, a storage medium 9504, an operation switch 9505 and an antenna 9506. This portable book displays the data stored in a mini-disk (MD) or a DVD and the data received through the antenna. The display devices 9502 and 9503 are direct view type display devices, and the present invention can be applied likewise to them.

Figure 33A:
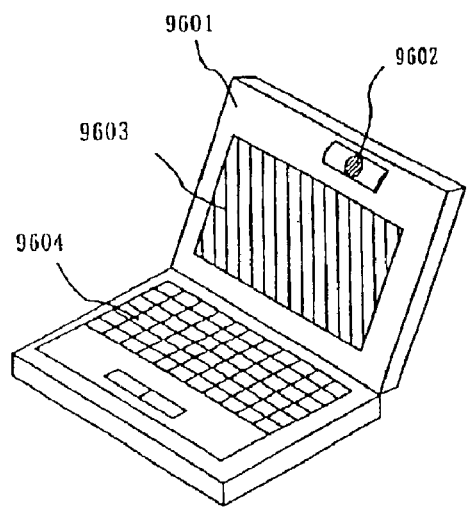
FIGS. 33(A–C) are perspective views showing examples of a semiconductor device.

FIG. 33(A) shows the personal computer, that comprises a main body 9601, an image input unit 9602, a display device 9603 and a keyboard 9604.

Figure 33B:
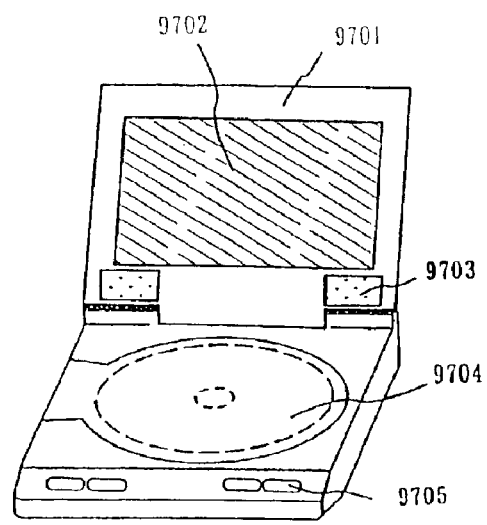

FIG. 33(B) shows a player using a recording medium recording a program thereon (hereinafter called the "recording medium"), that comprises a main body 9701, a display device 9702, a speaker unit 9703, a recording medium 9704 and an operation switch 9705. Incidentally, this device uses a DVD (Digital Versatile Disk), a CD, or the like, as the recording medium, and can enjoy listening to music, movies, games, etc., and can make an Internet communication.

Figure 33C:
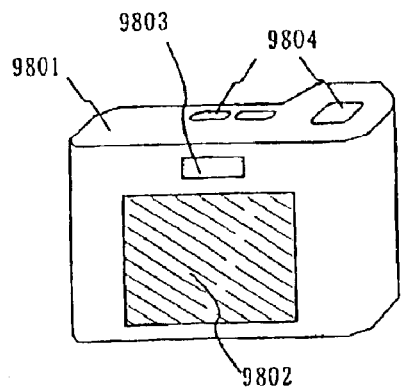

FIG. 33(C) shows a digital camera, that comprises a main body 9801, a display device 9802, a viewing portion 9803, an operation switch 9804 and an image reception unit (not shown).

Figure 34A:
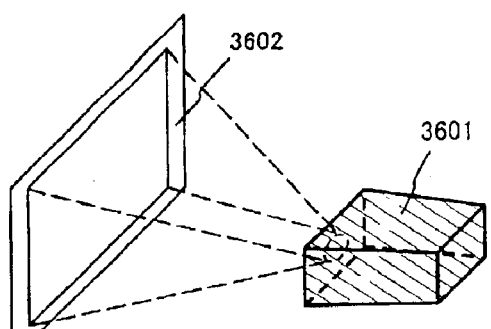
FIGS. 34(A–D) are perspective views showing examples of a semiconductor device.

FIG. 34(A) shows a front type projector, that comprises a display device 3601 and a screen 3602. This invention can be applied to the display device and other signal control circuits.

Figure 34B:
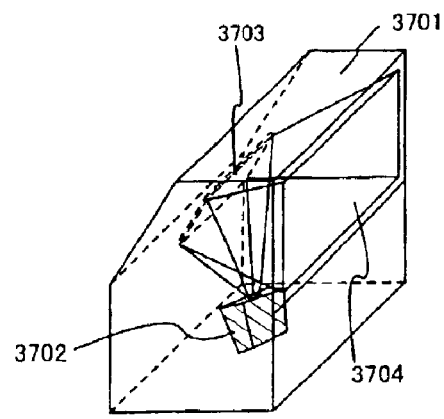

FIG. 34(B) shows a rear type projector, that comprises a main body 3701, a display device 3702, a mirror 3703 and a screen 3704. The present invention can be applied to the display device and other signal control circuits.

Figure 34C:
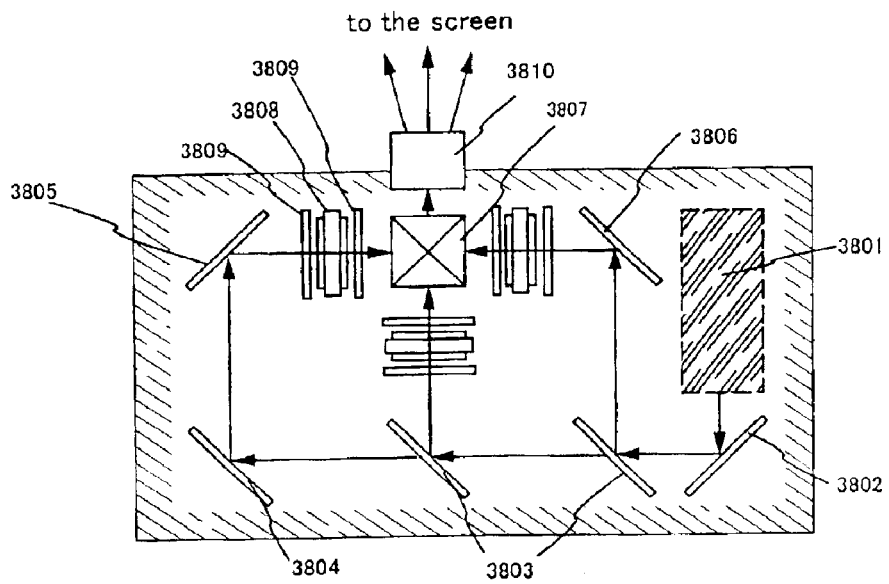

Incidentally, FIG. 34(C) shows an example of the construction of the display devices 3601 and 3702 shown in FIGS. 34(A) and 34(B). Each display device 3601, 3702 comprises a light source optical system 3801, mirrors 3802 and 3804 through 3806, a dichroic mirror 3803, a prism 3807, a liquid crystal display device 3808, a phase difference plate 3809 and a projection optical system 3810. It comprises an optical system including the projection optical system 3810 and a projection lens. Though this example represents an example of a three-plate system, the present invention is not particularly limited thereto. For example, a single plate type may also be used. Incidentally, an operator can appropriately insert an optical system such as an optical lens, a film having a polarization function, a film for adjusting the phase difference, an IR film, and so forth, into the optical path represented by arrows shown in FIG. 34(C).

Figure 34D:
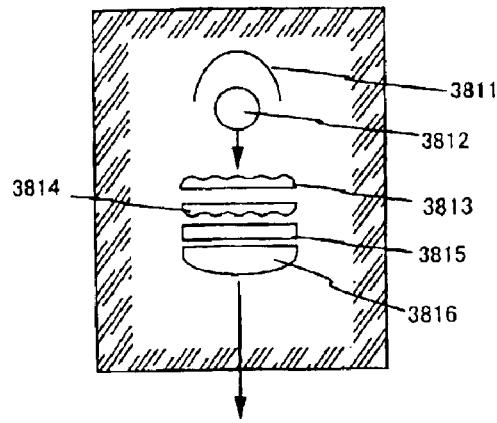

FIG. 34(D) shows a structural example of the light source optical system 3810 in FIG. 34(C). In this example, the optical system 3810 comprises a reflector 3811, a light source 3812, lens arrays 3813 and 3814, a polarization conversion element 3815 and a condenser lens 3816. Incidentally, the light source optical system shown in FIG. 34(D) is merely illustrative but in no way restrictive. For example, the operator may appropriately insert an optical system such as an optical lens, a film having a polarization function, a film for adjusting the phase difference, an IR film, and so forth. Additionally, the present invention can be applied to image sensors and EL type display devices. As described above, the application range of the present invention is extremely broad, and the invention can be applied to electronic appliances of all fields.

Example 9

This example explains the example where EL (electroluminescence) display panel (also called the "EL display device") is fabricated using the present invention.

Figure 27A:
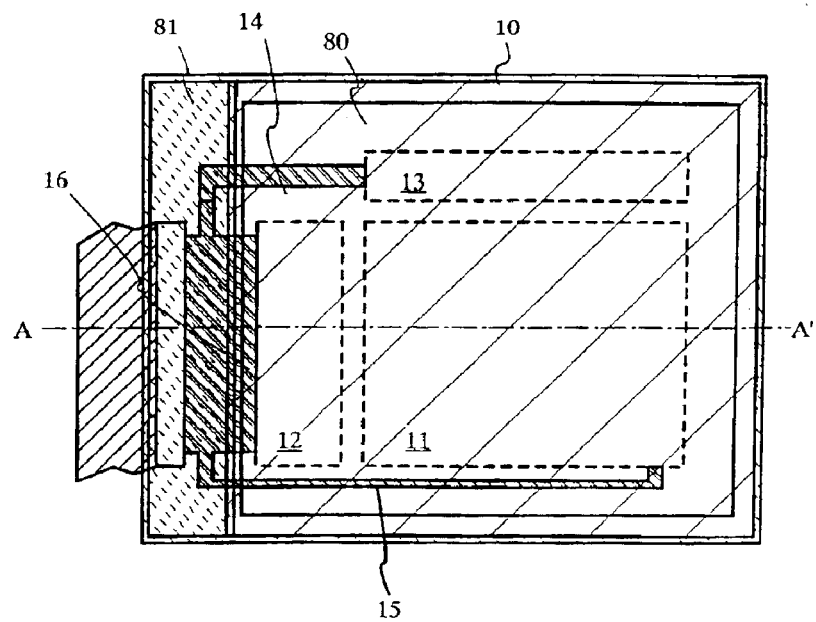
FIGS. 27(A–B) are top views and sectional views each showing the construction of an EL display device.

FIG. 27(A) is a top view of the EL display panel using the present invention. In FIG. 27(A), reference numeral 10 denotes a substrate, 11 denotes a pixel area, 12 denotes a data line side driving circuit and 13 denotes a scanning side driving circuit. These driving circuits reach an FPC 17 through cables 14 to 16 and are connected to an external appliance.

In this instance, a seal material 19 is disposed in such a fashion as to encompass at least the pixel area, preferably the driving circuits and the pixel unit. These members are then sealed by an opposing plate 80. The opposing plate 80 may use a glass plate or a plastic plate. An adhesive 81 is disposed further outside the seal material 19, firmly bonds the substrate 10 to the opposing plate 80 and prevents the corrosion of the internal devices by the moisture entering from the bond end face. In this way, a sealed space is defined between the substrate 10 and the opposing plate 80. The EL device is completely sealed in the sealed space at this time and is completely cut off from the external air.

A seal resin 83 is further charged between the substrate 10 and the opposing plate 80. An organic resin material selected from a silicone type, an epoxy type, an acrylic type and a phenol type is used for the seal resin 83. Consequently, the organic resin material improves the effect of preventing degradation due to the moisture or the like of the EL device.

Figure 27B:
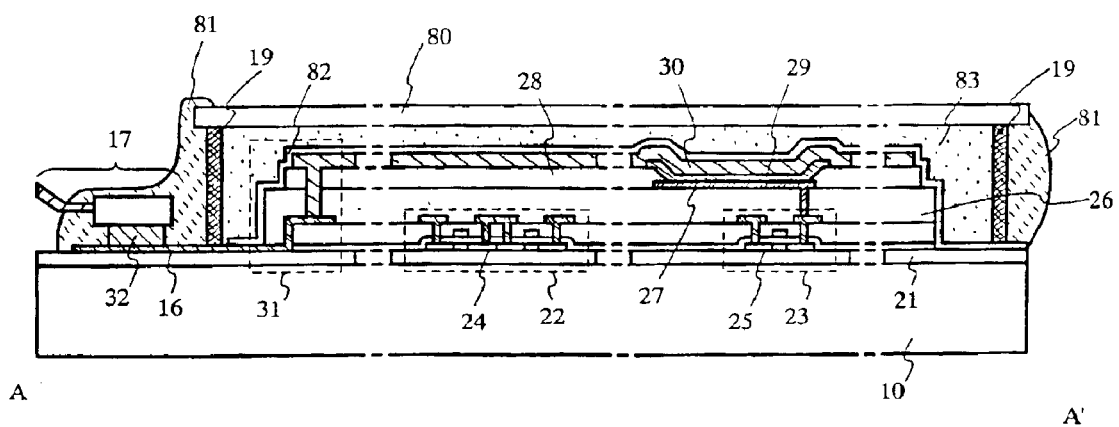

FIG. 27(B) shows the sectional structure of the EL display panel according to this example. Over the substrate 10 and the underlying film 21 are formed a driving circuit TFT 22 (a CMOS circuit comprising the combination of the n-channel TFT and the p-channel TFT is shown in this drawing) and a pixel area TFT 23 (only a TFT for controlling the current to the EL device is shown in this drawing). The n-channel TFT for the driving circuit or the p-channel TFT for the driving circuit shown in Example 1 may be used for the driving circuit TFT 22. The n-channel TFT or the p-channel TFT shown in FIG. 2 may be used for the pixel unit TFT 23.

After the driving circuit TFT 22 and the pixel unit TFT 23 are completed in accordance with the present invention, a pixel electrode 27 is formed on an inter-layer insulation film (planarization film) 26 made of a resin material. This pixel electrode 27 comprises a transparent conductor film to be electrically connected to the drain of the pixel unit TFT 23. A compound between indium oxide and tin oxide (called "ITO") or a compound between indium oxide and zinc oxide may be used for the transparent conductor film. After the pixel film 27 is formed, the insulation film 28 is formed and an opening is formed on the pixel electrode 27.

Next, an EL layer 29 is formed. The EL layer 29 may be constituted to a laminate structure or a single-layer structure by combining freely known EL materials (positive hole injection layer, positive hole transportation layer, light emitting layer, electron transportation layer or electron injection layer). Which structure is to be obtained may be determined by known technologies. The EL materials include low molecular weight materials and polymer materials. Vacuum deposition is employed when the low molecular weight materials are used, and a simple method such as spin coating, printing or ink jetting can be used when the polymer materials can be used.

In this example, the EL layer is formed by vacuum deposition using a shadow mask. Color display becomes feasible when the light emitting layers (red emitting layer, green emitting layer and blue emitting layer) capable of emitting the rays of light having a different color for each pixel are formed using the shadow mask. Additionally, either of a system comprising the combination of a color conversion layer (CCM) with color filters, a system comprising the combination of a white emitting layer with the color filters may be used as well. Needless to say, an EL display device of monochromatic emission can be constituted.

After the EL layer 29 is formed, a cathode 30 is formed on the EL layer 29. The moisture and oxygen that exist in the interface between the cathode 30 and the EL layer 29 are preferably eliminated as much as possible. Therefore, the EL layer 29 and the cathode 30 are continuously formed into the films in vacuum, or after the EL layer 29 is formed in an inert atmosphere, the cathode 30 is then formed without releasing the inert atmosphere. This example uses a film formation apparatus of a multi-chamber type (cluster tool system) and can conduct such film formation.

This example uses a laminate structure of a LiF (lithium fluoride) film and an Al (aluminum) film for the cathode 30. More concretely, a 1 nm-thick LiF (lithium fluoride) film is formed by vacuum deposition on the EL layer 29, and a 300 nm-thick aluminum film is formed on the LiF film. Needless to say, a MgAg electrode as a known cathode material may be used. The cathode 30 is connected to a cable 16 in a region represented by reference numeral 31. The cable 16 is a power supply line for applying a predetermined voltage to the cathode 30, and is connected to the FPC 17 through a conductive paste material 32.

In order to connect electrically the cathode 30 to the cable 16 in the region 31, contact holes must be formed in the inter-layer insulation film 26 and in the insulation film 28. The contact holes may be formed at the time of etching of the inter-layer insulation film 26 (at the time of the formation of the contact hole for the pixel electrode) and at the time of etching of the insulation film 28 (at the time of formation of the opening before the formation of the EL layer). When the insulation film 28 is etched, etching must be made collectively to the inter-layer insulation film 26. In this case, the shape of the contact holes becomes satisfactory if the inter-layer insulation film 26 and the insulation film 28 are made of the same resin material.

The cable 16 is electrically connected to the FPC 17 through the space between the seal 19 and the substrate 10 (which space is closed by the adhesive 81). Incidentally, though the explanation is given on the cable 16 here, other cables 14 and 15, too, are electrically connected likewise to the FPC 17 through and below the sealing material 18.

Figure 28:
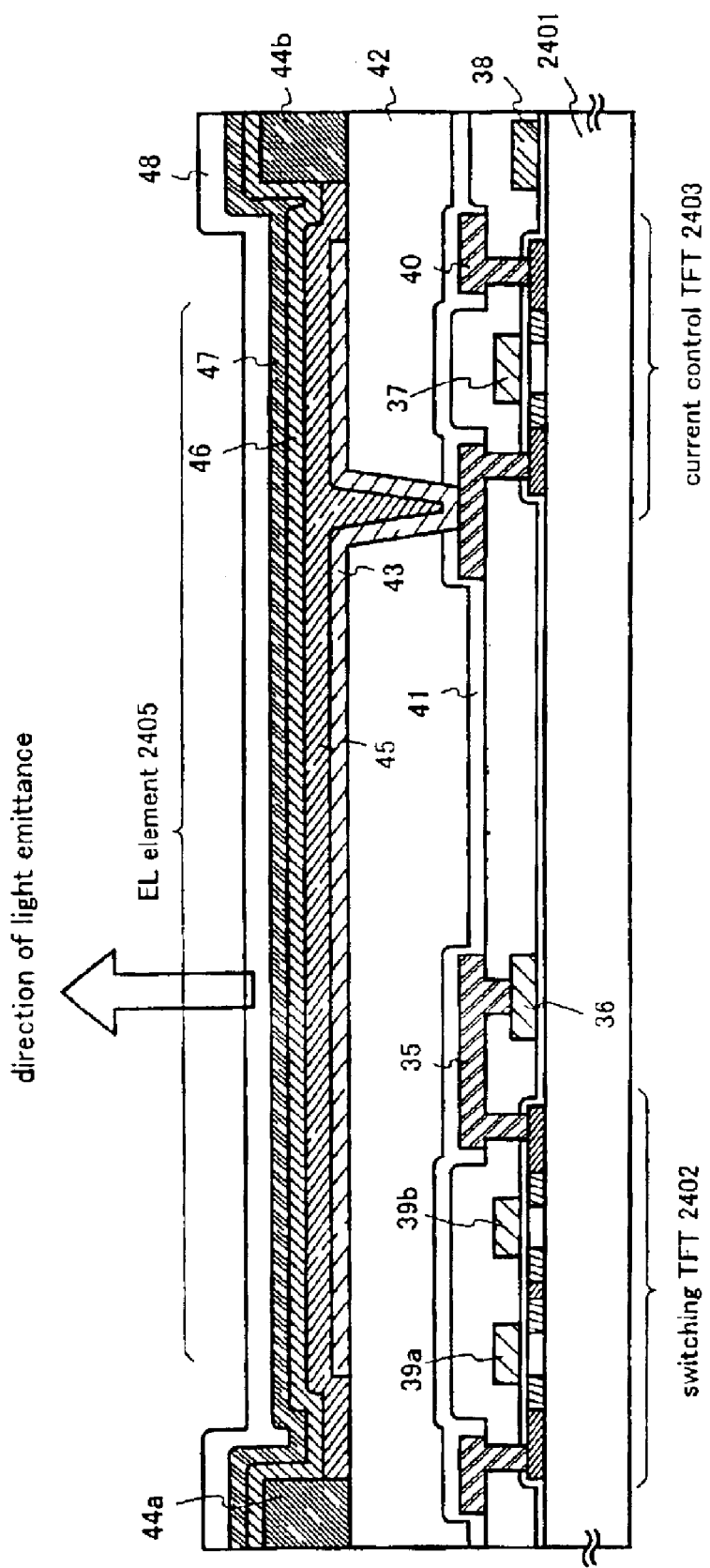
FIG. 28 is a sectional view of a pixel area of the EL display device.
Figure 29A:
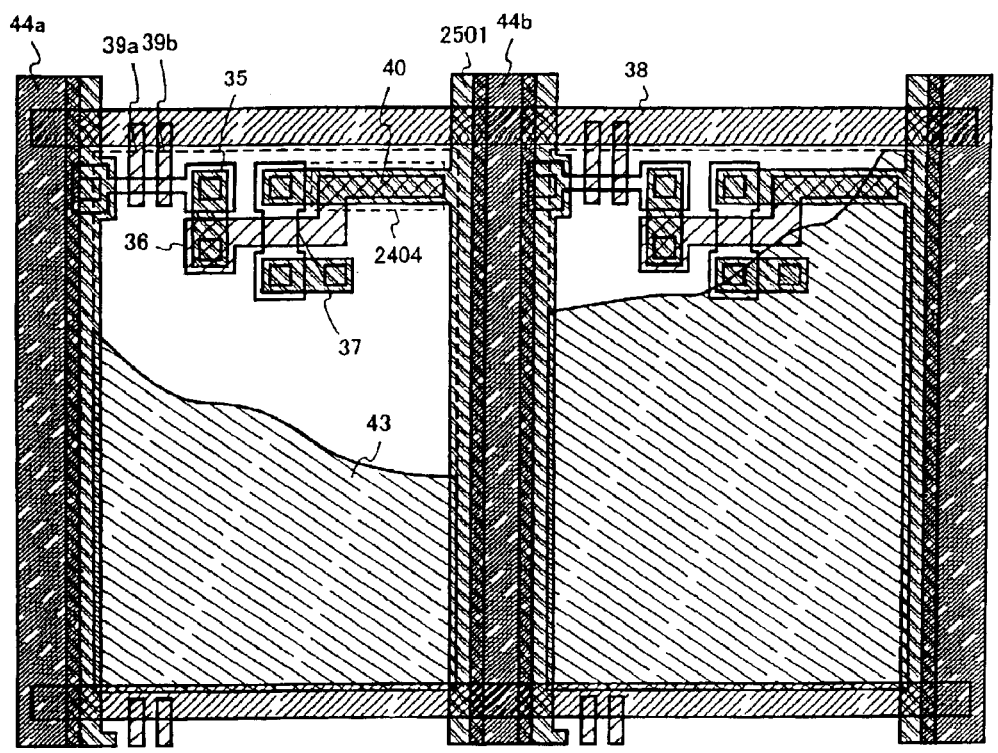
FIGS. 29(A–B) is a top view and a circuit diagram of the pixel area of the EL display device.
Figure 29B:
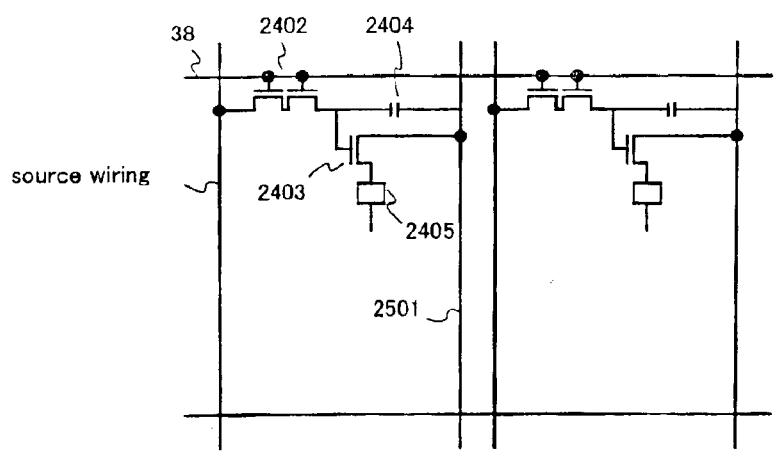

The present invention can be used for the EL display panel having the construction described above. FIG. 28 shows a further detailed sectional structure of the pixel unit and FIG. 29(A) shows its top structure. FIG. 29(B) shows its circuit diagram. Since common reference numerals are used in FIGS. 28, 29(A) and 29(B), cross-reference is to be made among these drawings.

In FIG. 28, the switching TFT 2402 disposed over the substrate 2401 is fabricated using the n-channel TFT of the present invention (TFT shown in FIG. 2 in Embodiment 1, for example). Though it has the double-gate structure in this example, the explanation is omitted because great differences do not exist in the structure and the fabrication process. However, because the two TFTs are virtually connected in series on account of the double-gate structure, the OFF current value can be reduced advantageously. Though this example uses the double-gate structure, the single gate structure or the multi-gate structure having a greater number of gates may be used, too. Alternatively, the TFT may be fabricated using the p-channel TFT of the present invention.

The current control TFT 2403 is fabricated using the n-channel TFT of the present invention. At this time, the drain wiring 35 of the switching TFT 2402 is electrically connected by a cable 36 to the gate electrode 37 of the current control TFT. The wiring represented by reference numeral 38 denotes the gate wiring that connects the gate electrodes 39a and 39b of the switching TFT.

At this time, it is of utmost importance that the current control TFT 2403 has the structure of the present invention. Since the current control TFT is the device that controls the amount of the current flowing through the EL device, a large current flows through it, and the danger of its degradation due to heat and hot carrier is high. Therefore, the construction of the present invention, in which the LDD region is disposed on the drain side of the current control TFT in such a fashion as to overlap with the gate electrode through the gate insulation film, is extremely effective.

Though the current control TFT 2403 is shown as having the single gate structure in the drawing in this example, a multi-gate structure formed by connecting a plurality of TFTs in series may be used, too. Furthermore, it is possible to employ the construction in which a plurality of TFTs are connected in parallel so as to divide substantially the channel formation region into a plurality of regions and heat radiation is effected highly efficiently. Such a construction is effective as a counter measure for the degradation resulting from heat.

As shown in FIG. 29(A), the wiring to serve as the gate electrode 37 of the current control TFT 2403 overlaps with the drain wiring 40 of the current control TFT 2403 through the insulation film in the region represented by reference numeral 2404. At this time, a capacitor is formed in the region 2404. This capacitor 2404 functions as a capacitor for holding the voltage applied to the gate of the current control TFT 2403. Incidentally, the drain wiring 40 is connected to the current supply line (power source line) 2501, and a constant voltage is always applied to the capacitor.

A first passivation film 41 is disposed on the switching TFT 2402 and on the current control TFT 2403, and a planarization film 42 comprising a resin insulation film is formed on the passivation film 41. It is extremely important to planarize the altitude difference resulting from the TFTs by using the planarization film 42. Since the EL layer to be formed later is extremely thin, any altitude difference might invite an emission defect. Therefore, planarization is preferably carried out before the formation of the pixel electrodes so that the surface of the EL layer is as planar as possible.

Reference numeral 43 denotes the pixel electrode (cathode of the EL device) comprising a conductive film having a high reflecting property. It is electrically connected to the drain of the current control TFT 2403. A conductor film having a low resistance such as an aluminum alloy film, a copper alloy film or a silver alloy film, or their laminate film, is preferably used for the pixel electrode 43. A laminate structure with other conductor films may naturally be used, too.

A light emitting layer 44 is formed inside a trench (corresponding to the pixel) defined by banks 44a and 44b made of an insulation film (preferably, a resin). Though the drawing shows only one pixel, the light emitting layers may be formed dividedly in such a fashion as to correspond to R (red), G (green) and B (blue). A conjugate polymer material is used as the organic EL material to form the light emitting layer. Typical examples of the polymer materials include poly-paraphenylene vinylene (PPV), polyvinylcarbazole (PVK) and polyfluorene.

Various types are available for the PPV type organic EL materials, and it is possible to use the materials described in H. Shenk, H. Becker, O. Gelsen, E. Kluge, W. Kreuder and H. Spreitzer "Polymers for Light Emitting Diodes", Euro Display, Proceedings, 1999, p. 33–37, and in Japanese Patent Laid-Open No. Hei 10-92576(1998).

More concretely, it is possible to use cyano-polyphenylene vinylene for the red emitting layer, polyphenylene vinylene for the green emitting layer and polyphenylene vinylene or polyalkylphenylene for the blue emitting layer. The film thickness is 30 to 150 nm (preferably 40 to 100 nm).

However, the explanation given above represents an example of the organic EL material that can be used as the light emitting layer, and is not at all restrictive. In other words, the EL layer (layer for emitting light and for moving the carriers for light emission) may be formed by combining freely the light emitting layers, the charge transportation layer or the charge injection layer.

Though this example uses the polymer type materials for the light emitting layer, the low molecular weight organic EL materials may be used, too. Furthermore, inorganic materials such as silicon carbide can be used for the charge transportation layer and the charge injection layer. Known materials can be used for these organic EL materials and the inorganic materials.

This example employs the EL layer of the laminate structure in which a positive hole injection layer 46 composed of PEDOT (polythiophene) or PAni (polyaniline) is disposed on the light emitting layer 45. An anode 47 comprising a transparent conductor film is disposed on the positive injection layer 46. In this example, the rays of light generated by the light emitting layer 45 is radiated towards the upper surface side (above the TFT). Therefore, the anode must be light transmissible. A compound between indium oxide and tin oxide or a compound between indium oxide and zinc oxide can be used for the transparent conductor film. However, because the transparent conductor film is formed after the light emitting layer having low heat resistance and the positive hole injection layer are formed, it is preferably the film that can be formed at a temperature as low as possible.

The EL device 2405 is completed at the point when the anode 47 is completed. Incidentally, the term "EL device 2405" used here represents the capacitor constituted by the pixel electrode (cathode) 43, the light emitting layer 45, the positive hole injection layer 46 and the anode 47. As shown in FIG. 29(A), the pixel electrode 43 has an area substantially corresponding to that of the pixel. Therefore, the pixel functions as the EL device as a whole. It has therefore extremely high utilization of light emission and can display a bright image.

Incidentally, the second passivation film 48 is disposed further on the anode 47. A silicon nitride film or a silicon nitride oxide film is preferred for the second passivation film 48. The second passivation film 48 is directed to cut off the EL device from outside. In other words, it prevents degradation of the organic EL material due to its oxidation and degassing from the organic EL material. Consequently, reliability of the EL display device can be improved.

As described above, the EL display panel according to the present invention includes the pixel unit comprising the pixels having the structure shown in FIG. 28, the switching TFTs having a sufficiently low OFF current value and the current control TFTs highly resistant to the hot carrier injection. Therefore, the present invention can obtain the EL display panel having high reliability and capable of displaying excellent images.

Incidentally, the construction of this example can be executed by combining it freely with the constructions of Embodiments 1 to 6 and Examples 1 to 6. In addition, the EL display panel of this example can be used effectively for the display unit of the electronic appliances of Example 10.

Example 10

In this example, the explanation will be given on the structure obtained by inverting the structure of the EL device 2405 in the pixel area shown in Example 9. This explanation will be made with reference to FIG. 30. Incidentally, since the difference of this construction from the construction shown in FIG. 29(A) resides only in the EL device portion and the current control TFT, the explanation of other portions will be omitted.

Figure 30:
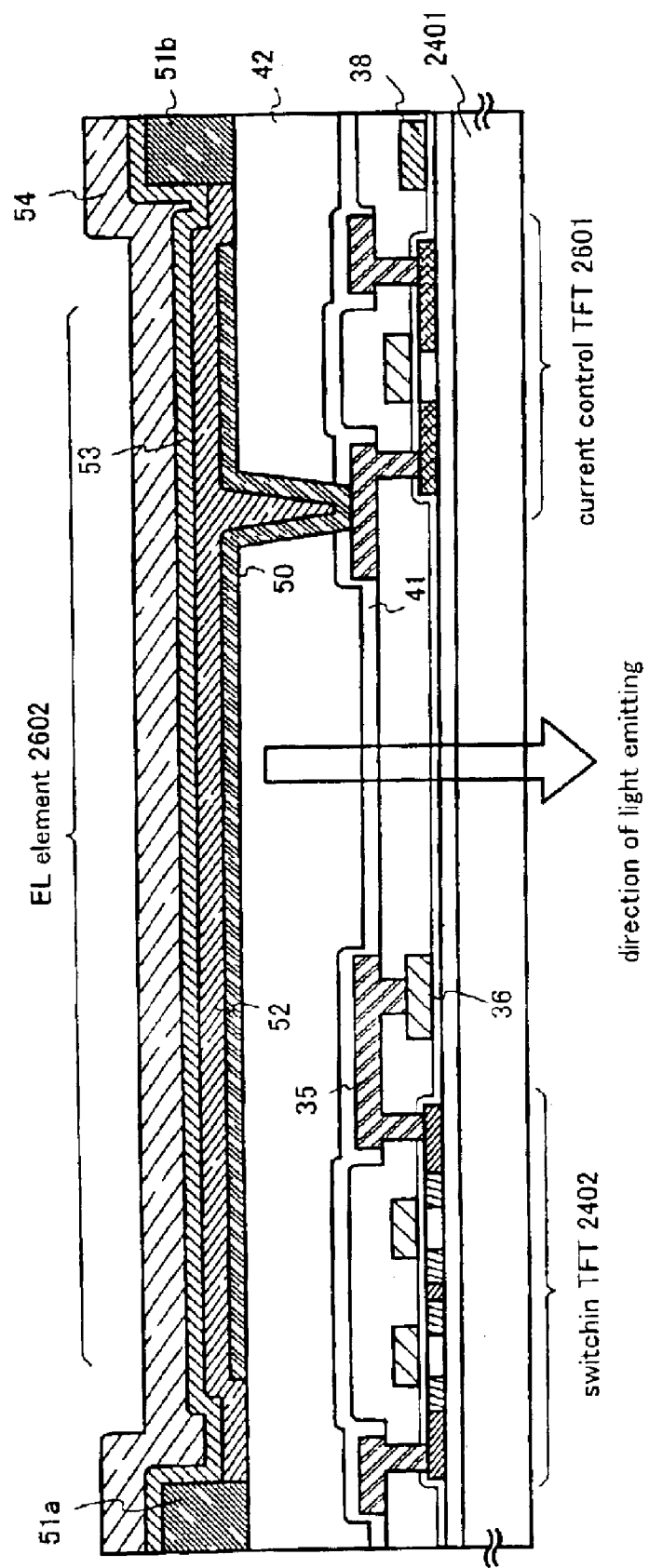
FIG. 30 is a sectional view of the pixel area of the EL display device.

In FIG. 30, the current control TFT 2601 is fabricated using the p-channel TFT of the present invention. The fabrication process is the same as that of Example 1.

In this example, the pixel electrode (anode) 50 uses a transparent conductor film. More concretely, a conductor film composed of a compound between indium oxide and zinc oxide is used. Needless to say, a conductor film composed of indium oxide and tin oxide may be used, too.

After the banks 51a and 51b comprising the insulation film are formed, the light emitting layer 52 made of polyvinylcarbazole is formed by the application of a solution. The electron injection layer 53 composed of potassium acetylacetonate (hereinafter called "acacK") and the cathode 54 composed of an aluminum alloy are formed on the light emitting layer 52. In this case, the cathode 54 functions also as the passivation film. In this way, the EL device 2602 is formed.

In this example, the rays of light emitted from the light emitting layer 53 are radiated towards the substrate over which the TFTs are formed as indicated by an arrow. In the case of the construction of this example, the current control TFT 2601 comprises preferably the p-channel TFT.

The construction of this example can be executed by combining it freely with the constructions of Embodiments 1 to 6 and Examples 1 to 6. The EL display panel of this example can be applied effectively to the display unit of the electronic appliance of Example 8.

Example 11

As shown in FIG. 31, the pixel in this example has a different structure from the structure shown in the circuit diagram of FIG. 29(B). Reference numeral 2701 denotes the source wiring of the switching TFT 2702, reference numeral 2703 denotes the gate wiring of the switching TFT 2702, reference numeral 2704 denotes the current control TFT, reference numeral 2705 denotes the capacitor, reference numerals 2706 and 2708 denote the current supply lines and reference numeral 2707 denotes the EL device.

Figure 31A:
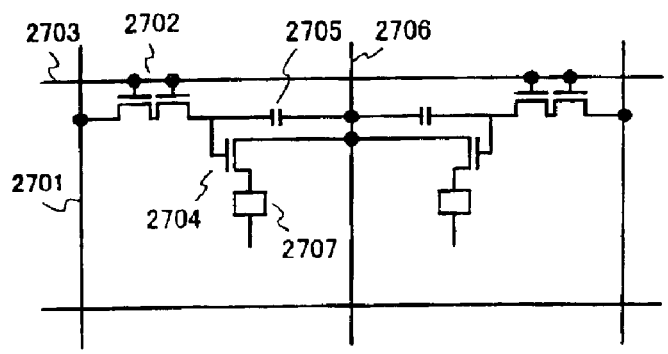
FIGS. 31(A–C) are circuit diagrams of the pixel area of the EL display device.

FIG. 31(A) shows an example where the current supply line 2706 is used in common between two pixels. In other words, this structure is characterized in that the two pixels have line symmetry with the current supply line 2706 as the center. In this case, since the number of the current supply lines can be decreased, the pixel unit can be constituted into a higher precision configuration.

Figure 31B:
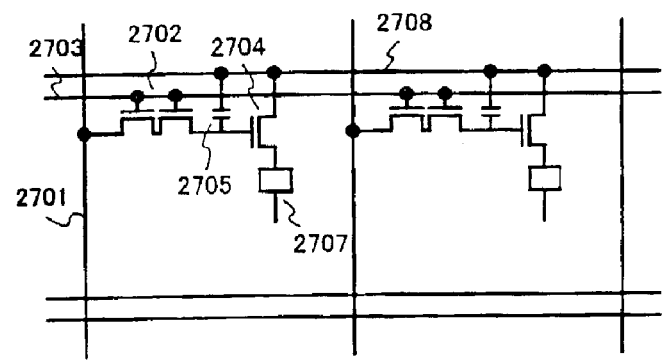

FIG. 31(B) shows an example where the current supply line 2708 is disposed in parallel with the gate wiring 2703. Incidentally, the current supply line 2708 is shown disposed in such a manner as not to overlap with the gate wiring 2703 in FIG. 31(B), and they may be disposed in such a fashion as to overlap with each other through an insulation film if they are formed in different layers. In such a case, the current supply line 2708 and the gate wiring 2703 can share the exclusive occupying area. Therefore, the pixel unit can be constituted into a higher precision configuration.

Figure 31C:
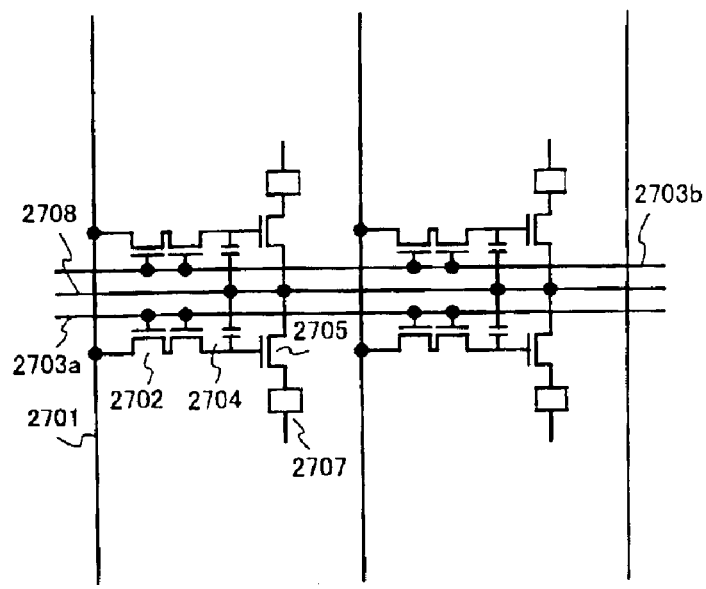

The structure shown in FIG. 31(C) is characterized in that the current supply line 2708 is disposed in parallel with the gate wiring 2703 in the same way as in FIG. 31(B). Furthermore, the two pixels are disposed in such a fashion as to have line symmetry with the current supply line 2708 as the center. It is also effective to dispose the current supply line 2708 in such a fashion as to overlap with either one of the gate wirings 2703. In this case, since the number of the current supply lines can be decreased, the pixel unit can be constituted into a higher precision configuration.

The construction of this example can be executed by combining it freely with the construction of Example 11 or 12. The EL display panel having the pixel structure of this example can be applied effectively to the display unit of the electronic appliances of Example 10.

Example 12

Example 11 disposes a capacitor 2404 in order to hold the voltage applied to the gate of the current control TFT shown in FIGS. 29(A) and 29(B). However, this capacitor 2404 can be omitted.

Since the n-channel TFT of the present invention shown in FIG. 28 is used as the current control TFT 2403 in Example 11, this structure includes the LDD region so disposed as to overlap with the gate electrode through the gate insulation film. The parasitic capacitance called the "gate capacitance" is generally formed in this overlapping region, and this example is characterized in that it utilizes positively the parasitic capacitance as the substitute for the capacitor 2404.

Since the capacitance of this parasitic capacitance varies with the overlapping area between the gate electrode and the LDD region, the capacitance can be determined by the length of the LDD region contained in the overlapping region.

The capacitor 2705 can be omitted from the structures shown in FIGS. 31(A) to (C).

The construction of this example can be applied by combining it freely with the constructions of Embodiments 1 to 6 and Examples 1 to 6. The EL display panel having the pixel structure of this example can be applied effectively to the display unit of the electronic appliances shown in Example 10.

Example 13

Various liquid crystals can be used for the liquid crystal display device shown in Example 7 besides the nematic liquid crystal display device shown in Example 7. For example, it is possible to use the liquid crystals described in 1998, SID, "Characteristics and Driving Scheme of Polymer-Stabilized Mono-stable FLCD Exhibiting Fast Response Time and High Contrast Ratio with Gray-Scale Capability" by H. Furue et al., 1997 SID DIGEST, 841, "A Full-Color Thresholdless Antiferroelectric LCD Exhibiting Wide Viewing Angle with Fast Response Time" by T. Yoshida et al., 1996 J. Mater. Chem. 6(4), 671–673, "Thresholdless antiferroelectricity in liquid crystals and its application to displays" by S. Inui et al., and U.S. Pat. No. 5,594,569 Specification.

Figure 32:
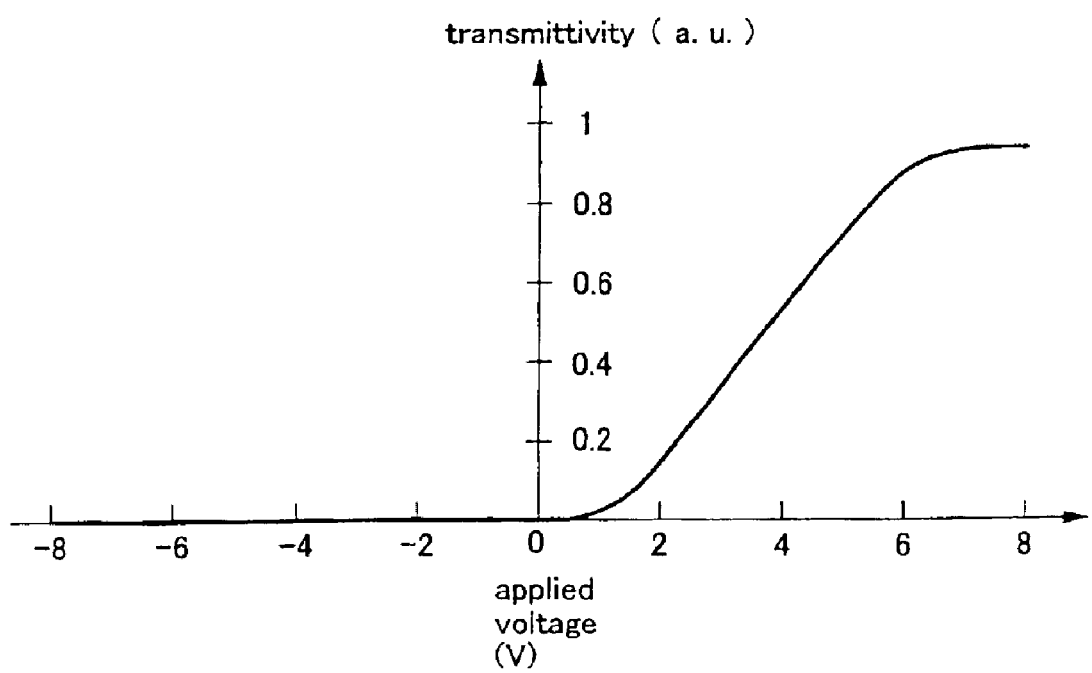
FIG. 32 is a graph showing an example of light transmission characteristics of an anti-ferromagnetic mixed liquid crystal.

FIG. 32 shows the electro-optical characteristics of a mono-stable FLC when the phase transition of the cholesteric phase-chiral smectic phase C is generated using a ferroelectric liquid crystal (FLC) exhibiting an isotropic-cholesteric-chiral smectic phase transition series while a DC voltage is being applied, and a corn edge is brought substantially into conformity with a rubbing direction. The display mode by the ferroelectric liquid crystal shown in FIG. 32 is referred to as the "Half-V Shape Switching Mode". In the graph shown in FIG. 32, the ordinate represents transmissivity (arbitrary unit) and the abscissa does the impressed voltage. For the detail of the "Half-V Shape Switching Mode FLCD", refer to No. 46 Preceedings of Associated Conference of Society of Applied Physics, March, 1999, p. 1316 and Yoshihara et al., "Time Division Full-Color LCD using Ferroelectric Liquid Crystal", Liquid Crystal, Vol. 3, No. 3, p. 190.

It can be seen from FIG. 32 that when such a ferroelectric mixed liquid crystal is used, gradation display becomes feasible from low voltage driving. The liquid crystal display device according to the present invention can also use ferroelectric liquid crystal exhibiting such electro-optical characteristics.

Those liquid crystals which exhibit an antiferroelectric phase in a certain temperature zone are referred to as "antiferroelectric liquid crystal (AFLC)". Some of the mixed liquid crystals containing the antiferroelectric liquid crystal are called "thresholdless antiferroelectric mixed liquid crystals" exhibiting the electro-optical response characteristics the transmissivity of which changes continuously with respect to the electric field. The thresholdless antiferroelectrtic mixed liquid crystals exhibit so-called "V shape" type electro-optical response characteristics, and some have a driving voltage of about ±2.5 V (with cell thickness of 1 to 2 µm).

Generally, the thresholdless antiferroelectric mixed liquid crystal has great spontaneous polarization and has a high dielectric constant of the liquid crystal itself. Therefore, when the thresholdless antiferroelectric mixed liquid crystal is used for the liquid crystal display device, a relatively large holding capacitance is necessary for the pixel. Therefore, it is preferred to use the thresholdless antiferroelectric mixed liquid crystal having small spontaneous polarization.

Low voltage driving can be achieved by applying such a thresholdless antiferroelectric mixed liquid crystal to the liquid crystal display device of the present invention. In consequence, lower power consumption can be accomplished.

Example 14

Stability of the TFTs described in Embodiments 1 to 9 and Examples 1 to 5 is evaluated by a DC bias stress test. This test is conducted by setting the drain voltage (Vd) to a constant voltage of 1 V, and by applying a predetermined voltage for one minute to the gate. The changes of the drain currents before and after the test and field effect mobility are examined. The voltage applied to the gate is changed from 0 to 7 V. When the TFTs undergo degradation due to the hot carrier effect, the various characteristics such as the ON current and field effect mobility get deteriorated in this test. The TFTs used for the measurement have a channel length of 8 µm and a channel width of 8 µm. The LDD has the structure in which Lov is set to 2 µm and Loff is set to 1.5 µm.

Figure 35:
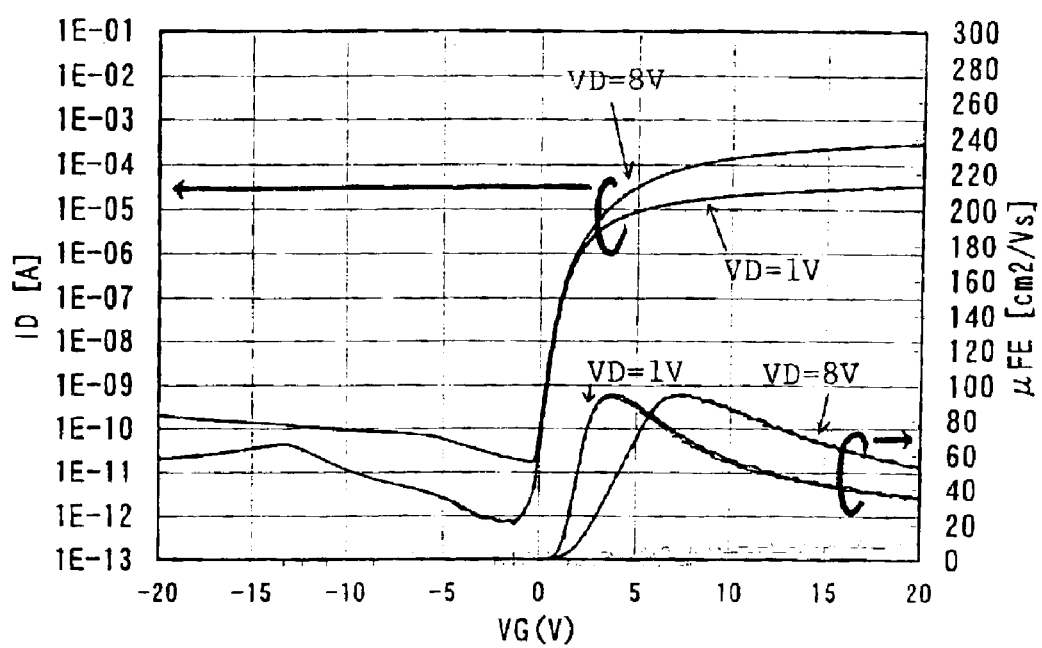
FIG. 35 is a graph showing gate voltage (Vg)-v-drain current (Id) characteristics.

FIG. 35 shows the gate voltage (Vg)-v-drain current (Id) characteristics of the n-channel TFTs having the construction described above (Sample No. S665-14). The drain voltages represent the values measured at the impressed voltages of 1 V and 8 V. The characteristic values shown in FIG. 35 are typical values. As such characteristics, the TFTs according to the present invention have field effect mobility of 90 to 300 $cm^2/V \cdot sec$ and the drain current (current at application of Vd=1 V and Vg=1 V) of $1 \times 10^{-5}$ to $1 \times 10^{-3}$ A.

Figure 36A:
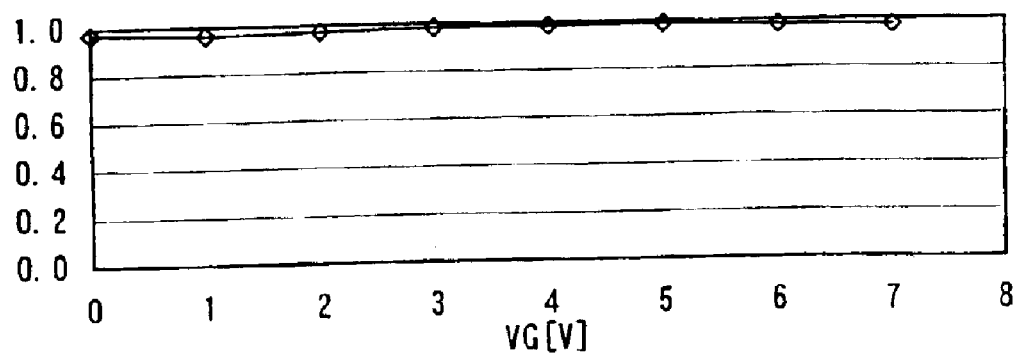
FIGS. 36(A–B) are graphs showing the result of a DC bias stress test.
Figure 36B:
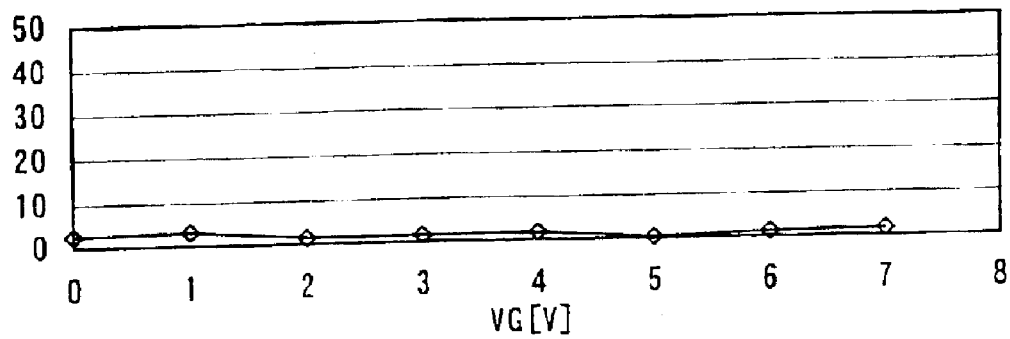

FIG. 36 shows the results of the DC bias stress test described above, and shows the change ratio of the drain current (at application of Vd=1 V) to the gate bias and the change ratio of field effect mobility (maximum value) to the gate bias. FIG. 36(A) shows the result of the drain current. It can be seen that the drain current hardly changes. FIG. 36(B) shows the result of field effect mobility and shows its maximum value. The change ratio is not greater than 5%. In any way, the TFTs exhibit extremely high stability, and the graph shows that degradation due to the hot carrier effect does not exist.

As shown in FIG. 35, the drain current in the OFF region (OFF current) is not higher than $1 \times 10^{-9}$ A when the voltage applied to the gate is within the range of 0 to −20 V, and such a low value can be attained only when Loff is provided.

As described above, it has been confirmed that when the LDD region (second impurity region) is constituted by the region overlapping with the gate electrode and the region not overlapping with the same in the TFT, degradation due to the hot carrier effect can be prevented, and the drain current of the OFF region can be reduced.

[Effect of the Invention]

The stable crystalline TFT operation can be obtained according to the present invention. As a result, the present invention can improve reliability of the semiconductor devices containing the CMOS circuit fabricated by the crystalline TFTs, or concretely speaking, the pixel unit of the liquid crystal display device and the driving circuit disposed round the pixel unit, and the liquid crystal display device capable of being used for an extended period of time can be obtained.

According to the present invention, it becomes easier to fabricate and adjust the length of the region (GOLD region)

overlapping with the gate electrode and the region (LDD region) not overlapping with the gate electrode in the second impurity regions formed between the channel formation region of the n-channel TFT and the drain region. More concretely, it is also possible to decide the length of the region (GOLD region) overlapping with the gate electrode and the length of the region (LDD region) not overlapping with the gate electrode in the second impurity region in accordance with the driving voltage of the TFT. This makes it possible to fabricate the TFTs operating at the respective driving voltages by the same process steps when the TFTs are driven by different driving voltages inside the same substrate.

Example of Design Value

|  | TFT supply voltage | channel length µm | Lov µm | Loff µm |
|---|---|---|---|---|
| TFT of driver buffer circuit area | (16 ± 2) V | 5.0 ± 1.5 | 2.5 ± 0.3 | 2.5 ± 0.5 |
|  | (20 ± 3) V | 5.0 ± 2.0 | 3.0 ± 0.5 | 3.0 ± 0.5 |
| TFT of shift register circuit area | (5 ± 1) V | 3.0 ± 1.0 | 0.5 ± 0.3 | 0.5 ± 0.3 |
|  | (10 ± 1) V | 3.5 ± 1.0 | 2.0 ± 0.3 | 1.0 ± 0.5 |
| TFT of analog switching area | (16 ± 2) V | 3.0 ± 1.0 | 1.5 ± 0.5 | 1.5 ± 0.5 |
| TFT of pixel circuit area | (16 ± 2) V | 3.0 ± 1.0 | 1.5 ± 0.5 | 1.5 ± 0.5 |

What is claimed is:

1. A semiconductor device comprising:
a first n-channel thin film transistors and a second thin film transistor in one pixel,
wherein a gate electrode of said first and second thin film transistors consist essentially of one layer formed in contact with a gate insulating film;
wherein a semiconductor layer of said n-channel thin film transistors comprises
a channel formation region,
a first impurity region of one conductivity type, and
a second impurity region of one conductivity type that is sandwiched between said channel formation region and said first impurity region and is contact with said channel formation region,
wherein a part of said second impurity region of said one conductivity type overlaps with said gate electrode; and
wherein a semiconductor layer of said second thin films transistor comprises
a channel formation region,
a first impurity region of one conductivity type and
a second impurity region of said one conductivity type that is sandwiched between said channel formation region and said first impurity region and is in contact with said channel formation region,
wherein only one side of said second impurity region of said one conductivity type overlaps with said gate electrode.

2. A semiconductor device according to claim 1, wherein said first thin film transistor has a multi-gate structure.

3. A semiconductor device according to claim 1, wherein a device having a light emitting layer is connected to said second n-channel thin film transistor.

4. A semiconductor device according to claim 1, wherein said gate electrode is made of one, or a plurality, of elements selected from the group consisting of titanium (Ti), tantalum (Ta), tungsten (W) and molybdenum (Mo), or compounds consisting of said element or elements as the principal component.

5. A semiconductor device according to claim 1, wherein said semiconductor device is one selected from the group consisting of an a liquid crystal display, an EL display device, an image sensor, a video camera, a digital camera, a projector, a projection television, a goggle type display, a car navigation set, a personal computer, a portable information processing terminal, an electronic book, a mobile computer, a cellular phone, a head-mount display, and a player.

6. A semiconductor device comprising:
an n-channel thin film transistor and a p-channel thin film transistor in one pixel,
wherein a gate electrode of said n- and p-channel thin film transistors consist essentially of one layer formed in contact with a gate insulating film;
wherein a semiconductor layer of said n-channel thin film transistor comprises
a channel formation region,
a first impurity region of one conductivity type and
a second impurity region of said one conductivity type that is sandwiched between said channel formation region and said first impurity region of said conductivity type, and is in contact with said channel formation region;
wherein a part of said second impurity region of said one conductivity type overlaps with said gate electrode;
wherein a semiconductor layer of said p-channel thin film transistor comprises
a channel formation region,
a third impurity region of a conductivity type opposite to said one conductivity type,
wherein said third impurity region is disposed outside said gate electrode.

7. A semiconductor layer according to claim 6, wherein said n-channel thin film transistor has a multi-gate structure.

8. A semiconductor device according to claim 6, wherein a device having a light emitting layer is connected to said p-channel thin film transistor.

9. A semiconductor device according to claim 6, wherein said gate electrode is made of one, or a plurality, of elements selected from the group consisting of titanium (Ti), tantalum (Ta), tungsten (W) and molybdenum (Mo), or compounds consisting of said element or elements as the principal component.

10. A semiconductor device according to claim 7, wherein said semiconductor device is one selected from the group consisting of an a liquid crystal display, an EL display device, an image sensor, a video camera, a digital camera, a projector, a projection television, a goggle type display, a car navigation set, a personal computer, a portable information processing terminal, an electronic book, a mobile computer, a cellular phone, a head-mount display, and a player.

11. A semiconductor device comprising:
an n-channel thin film transistor and a p-channel thin film transistor in one pixel,
wherein a gate electrode of said n- and p-channel thin film transistors and a gate wiring connected to said gate electrode consist essentially of one layer formed in contact with a gate insulating film;
wherein a semiconductor layer of said n-channel thin film transistor comprises
a channel formation region,
a first impurity region of one conductivity type and
a second impurity region of said one conductivity type that is sandwiched between said channel formation region and said first impurity region of said one conductivity type, and is in contact with said channel formation region, wherein a part of said second impurity region of said one conductivity type overlaps with said gate electrode;

wherein a semiconductor layer of said p-channel thin film transistor comprises a channel formation region and a third impurity region of a conductivity type opposite to said one conductivity type, wherein said third impurity region is disposed outside said gate electrode.

12. A semiconductor layer according to claim 11, wherein said n-channel thin film transistor has a multi-gate structure.

13. A semiconductor device according to claim 11, wherein a device having a light emitting layer is connected to said p-channel thin film transistor.

14. A semiconductor device according to claim 11, wherein said one layer is made of one, or a plurality, of elements selected from the group consisting of titanium (Ti), tantalum (Ta), tungsten (W) and molybdenum (Mo), or compounds consisting of said element or elements as the principal component.

15. A semiconductor device according to claim 11, wherein said semiconductor device is one selected from the group consisting of an a liquid crystal display, an EL display device, an image sensor, a video camera, a digital camera, a projector, a projection television, a goggle type display, a car navigation set, a personal computer, a portable information processing terminal, an electronic book, a mobile computer, a cellular phone, a head-mount display, and a player.

16. A semiconductor device comprising:

a first thin film transistor and a second film transistor in one pixel, wherein a gate electrode of said first and second thin film transistors consist essentially of one layer formed in contact with a gate insulating film;

wherein a semiconductor layer of said first thin film transistor comprises a channel formation region, a first impurity region of one conductivity type and a second impurity region of said one conductivity type that is sandwiched between said channel formation region and said first impurity region of said one conductivity type, and is in contact with said channel formation region;

wherein a part of said second impurity region of said one conductivity type overlaps with said gate electrode;

wherein a semiconductor layer of said second thin film transistor comprises a channel formation region, a third impurity region of a conductivity type opposite to said one conductivity type, wherein said third impurity region is disposed outside said gate electrode.

17. A semicondcutor layer according to claim 16, wherein said first and second thin film transistors have a multi-gate structure.

18. A semiconductor device according to claim 16, wherein a device having a light emitting layer is connected to said second thin film transistor.

19. A semiconductor device according to claim 16, wherein said gate electrode is made of one, or a plurality, of elements selected from the group consisting of titanium (Ti), tantalum (Ta), tungsten (W) and molybdenum (Mo), or compounds consisting of said element or elements as the principal component.

20. A semiconductor device according to claim 16, wherein said semiconductor device is one selected from the group consisting of an a liquid crystal display, an EL display device, an image sensor, a video camera, a digital camera, a projector, a projection television, a goggle type display, a car navigation set, a personal computer, a portable information processing terminal, an electronic book, a mobile computer, a cellular phone, a head-mount display, and a player.

* * * * *